(12) United States Patent
Jeong

(10) Patent No.: US 12,259,748 B2
(45) Date of Patent: Mar. 25, 2025

(54) DISPLAY DEVICE

(71) Applicant: LG ELECTRONICS INC., Seoul (KR)

(72) Inventor: Kyungmin Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/801,718

(22) PCT Filed: Feb. 27, 2020

(86) PCT No.: PCT/KR2020/002846
§ 371 (c)(1),
(2) Date: Aug. 23, 2022

(87) PCT Pub. No.: WO2021/172625
PCT Pub. Date: Sep. 2, 2021

(65) Prior Publication Data
US 2023/0161375 A1    May 25, 2023

(51) Int. Cl.
*G06F 1/16* (2006.01)
*H04R 9/06* (2006.01)
*H10K 77/10* (2023.01)

(52) U.S. Cl.
CPC .......... *G06F 1/1601* (2013.01); *G06F 1/1605* (2013.01); *G06F 1/1652* (2013.01);
(Continued)

(58) Field of Classification Search
CPC ....... G06F 1/1601; H04R 9/06; H10K 77/111; H10K 2102/311
See application file for complete search history.

(56) References Cited

U.S. PATENT DOCUMENTS 6,338,182 B1 * 1/2002 Tseng .................. G06F 1/16
    439/31
6,744,903 B1 * 6/2004 Jeon .................... H04N 5/642
    381/388
(Continued)

FOREIGN PATENT DOCUMENTS

JP    2014-154922    8/2014
KR    10-0177938    5/1999
(Continued)

OTHER PUBLICATIONS

PCT International Application No. PCT/KR2020/002846, International Search Report dated Nov. 13, 2020, 4 pages.

*Primary Examiner* — Anthony M Haughton
*Assistant Examiner* — Theron S Milliser
(74) *Attorney, Agent, or Firm* — LEE, HONG, DEGERMAN, KANG & WAIMEY

(57) ABSTRACT

A display device is disclosed. The display device of the present disclosure may comprise: a flexible display panel; a roller which is elongated and on which the display panel is wound or unwound; a housing in which an accommodating space is provided, wherein the roller is rotatably mounted in the accommodating space; and a speaker assembly which is positioned between the roller and the housing and which is placed on the bottom of the housing, wherein the housing may comprise a front cover which is positioned at the inner side of the front of the housing, is fixed to the bottom of the housing, and has a coupling hole formed therein, and wherein the speaker assembly may comprise a coupling part which is formed at the upper side of the speaker assembly and is inserted into the coupling hole.

11 Claims, 71 Drawing Sheets

(52) U.S. Cl.
CPC ........... *H04R 9/06* (2013.01); *H04R 2400/13* (2013.01); *H10K 77/111* (2023.02)

(56) References Cited

U.S. PATENT DOCUMENTS

| | | | |
|---|---|---|---|
| 9,609,438 B2 * | 3/2017 | Kim | H04R 9/025 |
| 11,500,426 B2 * | 11/2022 | Godfrey | G06F 1/203 |
| 11,934,221 B2 * | 3/2024 | Okuley | H04R 1/345 |
| 2011/0310537 A1 * | 12/2011 | Imamura | G06F 1/1601 |
| | | | 361/679.01 |
| 2012/0219173 A1 * | 8/2012 | Yukawa | H04R 1/025 |
| | | | 381/388 |
| 2013/0100596 A1 * | 4/2013 | Yokote | H05K 5/0217 |
| | | | 361/679.01 |
| 2016/0088398 A1 * | 3/2016 | Kim | H04R 7/18 |
| | | | 381/423 |
| 2017/0161868 A1 * | 6/2017 | Kim | G06F 1/1601 |
| 2018/0070466 A1 * | 3/2018 | Kim | B65H 16/06 |
| 2020/0326747 A1 * | 10/2020 | Okuley | G06F 1/1605 |
| 2022/0308621 A1 * | 9/2022 | Godfrey | G06F 1/20 |

FOREIGN PATENT DOCUMENTS

| | | | | |
|---|---|---|---|---|
| KR | 0177938 B1 | * | 5/1999 | |
| KR | 20010035730 | * | 5/2001 | |
| KR | 10-2006-0016944 | | 2/2006 | |
| KR | 20060016944 A | * | 2/2006 | |
| KR | 10-2019-0022157 | | 3/2019 | |
| KR | 10-2019-0051541 | | 5/2019 | |
| WO | WO-2015093445 A1 | * | 6/2015 | ............... H04N 5/64 |

* cited by examiner

DISPLAY DEVICE

CROSS-REFERENCE TO RELATED APPLICATIONS

This application is the National Stage filing under 35 U.S.C. 371 of International Application No. PCT/KR2020/002846, filed on Feb. 27, 2020, the contents of which are hereby incorporated by reference herein its entirety.

TECHNICAL FIELD

The present disclosure relates to a display device.

BACKGROUND ART

As the information society develops, the demand for display devices is also increasing in various forms. In response to this, various display devices such as Liquid Crystal Display Device (LCD), Plasma Display Panel (PDP), Electroluminescent Display (ELD), and Vacuum Fluorescent Display (VFD) have been researched and used in recent years.

Among them, a display device using an organic light emitting diode (OLED) has superior luminance characteristics and viewing angle characteristics compared to a liquid crystal display device, and can be implemented in an ultra-thin shape as it does not require a backlight unit.

In addition, a flexible display panel can be bent or wound on a roller. By using the flexible display panel, it is possible to implement a display device that is roll out from a roller or wound on a roller. A lot of research has been done on a structure for winding or unwinding a flexible display panel on/from a roller.

DISCLOSURE

Technical Problem

An object of the present disclosure is to solve the above and other problems.

Another object of the present disclosure may be to improve the sound quality of a speaker provided in a display device.

Another object of the present disclosure may be to prevent noise generated by a display device.

Technical Solution

According to an aspect of the present disclosure for achieving the above object, provided is a display device including: a flexible display panel; a roller which extends long, and around which the display panel is wound, or from which the display panel is unwound; a housing which provides an accommodating space therein, wherein the roller is rotatably mounted in the accommodating space; and a speaker assembly which is located between the roller and the housing, and placed on a bottom of the housing, wherein the housing includes a front cover which is located inside a front surface of the housing, is fixed to the bottom of the housing, and has a coupling hole, wherein the speaker assembly includes a coupling portion which is formed in an upper side of the speaker assembly, and inserted into the coupling hole.

Advantageous Effects

The effect of the display device according to the present disclosure will be described as follows.

According to at least one of the embodiments of the present disclosure, sound quality of a speaker assembly provided in a display device may be improved.

According to at least one of the embodiments of the present disclosure, noise that may be generated in a display device may be prevented.

Further scope of applicability of the present disclosure will become apparent from the following detailed description. However, it should be understood that the detailed description and specific embodiments such as preferred embodiments of the present disclosure are given by way of example only, since various changes and modifications within the spirit and scope of the present disclosure may be clearly understood by those skilled in the art.

MODE FOR INVENTION

Figure 1:
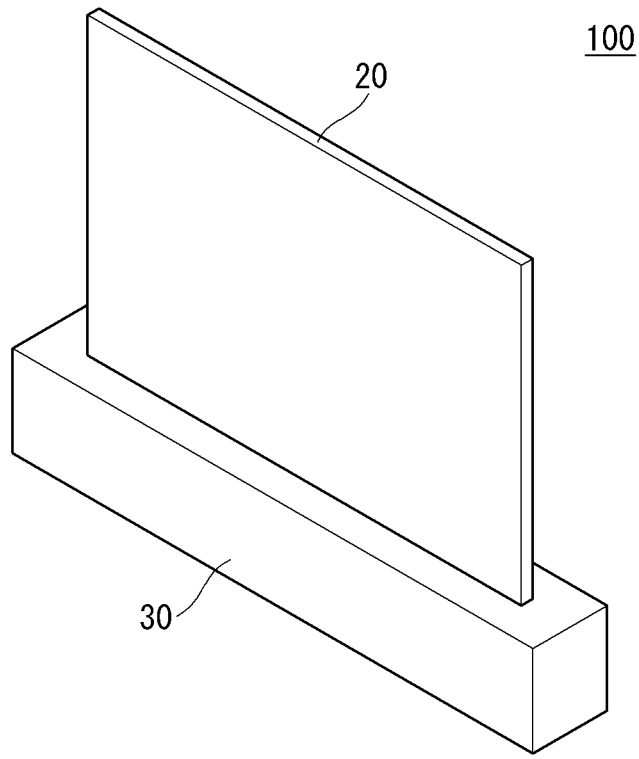
FIGS. 1 to 71 are diagrams illustrating examples of a display device according to embodiments of the present disclosure.
Figure 1:
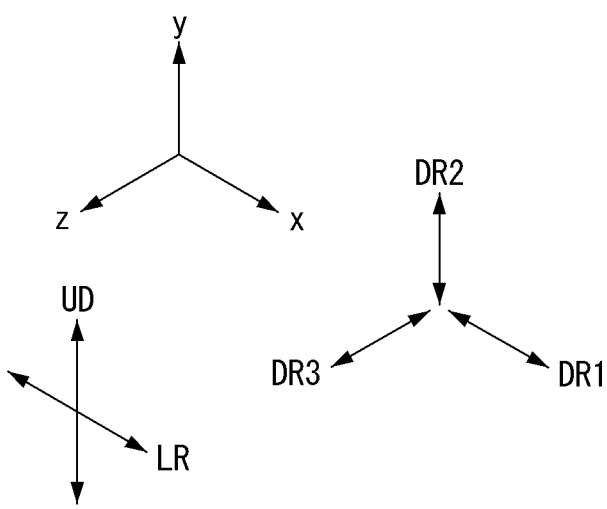

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Referring to FIG. 1, a display device 100 may include a display unit 20 and a housing 30. The housing 30 may have an internal space. At least a portion of the display unit 20 may be located inside the housing 30. At least a portion of the display unit 20 may be located outside the housing 30. The display unit 20 may display a screen.

A direction parallel to the length direction of the housing 30 may be referred to as a first direction DR1, a +x-axis direction, a −x-axis direction, a left direction, or a right direction. A direction in which the display unit 20 displays a screen may be referred to as a +z axis, a front side direction, or a forward direction. A direction opposite to the direction in which the display unit 20 displays a screen may be referred to as a −z axis, a rear side direction, or a rearward direction. A third direction DR3 may be parallel to the +z-axis direction or the −z-axis direction. A direction parallel to a height direction of the display device 100 may be referred to as a second direction DR2, a +y-axis direction, a −y-axis direction, an upper direction, or a lower direction.

The third direction DR3 may be a direction perpendicular to the first direction DR1 and/or the second direction DR2. The first direction DR1 and the second direction DR2 may be collectively referred to as a horizontal direction. In addition, the third direction DR3 may be referred to as a vertical direction. The left-right direction LR may be parallel to the first direction DR1, and the up-down direction UD may be parallel to the second direction DR2.

Figure 2:
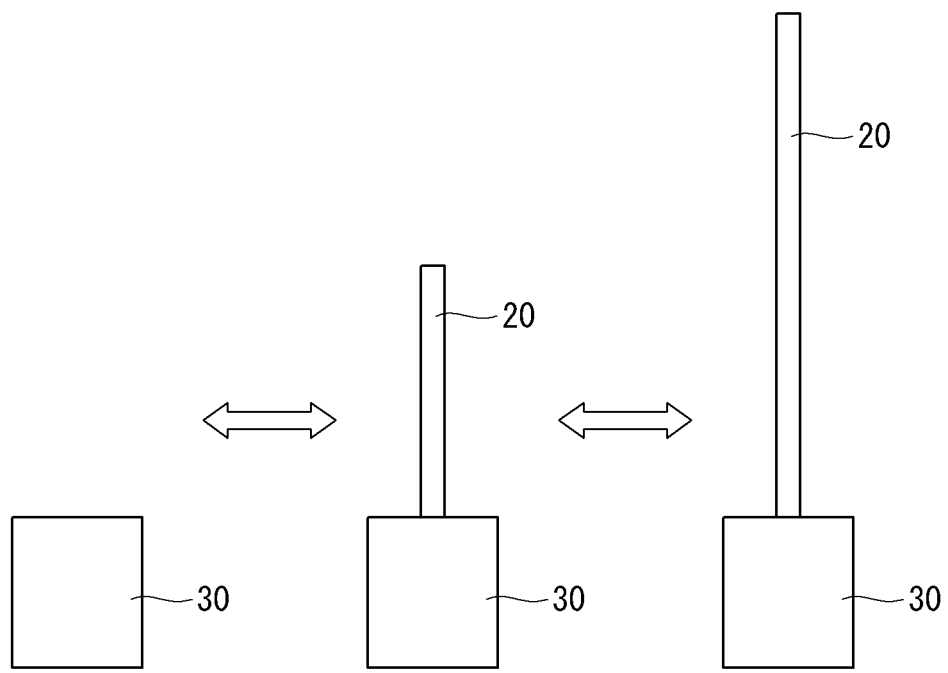

Referring to FIG. 2, the entire display unit 20 may be located inside the housing 30. At least a portion of the display unit 20 may be located outside the housing 30. The extent to which the display unit 20 is exposed to the outside of the housing 30 may be adjusted as necessary.

Figure 3:
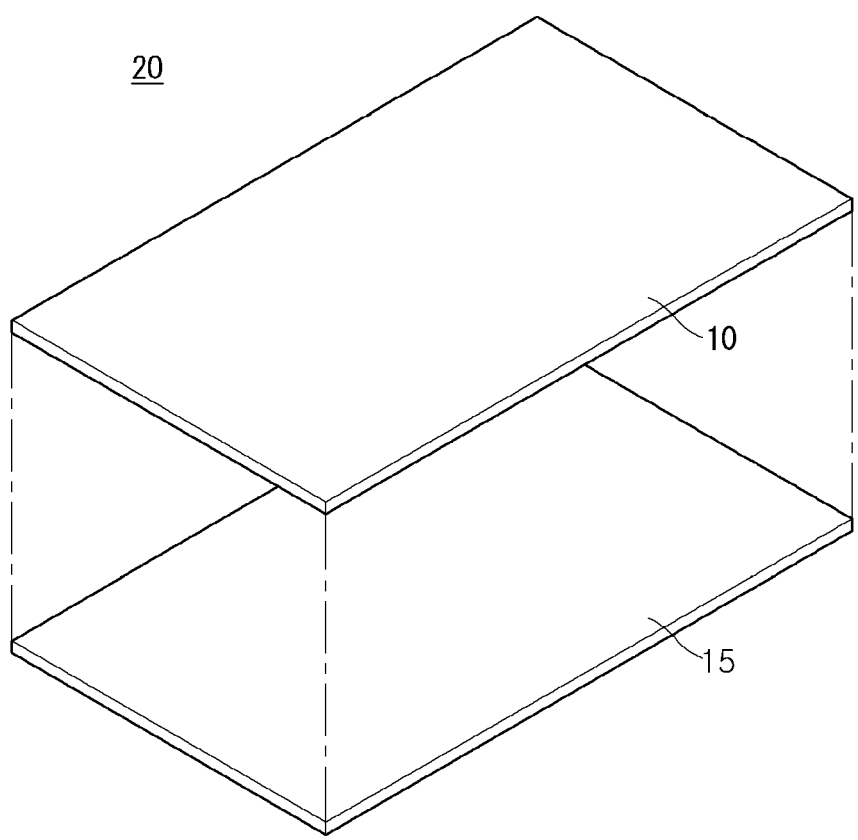

Referring to FIG. 3, the display unit 20 may include a display panel 10 and a plate 15. The display panel 10 may be flexible. For example, the display panel 10 may be an organic light emitting display (OLED).

The display panel 10 may have a front surface for displaying an image. The display panel 10 may have a rear surface opposite to the front surface. The front surface of the display panel 10 may be covered with a light-transmitting material. For example, the light-transmitting material may be a synthetic resin or a film.

The plate 15 may be coupled, fastened, or attached to the rear surface of the display panel 10. The plate 15 may include a metal material. The plate 15 may be referred to as a module cover 15, a cover 15, a display panel cover 15, a panel cover 15, or an apron 15.

Figure 4:
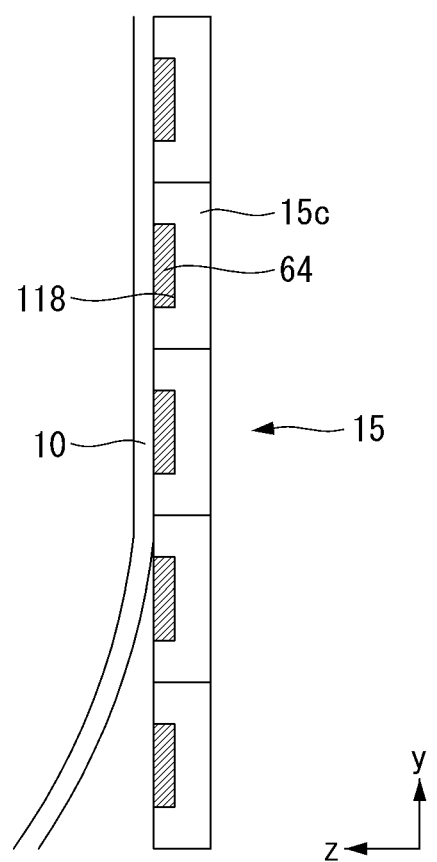

Referring to FIG. 4, the plate 15 may include a plurality of segments 15c. A magnet 64 may be located inside a recess 118 of the segment 15c. The recess 118 may be located on a surface of the segment 15c facing the display panel 10. The recess 118 may be located in the front surface of each segment 15c. Since the magnet 64 is received inside the recess 118, the magnet 64 may not protrude out of the segment 15c. The display panel 10 may be flat without being crumpled even when it comes into contact with the segment 15c.

Figure 5:
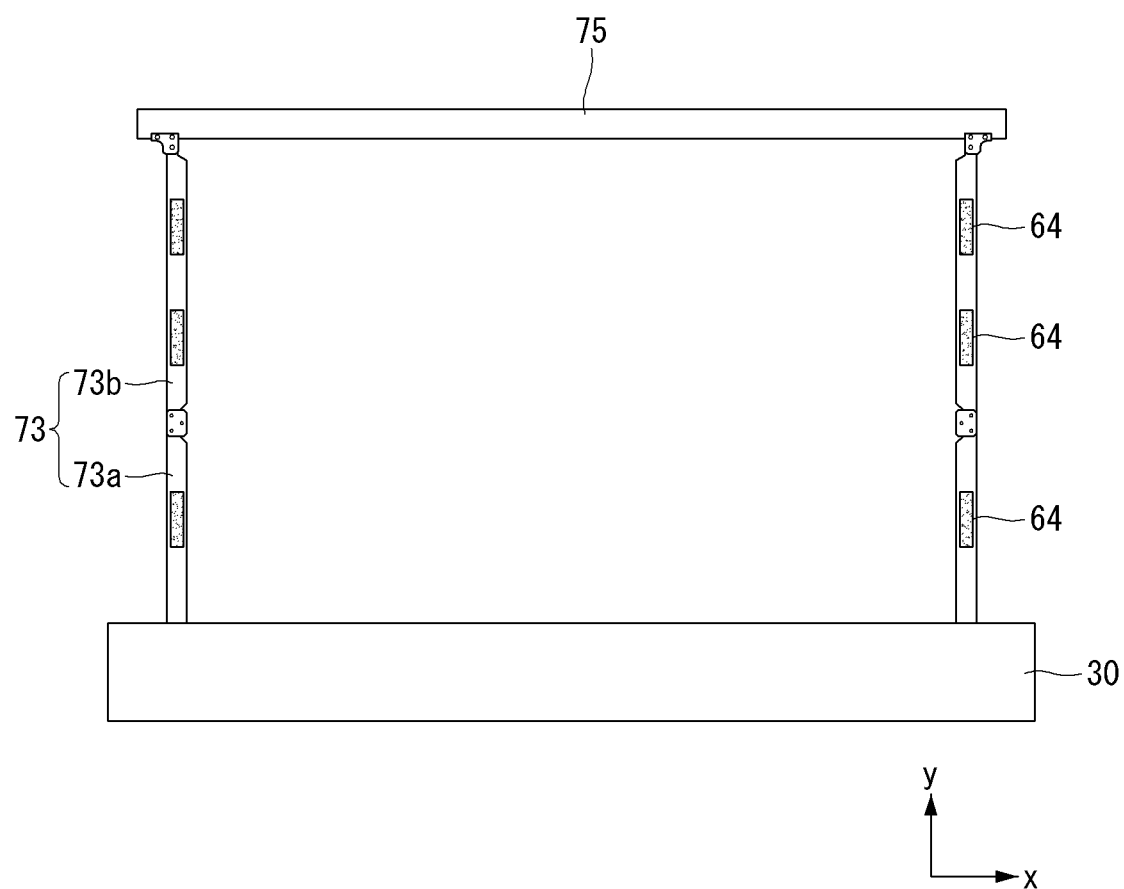

Referring to FIG. 5, a plurality of magnets 64 may be located on a link 73. For example, at least one magnet 64 may be located on a first arm 73a and at least one magnet 64 may be located on a second arm 73b. The plurality of magnets 64 may be spaced apart from each other.

Figure 6:
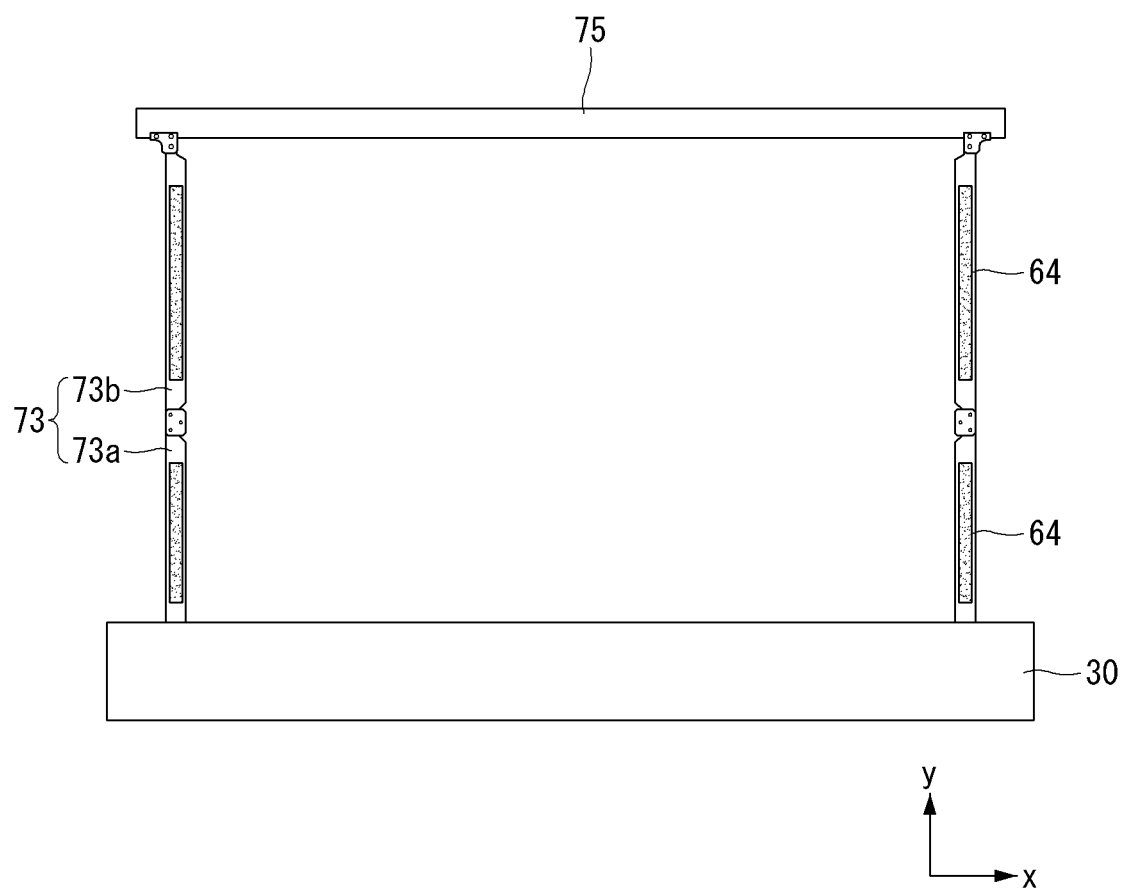

Referring to FIG. 6, one magnet 64 may be located on each of the first arm 73a and the second arm 73b. The magnet 64 may have a shape extending long in the long side direction of the first arm 73a and the second arm 73b. Since the magnet 64 has a shape extending long in the long side direction of the first arm 73a and the second arm 73b, an area of a portion where the link 73 is in close contact with the display panel and the module cover may be increased. Accordingly, the adhesion between the link 73 and the display panel and the module cover can be strong.

Figure 7:
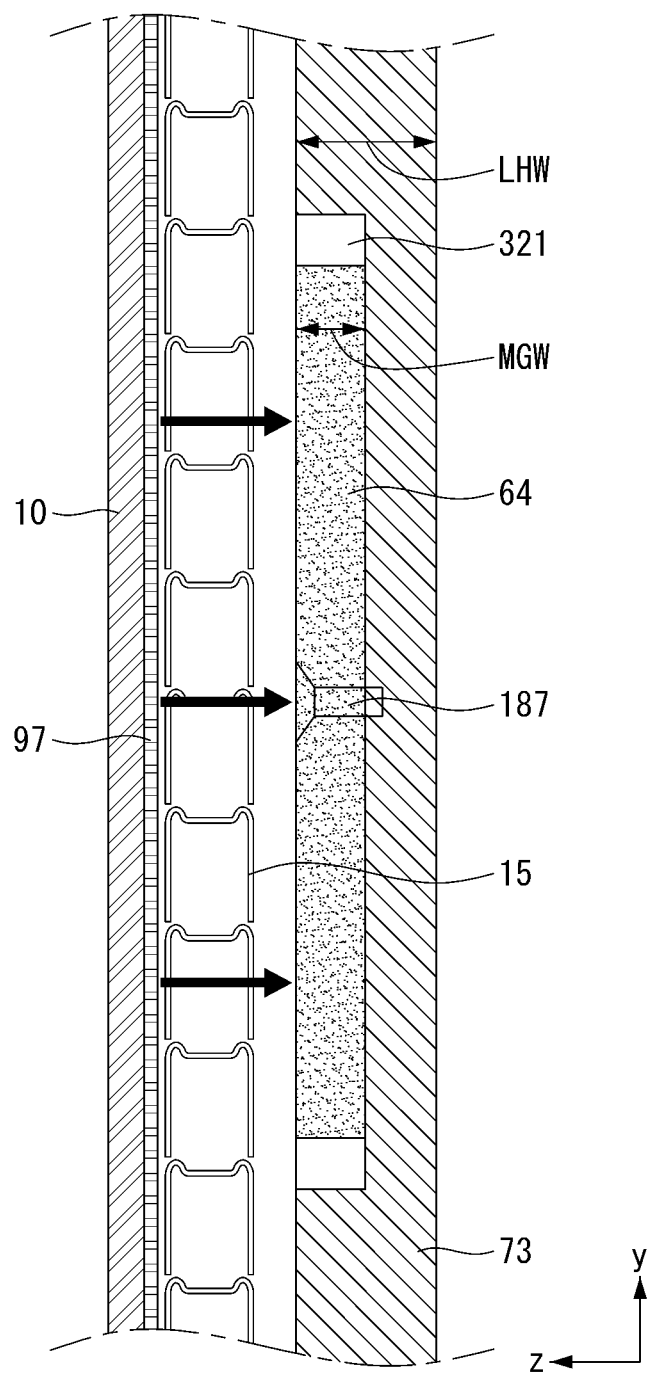

Referring to FIG. 7, the magnet 64 may be located in a recessed portion 321 formed on the link 73. The recessed portion 321 may have a shape recessed into the inside of the link 73. The magnet 64 may be coupled to the link 73 through at least one screw 187.

A width LHW at which the recessed portion 321 is recessed into the inside of the link 73 may be equal to or larger than a thickness MGW of the magnet 64. If the thickness MGW of the magnet 64 is larger than the width LHW of the recessed portion 321, the display panel 10 and the module cover 15 may not be in close contact with the link 73. In this case, the display panel 10 may be crumpled or not be flat.

A panel protection portion 97 may be located on the rear surface of the display panel 10. The panel protection portion 97 may prevent the display panel 10 from being damaged due to friction with the module cover 15. The panel protection portion 97 may include a metal material. The panel protection portion 97 may have a very thin thickness. For example, the panel protection portion 97 may have a thickness of about 0.1 mm.

Since the panel protection portion 97 includes a metal material, mutual attraction with the magnet 64 may act. Accordingly, the module cover 15 located between the panel protection portion 97 and the link 73 may be in close contact with the magnet 64 even if it does not include a metal material.

Figure 8:
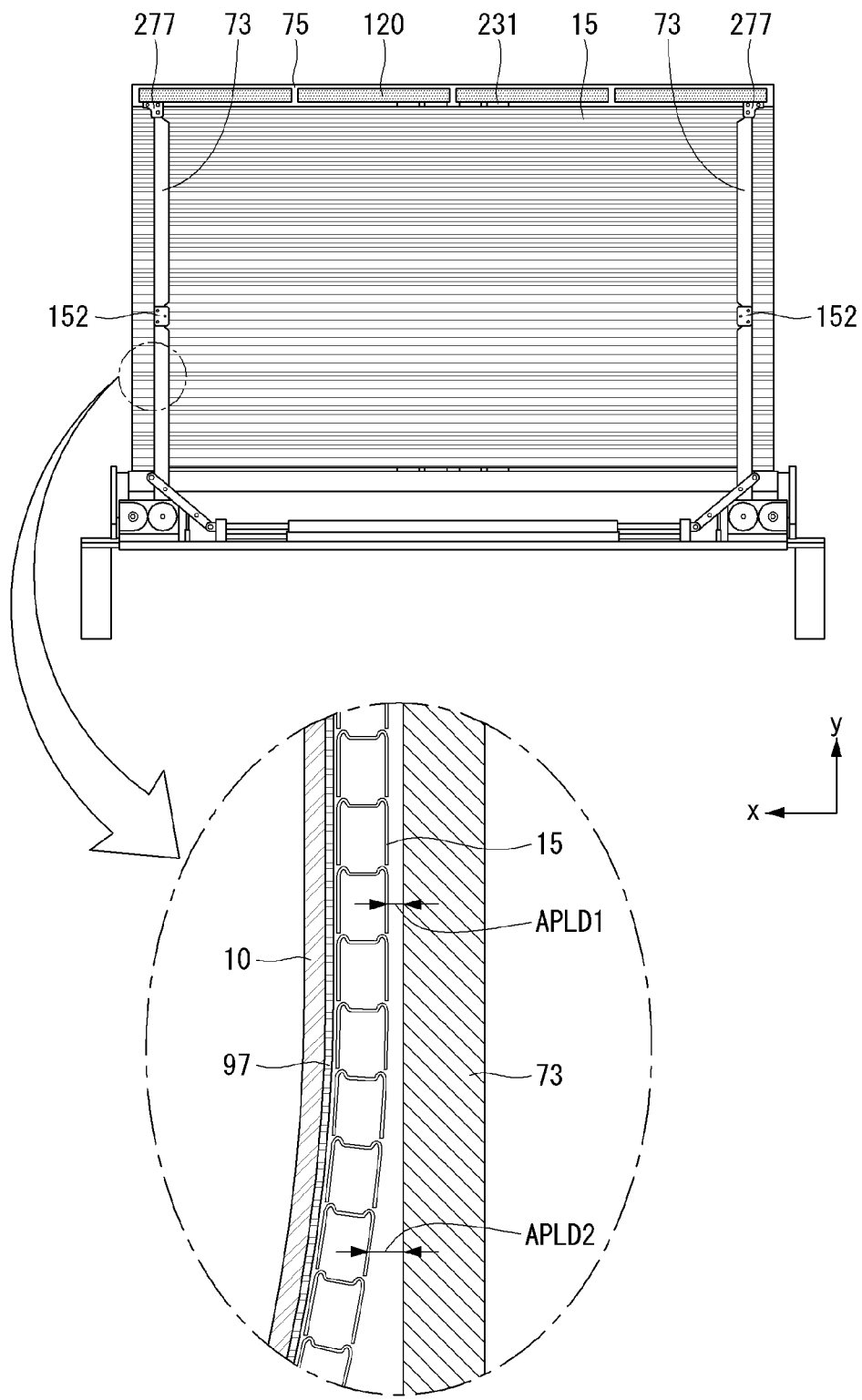
Figure 15:
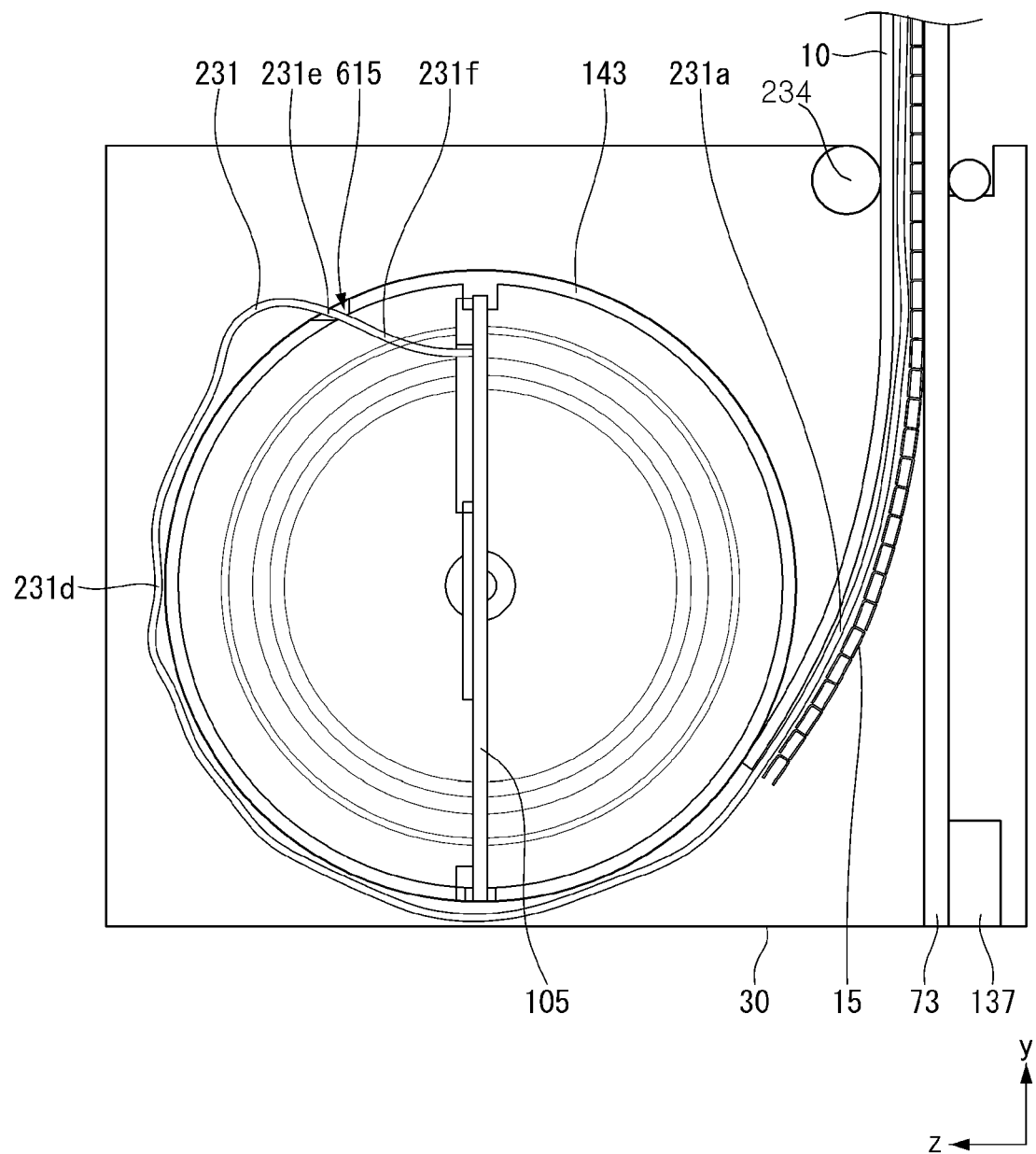

Referring to FIG. 8, the module cover 15 may be in close contact with the link 73 by an upper bar 75 in the upper side and a guide bar 234 in the lower side (refer to FIG. 15). A portion of the link 73 between the upper bar 75 and the guide bar 234 may not be in close contact with the module cover 15. Alternatively, a central portion of the link 73 may not be in close contact with the module cover 15. The central portion of the link 73 may be near an arm joint 152. In this case, a distance (APRD1, APLD2) between the module cover 15 and the link 73 may not be uniform. In this case, the display panel 10 may be bent or crooked.

Figure 9:
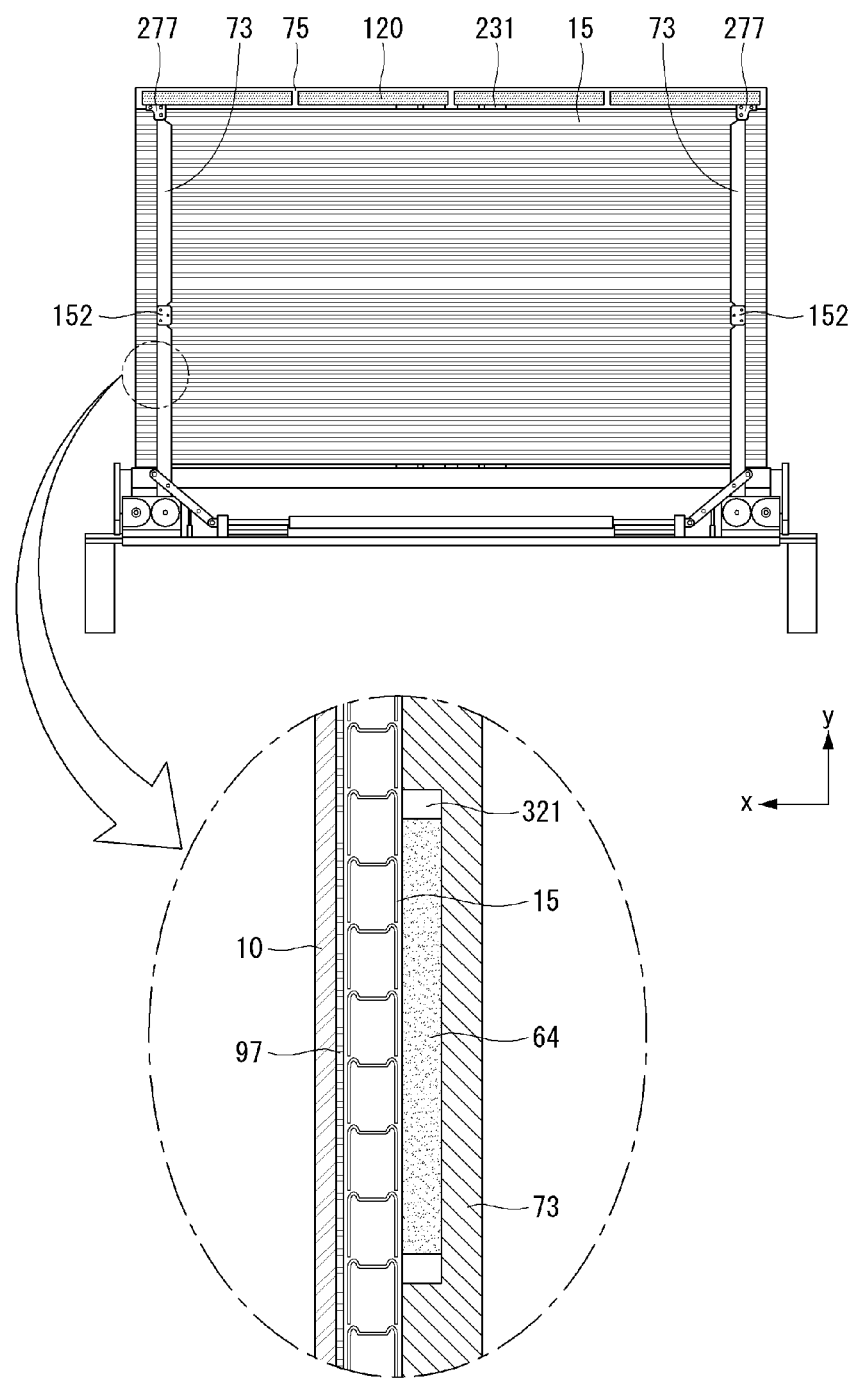

Referring to FIG. 9, when the magnet 64 is located in the recessed portion 321 of the link 73, the magnet 64 attracts the panel protection portion 97, so the module cover 15 may also be in close contact with the magnet64 at the same time. That is, the central portion of the link 73 may be in close contact with the module cover 15.

Figure 10:
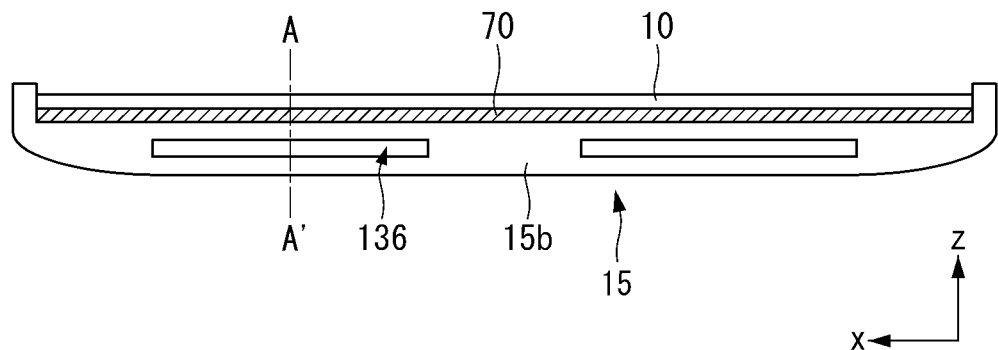
Figure 10:
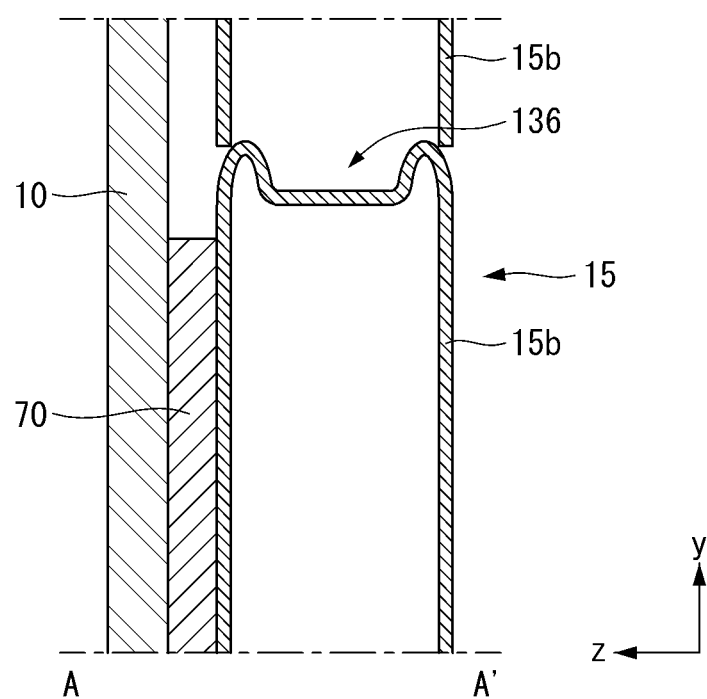

Referring to FIG. 10, a bead 136 may be formed on the upper surface of the segment 15b. The bead 136 may have a shape recessed into the inside of the segment 15b. The bead 136 may have a shape recessed in the −y-axis direction. For example, the bead 136 may be formed by pressing the segment 15b. A plurality of beads 136 may be formed on the segment 15b. The plurality of beads 136 may be spaced apart from each other. The bead 136 may improve the rigidity of the segment 15b. The bead 136 may prevent the shape of the segment 15b from being deformed from an external impact.

Figure 11:
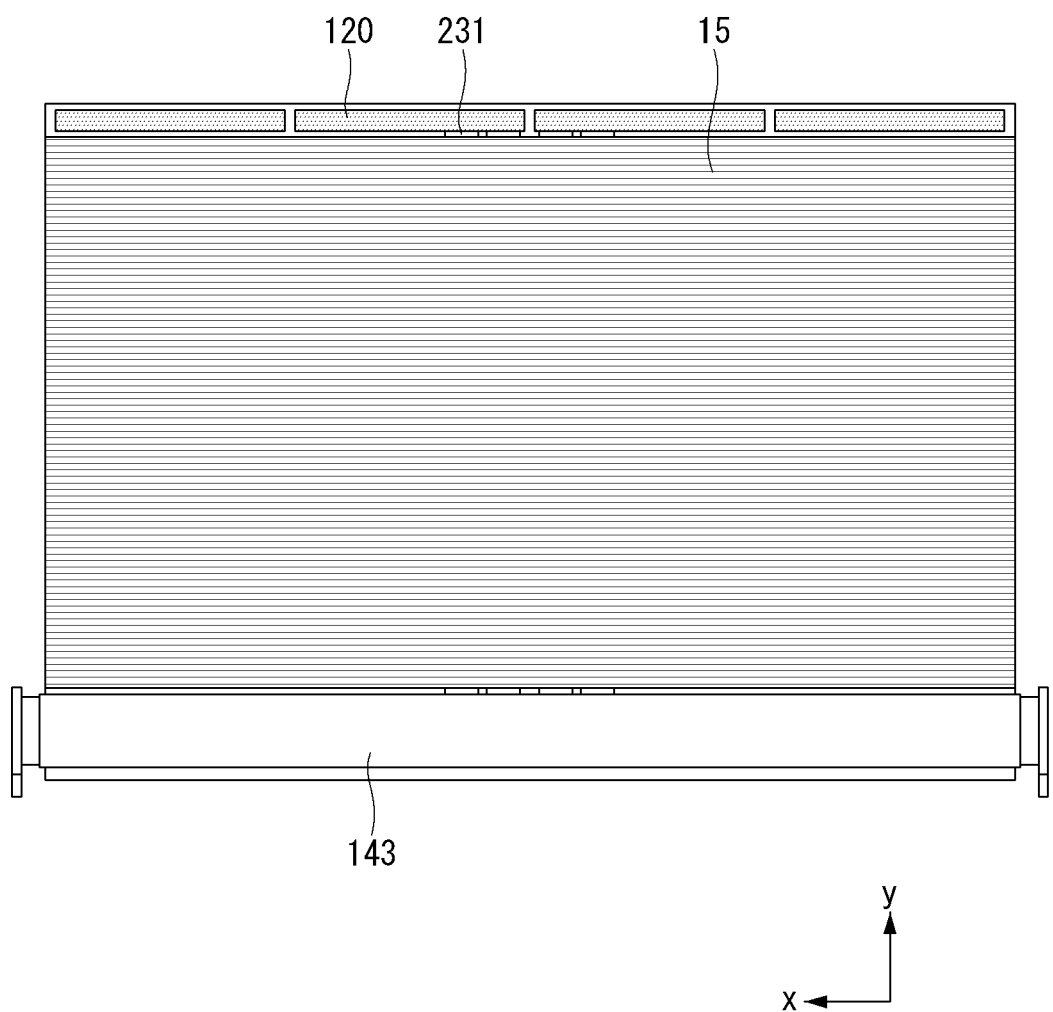

Referring to FIG. 11, a source PCB 120 may be located in the upper side of the module cover 15. When the source PCB 120 is rolled up or rolled down, the position may change with the movement of the module cover 15. A FFC cable 231 may be located in the center portion of the module cover 15 based on a first direction. The FFC cable 231 may be located in opposite ends of the module cover 15 based on the first direction.

Figure 12:
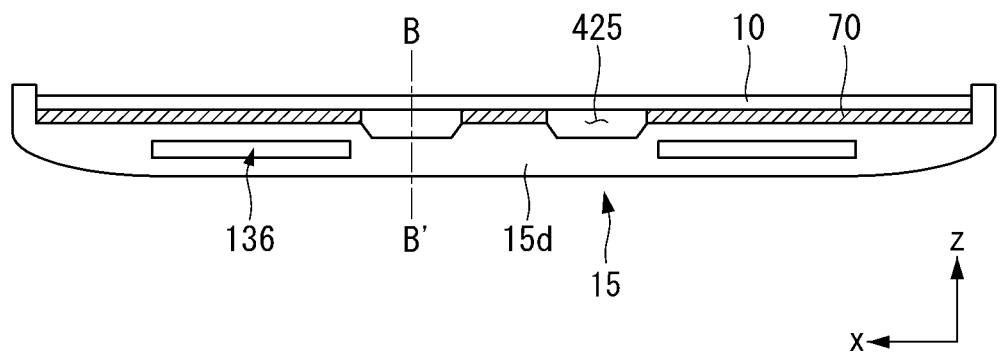
Figure 12:
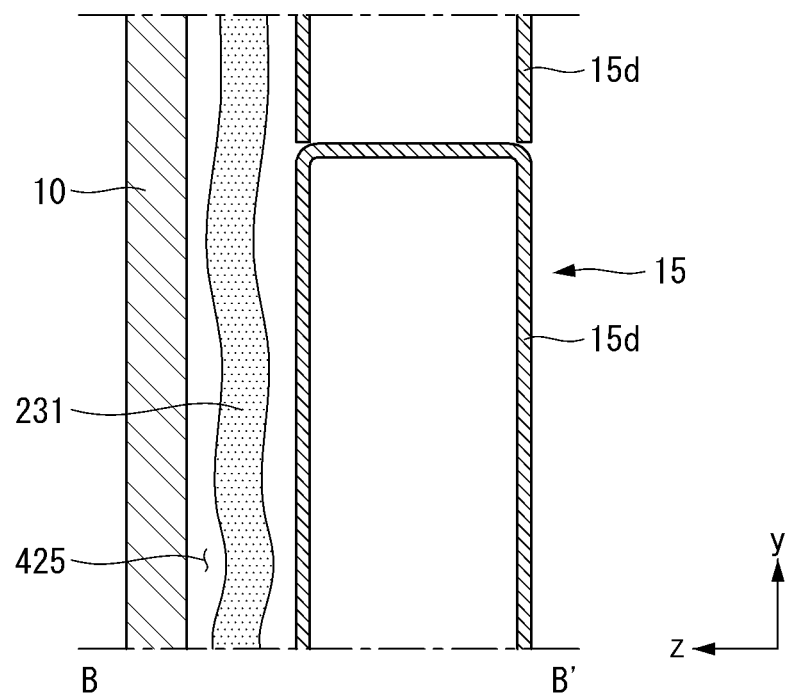

Referring to FIG. 12, the segment 15d may include a recessed portion 425 that is recessed in the −z-axis direction. The recessed portion 425 may form a space between the display panel 10 and the module cover 15. The FFC cable 231 may be received in a space formed by the recessed portion 425. In addition, the recessed portion 425 may improve the rigidity of the segment 15d.

The bead 136 may be located on the segment 15d excluding a portion where the recessed portion 425 is located. The bead 136 may not be located in the portion where the recessed portion 425 is located because the thickness of the segment 15d in a third direction becomes thinner.

Figure 13:
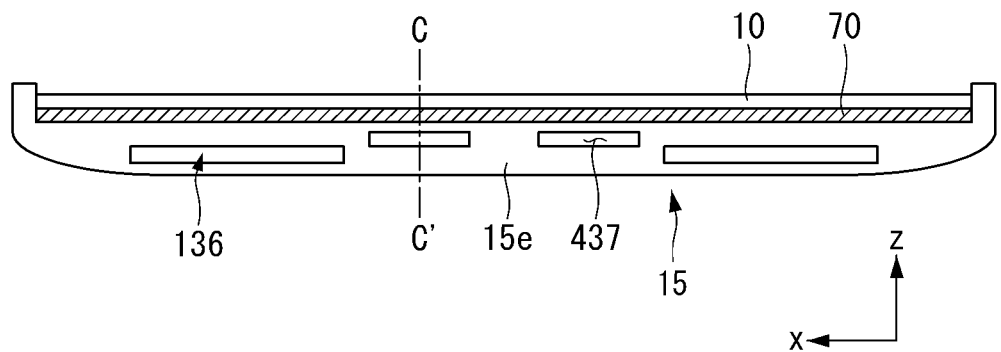
Figure 13:
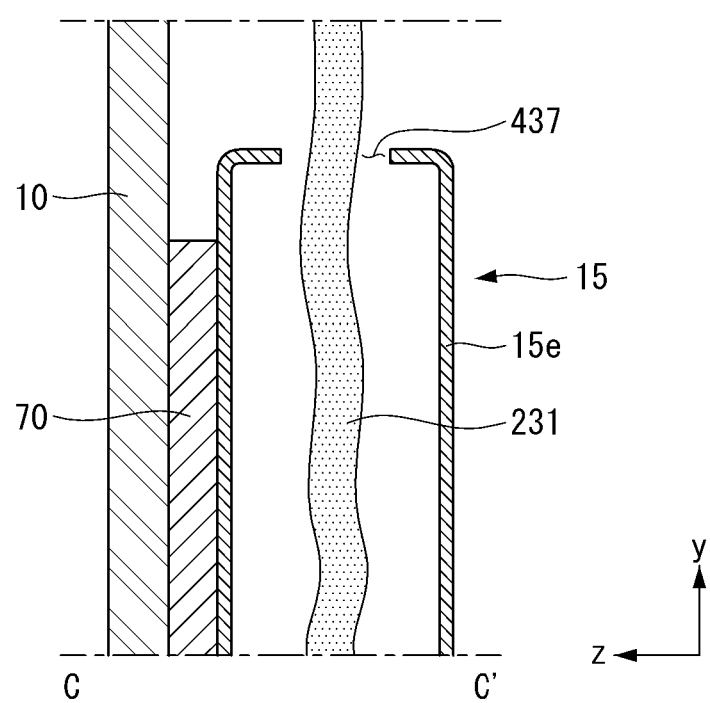

Referring to FIG. 13, a penetrating portion 437 may be located in the center portion of the segment 15e in the first direction. The penetrating portion 437 may penetrate the central portion of the segment 15e in the second direction. That is, the penetrating portion 437 may be a hole located in the segment 15e. The penetrating portion 437 may be a portion in which the FFC cable 231 is located. Since the penetrating portion 437 is formed inside the segment 15e, the thickness of the segment 15e may be reduced compared to a case where the FFC cable 231 located in the recessed portion 425.

The bead 136 may be located on the segment 15e excluding the portion where the penetrating portion 437 is located. The bead 136 may not be located in the portion where the penetrating portion 437 is located because the thickness of the segment 15e in the third direction becomes thinner.

Figure 14:
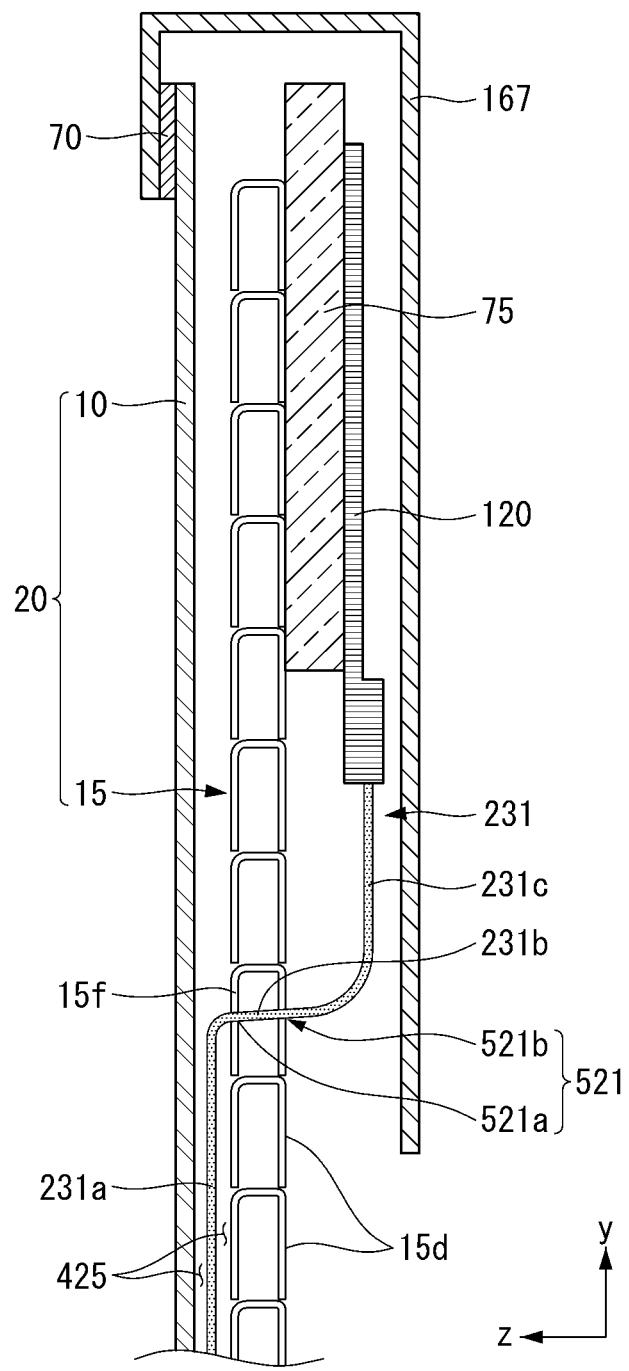

Referring to FIG. 14, a top case 167 may cover the source PCB 120 and the upper bar 75 as well as the display panel 10 and the module cover 15. One surface of the upper bar 75 may be coupled to the rear surface of the module cover 15, and the other surface may be coupled to the source PCB 120. The upper bar 75 may be fixed to the module cover 15 to support the source PCB 120.

The lower end of the FFC cable 231 may be connected to a timing controller board 105 (refer to FIG. 15) inside a panel roller 143 (refer to FIG. 15). The FFC cable 231 may be wound on or unwound from the panel roller 143 together with the display unit 20.

A portion of the FFC cable 231 may be located between the display panel 10 and the module cover 15. A portion of the FFC cable 231 located between the display panel 10 and the module cover 15 may be referred to as a first portion 231a. The first portion 231a may be located in the recessed portion 425 formed by the plurality of segments 15d. Alternatively, the first portion 231a may be received in the recessed portion 425 formed by the plurality of segments 15d.

A portion of the FFC cable 231 may penetrate the segment 15f. A portion of the FFC cable 231 penetrating the segment 15f may be referred to as a second portion 231b. The segment 15f may include a first hole 521a formed on the front surface and a second hole 521b formed on the rear surface. The first hole 521a and the second hole 521b may be interconnected to form one hole 521. The hole 521 may penetrate the segment 15f in the third direction. The second portion 231b may penetrate the hole 521. The hole 521 may be referred to as a connection hole 521.

An upper end of the FFC cable 231 may be electrically connected to the source PCB 120. A portion of the FFC cable 231 may be located on the rear surface of the module cover 15. A portion of the FFC cable 231 located on the rear surface of the module cover 15 may be referred to as a third portion 231c. The third portion 231c may be electrically connected to the source PCB 120.

The third portion 231c may be covered by the top case 167. Accordingly, the third portion 231c may not be exposed to the outside.

Referring to FIG. 15, the FFC cable 231 may be connected to the timing controller board 105 mounted in the panel roller 143. A through hole 615 may be formed on the panel roller 143, and the FFC cable 231 may be connected to the timing controller board 105 through the through hole 615.

The through hole 615 may be located in one side of the panel roller 143 and may penetrate the outer circumferential portion of the panel roller 143. The FFC cable 231 may be connected to one side of the timing controller board 105 through the through hole 615.

Even when the FFC cable 231 is located on the outer circumference of the panel roller 143, the connection to the timing controller board 105 may be maintained due to the through hole 615. Accordingly, the FFC cable 231 may not be twisted by rotating together with the panel roller 143.

A portion of the FFC cable 231 may be wound around the panel roller 143. A portion of the FFC cable 231 wound around the panel roller 143 may be referred to as a fourth portion 231d. The fourth portion 231d may be in contact with the outer circumferential surface of the panel roller 143.

A portion of the FFC cable 231 may penetrate the through hole 615. A portion of the FFC cable 231 passing through the through hole 615 may be referred to as a fifth portion 231e.

A lower end of the FFC cable 231 may be electrically connected to the timing controller board 105. A portion of the FFC cable 231 may be located inside the panel roller 143. A portion of the FFC cable 231 located inside the panel roller 143 may be referred to as a sixth portion 231E The sixth portion 231f may be electrically connected to the timing controller board 105.

Figure 16:
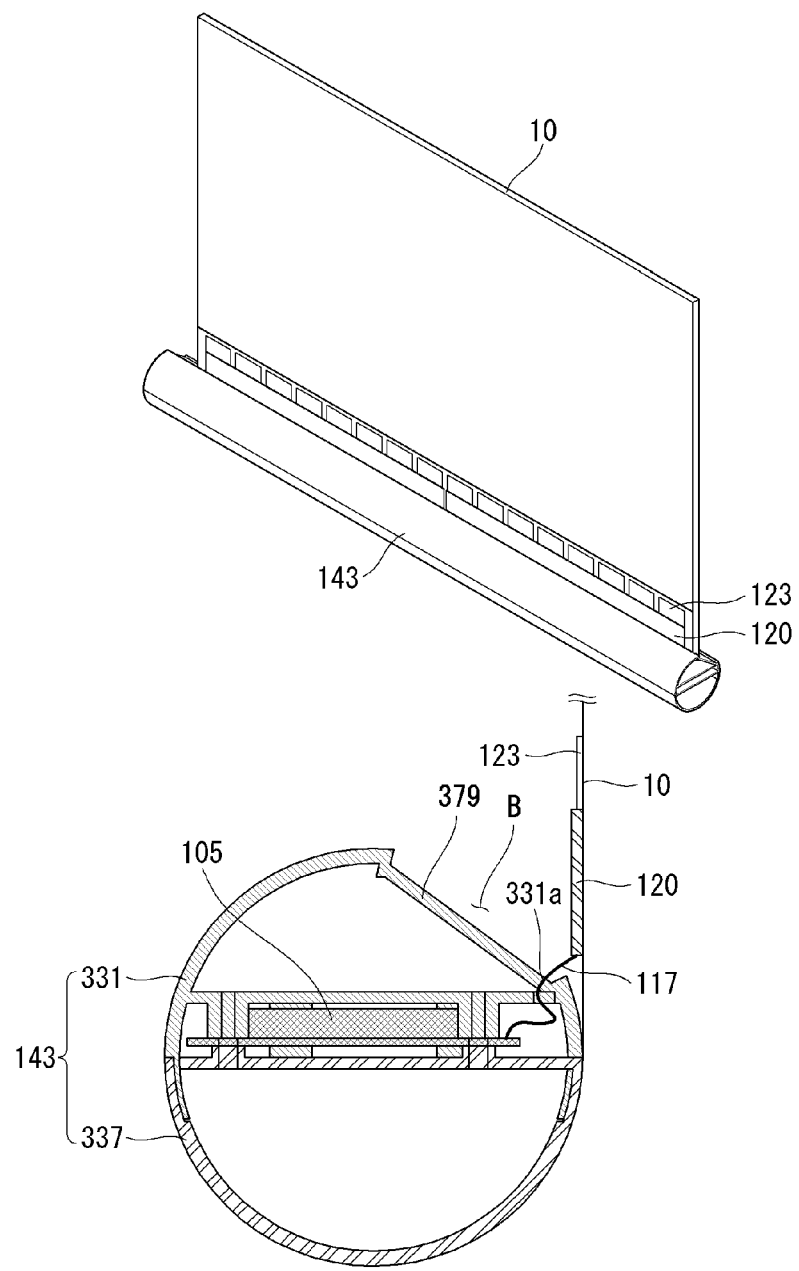

Referring to FIG. 16, the lower end of the display panel 10 may be connected to the roller 143. The display panel 10 may be wound on or unwound from the roller 143. The front surface of the display panel 10 may be coupled to a plurality of source PCBs 120. The plurality of source PCBs 120 may be spaced apart from each other.

The source chip on film (COF) 123 may connect the display panel 10 and the source PCB 120. The source COF 123 may be located in the front surface of the display panel 10. The roller 143 may include a first part 331 and a second part 337. The first part 331 and the second part 337 may be fastened by a screw. The timing controller board 105 may be mounted inside the roller 143.

The source PCB 120 may be electrically connected to the timing controller board 105. The timing controller board 105 may transmit digital video data and a timing control signal to the source PCB 120.

The cable 117 may electrically connect the source PCB 120 and the timing controller board 105. For example, the cable 117 may be a flexible flat cable (FFC). The cable 117 may penetrate the hole 331a. The hole 331a may be formed in a seating portion 379 or the first part 331. The cable 117 may be located between the display panel 10 and the second part 337.

The seating portion 379 may be formed in the outer circumference of the first part 331. The seating portion 379 may be formed by stepping a portion of the outer circumference of the first part 331. The seating portion 379 may form a space (B). When the display unit 20 is wound around the roller 143, the source PCB 120 may be received in the seating portion 379. The source PCB 120 may be received in the seating portion 379, so that it is not bent or crooked, and durability may be improved.

The cable 117 may electrically connect the timing controller board 105 and the source PCB 120.

Figure 17:
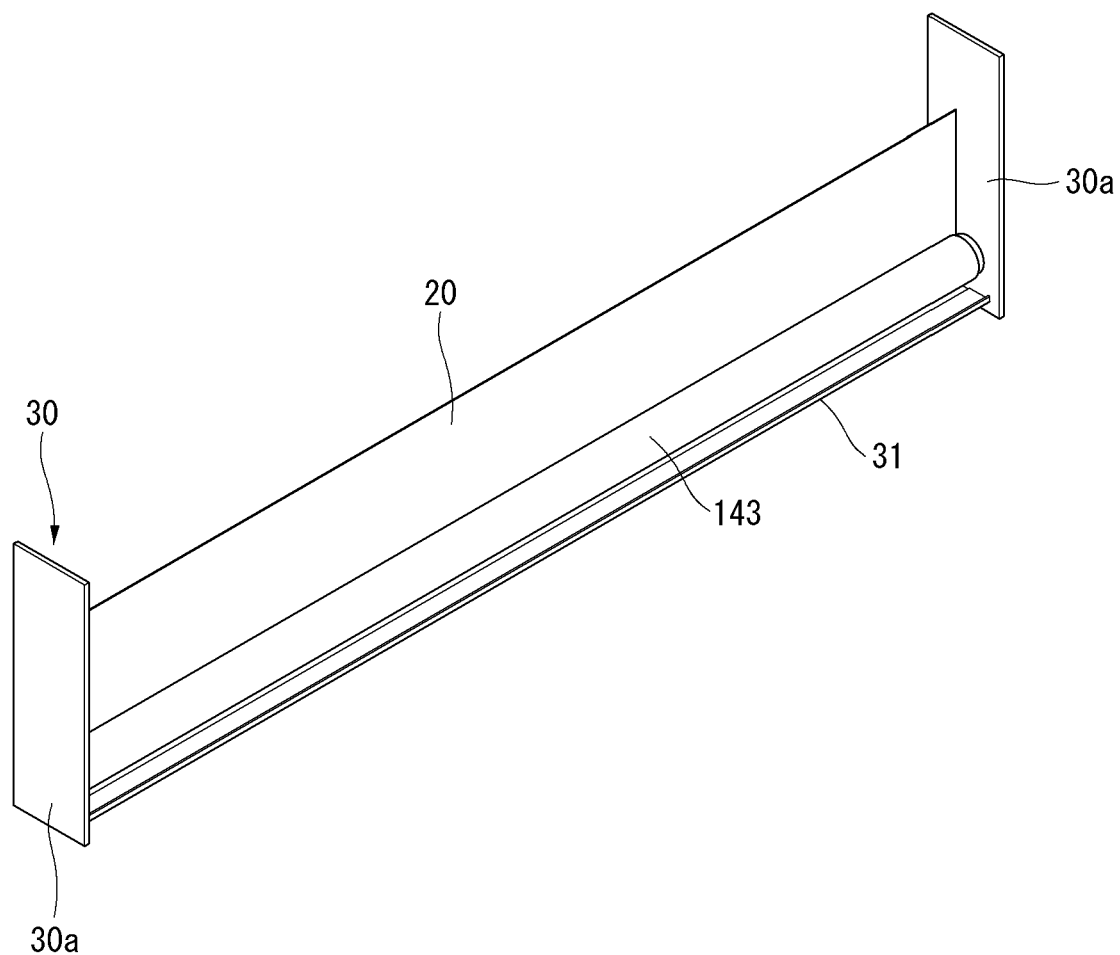

Referring to FIG. 17, the roller 143 around which the display unit 20 is wound may be installed in a first base 31. The first base 31 may be a bottom surface of the housing 30. The roller 143 may extend long in the length direction of the housing 30. The first base 31 may be connected to a side surface 30a of the housing 30.

Figure 18:
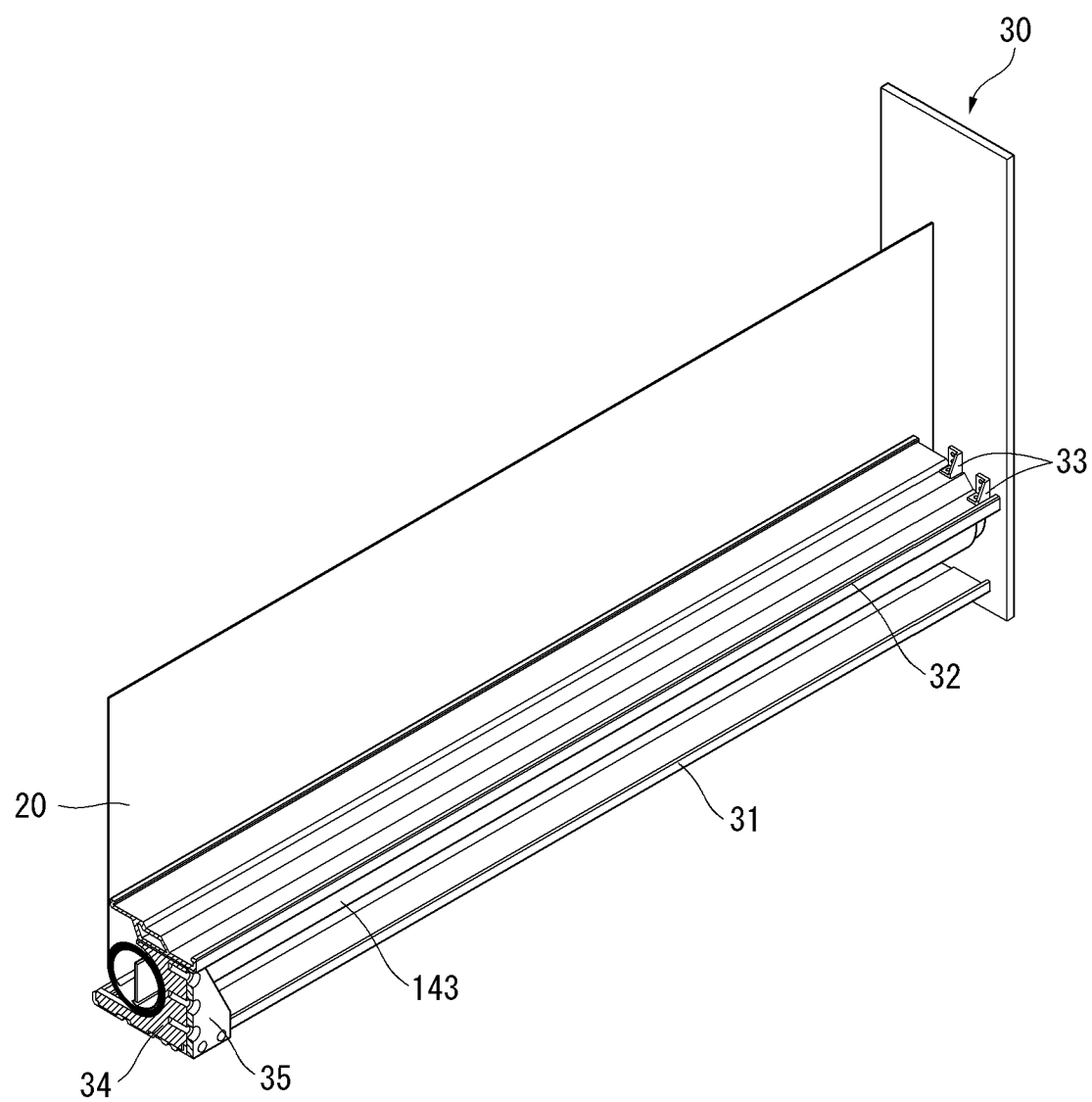
Figure 19:
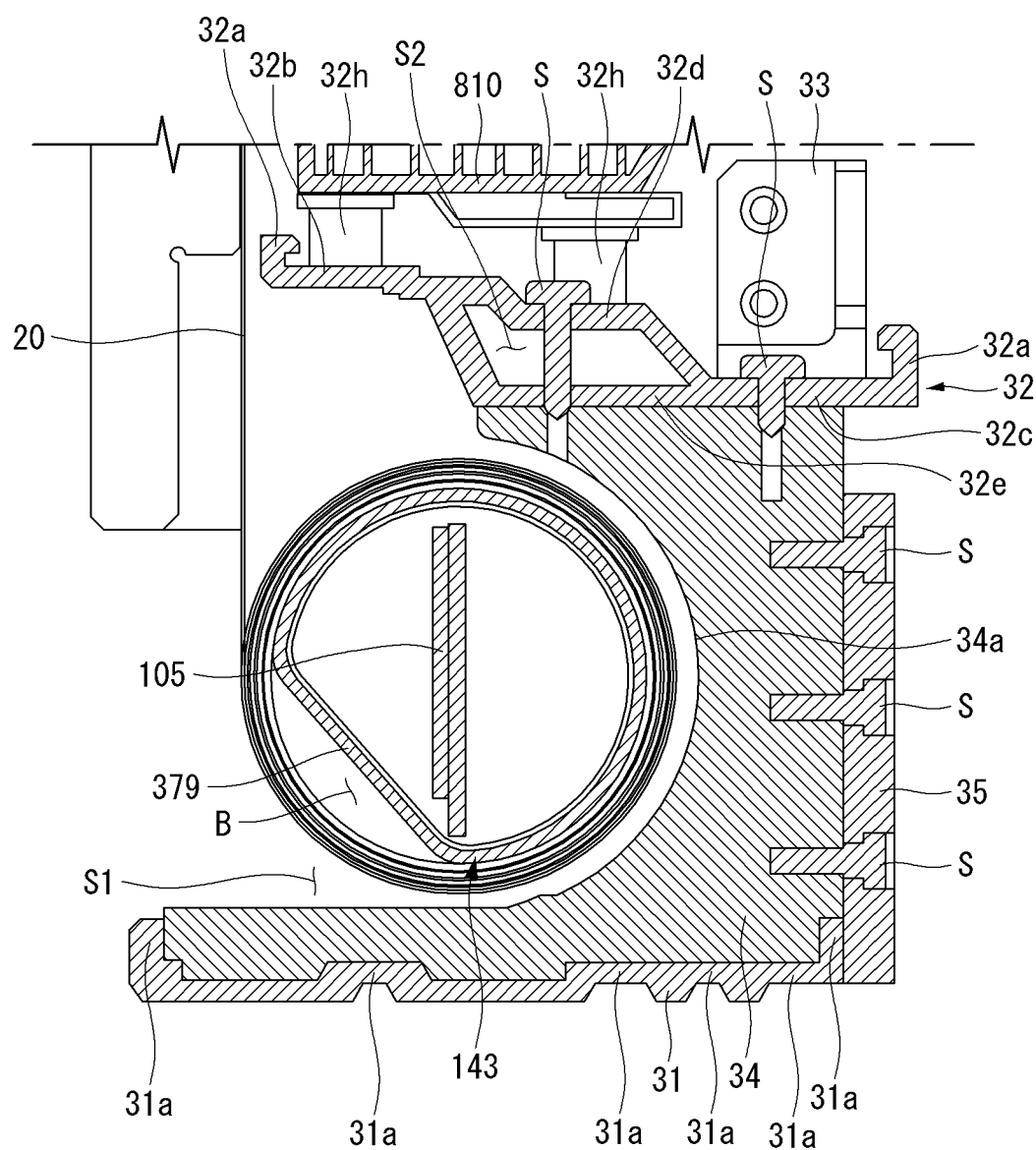

Referring to FIGS. 18 and 19, a beam 31a may be formed in the first base 31. The beam 31a may improve the bending or torsional rigidity of the first base 31. Many parts may be installed in the first base 31, and the first base 31 may receive a large load. Since the first base 31 has improved rigidity, sagging due to a load may be prevented. For example, the beam 31a may be formed by a pressing process.

A second base 32 may be spaced apart toward the upper side of the first base 31. A space 51 may be formed in the first base 31 and the second base 32. The roller 143 around which the display unit 20 is wound may be received in the space 51. The roller 143 may be located between the first base 31 and the second base 32.

The second base 32 may be connected to the side surface 30a of the housing 30. A bracket 33 may be fastened to the upper surface of the first base 31. The bracket 33 may be fastened to the side surface 30a of the housing 30.

A beam 32a may be formed on the second base 32. The beam 32a may improve the bending or torsional rigidity of the second base 32. For example, the beam 32a may be formed by a press process.

A third part 32d may be connected to a first part 32b and a second part 32c. A fourth part 32e may be connected to the first part 32b and the second part 32c. A space S2 may be formed between the third part 32d and the fourth part 32e. Accordingly, the bending or torsional rigidity of the second base 32 may be improved. The third part 32d may be referred to as a reinforcing rib 32d or a rib 32d. The fourth part 32e may be referred to as a reinforcing rib 32e or a rib 32e.

Many parts may be installed in the second base 32, and the second base 32 may receive a large load. Since the second base 32 has improved rigidity, sagging due to a load may be prevented.

A first reinforcing plate 34 may be located between the first base 31 and the second base 32. The first reinforcing plate 34 and the second base 32 may be fastened by a screw. The first reinforcing plate 34 may support the second base 32. The first reinforcing plate 34 may prevent the second base 32 from sagging. The first reinforcing plate 34 may be located in a central portion of the first base 31 or a central portion of the second base 32. The first reinforcing plate 34 may include a curved portion 34a. The curved portion 34a may be formed along the roller 143. The curved portion 34a may not come into contact with the roller 143 or the display unit 20 wound around the roller 143. The curved portion 34a may maintain a certain distance from the roller 143 so as not to interfere with the rotation of the roller 143.

A second reinforcing plate 35 may be fastened to the first base 31 and the first reinforcing plate 34. The second reinforcing plate 35 may support the first reinforcing plate 34. The second reinforcing plate 35 may be located in the rearward direction of the first reinforcing plate 34. The second reinforcing plate 35 may be located in the rearward direction of the first base 31. The second reinforcing plate 35 may be located perpendicular to the first base 31. The second reinforcing plate 35 may be fastened to the beam 31a of the first base 31. The second base 32 may face the front or rear surface of the housing 30.

Figure 20:
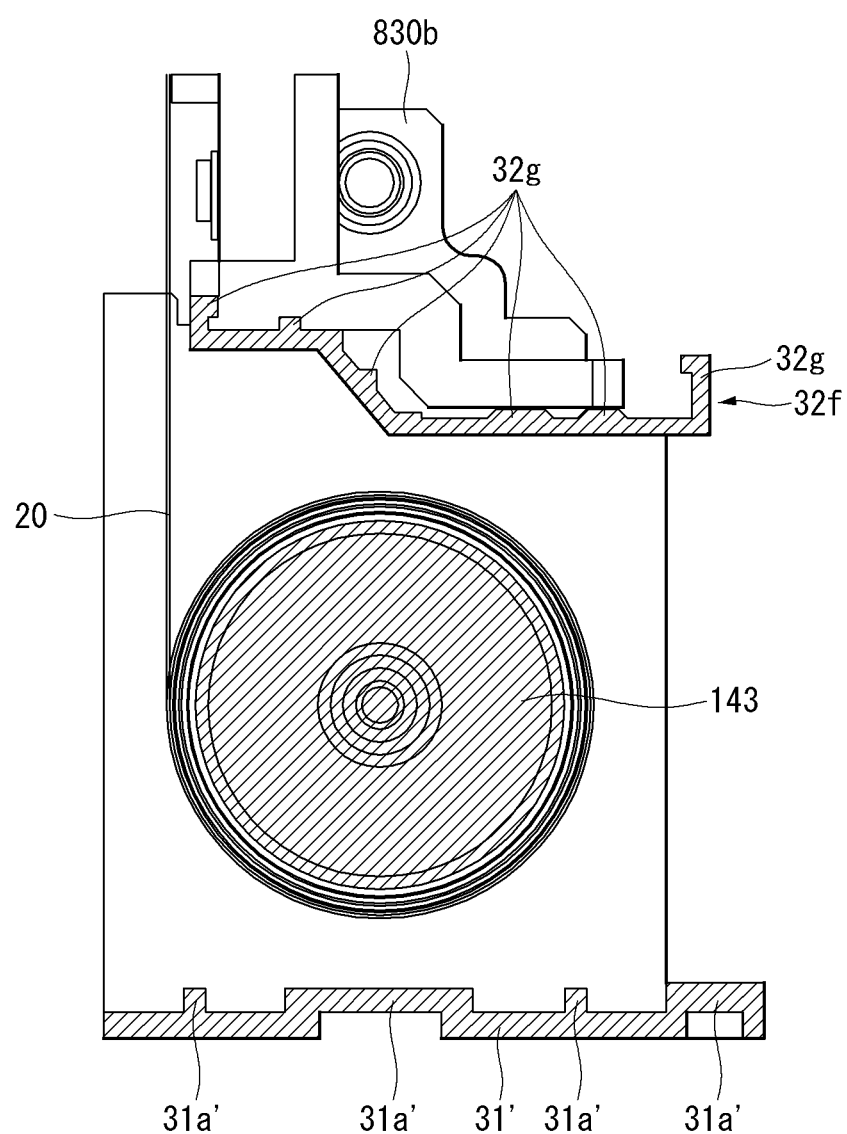

Referring to FIG. 20, a second base 32f may not form a space. When the load received by the second base 32f is not large, the second base 32f may have sufficient rigidity by including a beam 32g. A first base 31' may include a beam 31a'.

Figure 21:
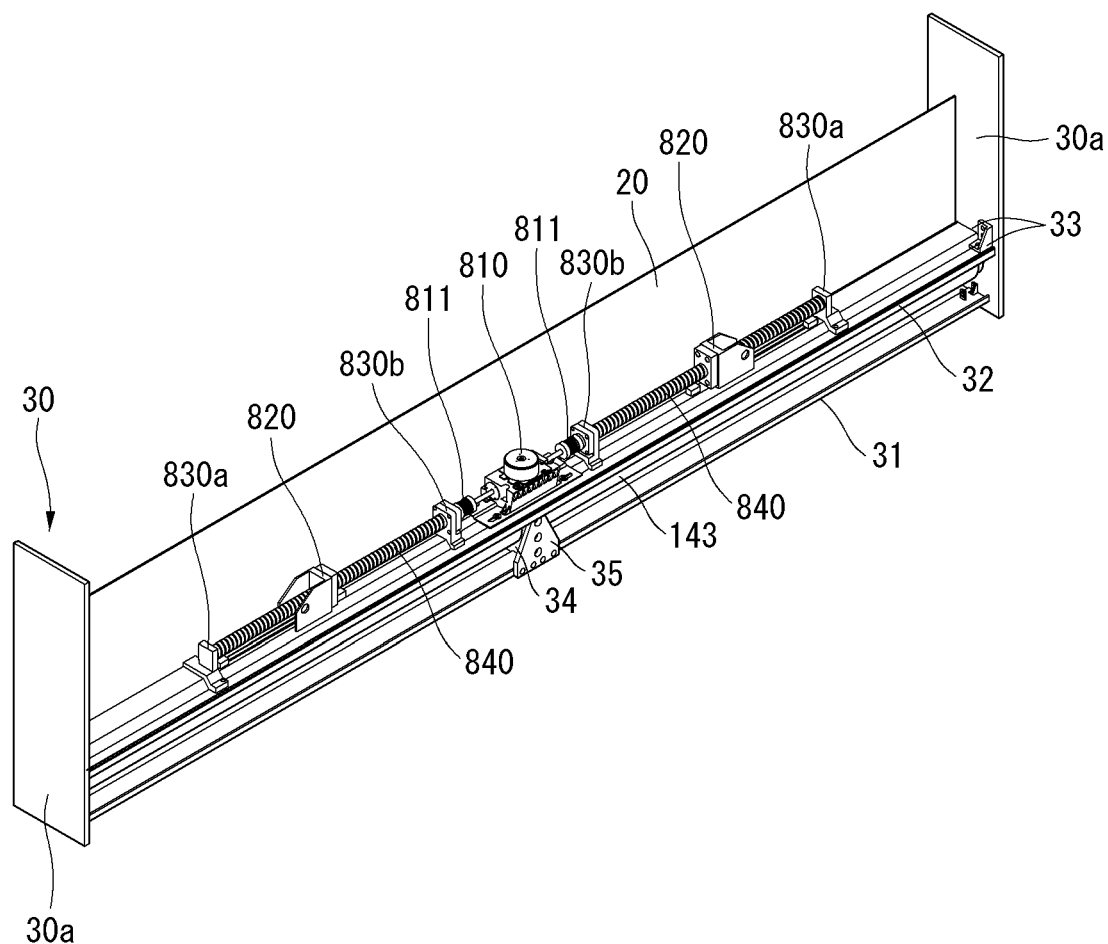
Figure 22:
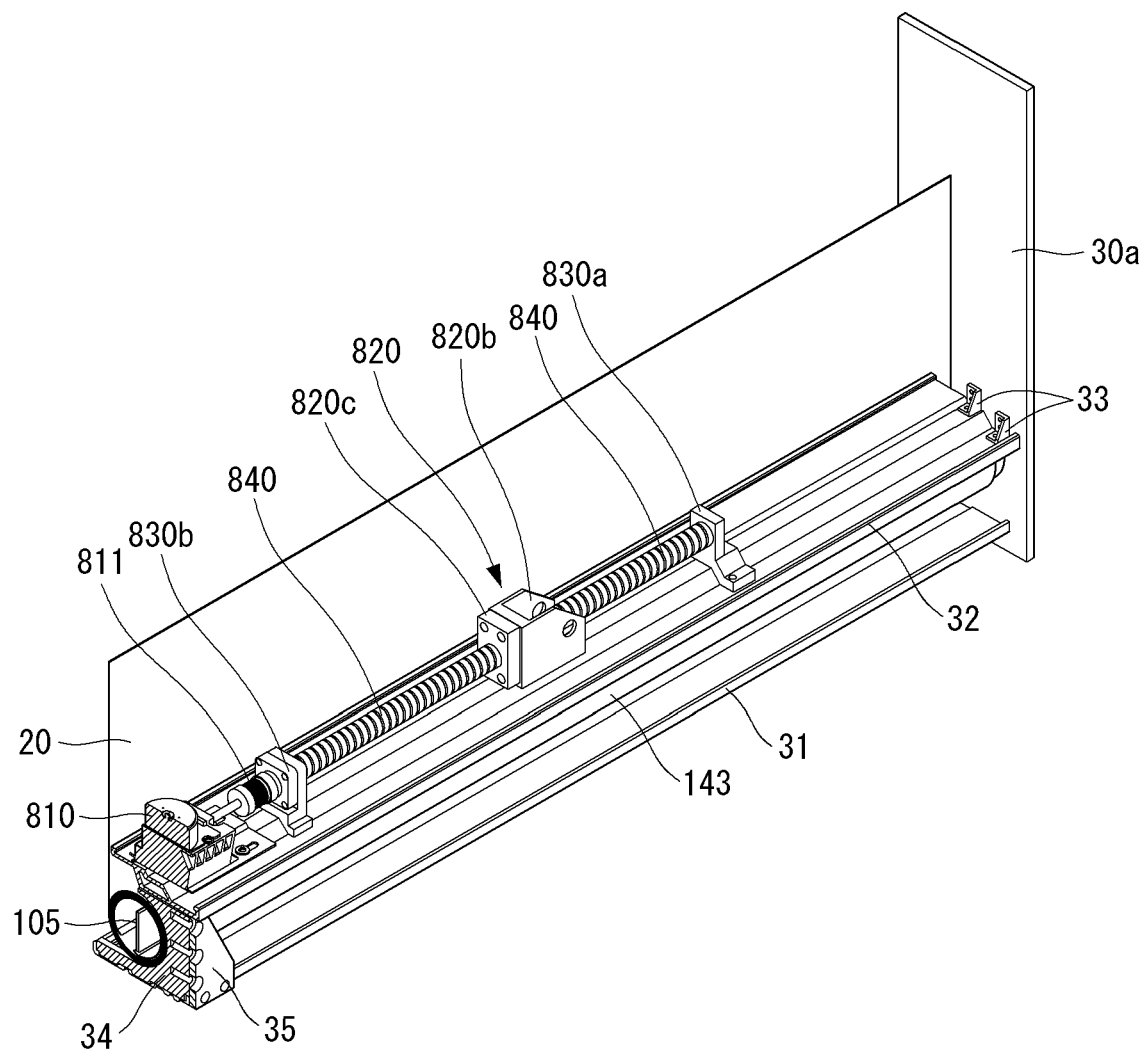

Referring to FIGS. 21 and 22, a motor assembly 810 may be installed in the second base 32. The driving shaft of the motor assembly 810 may be formed in opposite sides. The right driving shaft and the left driving shaft of the motor assembly 810 may rotate in the same direction. Alternatively, the right driving shaft and the left driving shaft of the motor assembly 810 may rotate in opposite directions.

The motor assembly 810 may include a plurality of motors. A plurality of motors may be connected in series with each other. The motor assembly 810 may output a high torque by connecting a plurality of motors in series.

A lead screw 840 may be located in the left and right sides of the motor assembly 810, respectively. The motor assembly 810 may be connected to the lead screw 840. A coupling 811 may connect the lead screw 840 and the driving shaft of the motor assembly 810 to each other.

The lead screw 840 may be threaded along the length direction. A direction of a thread formed in the right lead screw 840 and a direction of a thread formed in the left lead screw 840 may be opposite to each other. The direction of the thread formed in the right lead screw 840 may be the same as the direction of the thread formed in the left lead screw 840. Pitches of the left lead screw 840 and the right lead screw 840 may be the same.

A bearing 830a, 830b may be installed in the second base 32. The bearing 830a, 830b may support opposite sides of the lead screw 840. The bearing 830a, 830b may include an inner bearing 830b located close to the motor assembly 810 and an outer bearing 830a located far from the motor assembly 810. The lead screw 840 may be stably rotated by the bearing 830a, 830b.

A slide 820 may the lead screw 840. The slide 820 may move forward and backward in the length direction of the lead screw 840 according to the rotation of the lead screw 840. The slide 820 may move between the outer bearing 830a and the inner bearing 830b. The slide 820 may be located in the left lead screw 840 and the right lead screw 840, respectively. The left slide 820 may be engaged with the left lead screw 840. The right slide 820 may be engaged with the right lead screw 840.

The left slide 820 and the right slide 820 may be located symmetrically with respect to the motor assembly 810. Due to the driving of the motor assembly 810, the left slide 820 and the right slide 820 may move away from or close to each other by the same distance.

Figure 23:
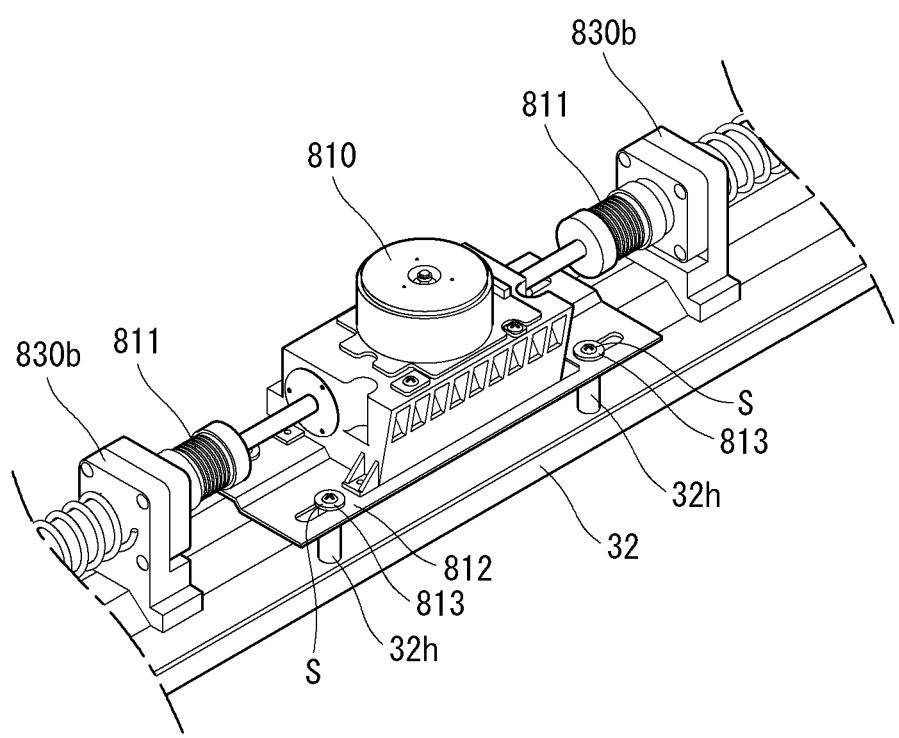

Referring to FIG. 23, the motor assembly 810 may include a plate 813. The plate 813 may be referred to as a mount plate 813 or a motor mount plate 813. A coupling portion 32h may be formed on the upper surface of the second base 32. The plate 813 may be fastened to the coupling portion 32h through the screw S. The motor assembly 810 may be spaced apart from the upper surface of the second base 32. A washer 813 may be located between the upper surface of the plate 813 and the screw S. The washer 813 may include a rubber material. The washer 813 may reduce vibration generated in the motor assembly 810. The washer 813 may improve driving stability of the display device 100.

Figure 24:
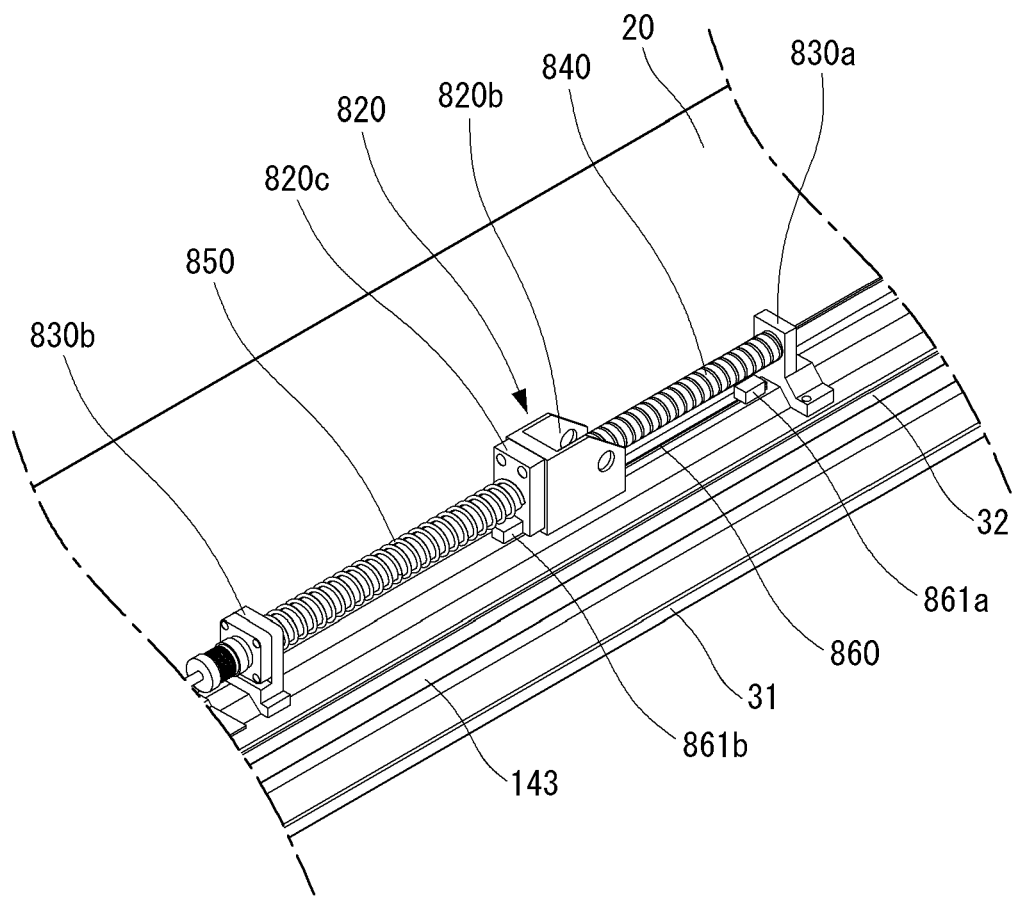

Referring to FIG. 24, a guide rail 860 may be installed in the second base 32. The guide rail 860 may be located in parallel with the lead screw 840. The slide 820 may be engaged with the guide rail 860. A first stopper 861b may be located in one side of the guide rail 860, and a second stopper 861a may be located in the other side of the guide rail 860. A range in which the slide 820 can move may be restricted between the first stopper 861b and the second stopper 861a.

A spring 850 may surround the lead screw 840. The lead screw 840 may penetrate the spring 850. The spring 850 may be located between the inner bearing 830b and the slide 820. One side of the spring 850 may contact the inner bearing 830b, and the other side of the spring 850 may contact the slide 820. The spring 850 may provide an elastic force to the slide 820.

When the slide 820 is caught by the first stopper 861b, the spring 850 may be maximally compressed. When the slide 820 is caught by the first stopper 861b, the length of the spring 850 may be a minimum. When the slide 820 is caught by the first stopper 861b, a distance between the slide 820 and the inner bearing 830b may be a minimum.

Figure 25:
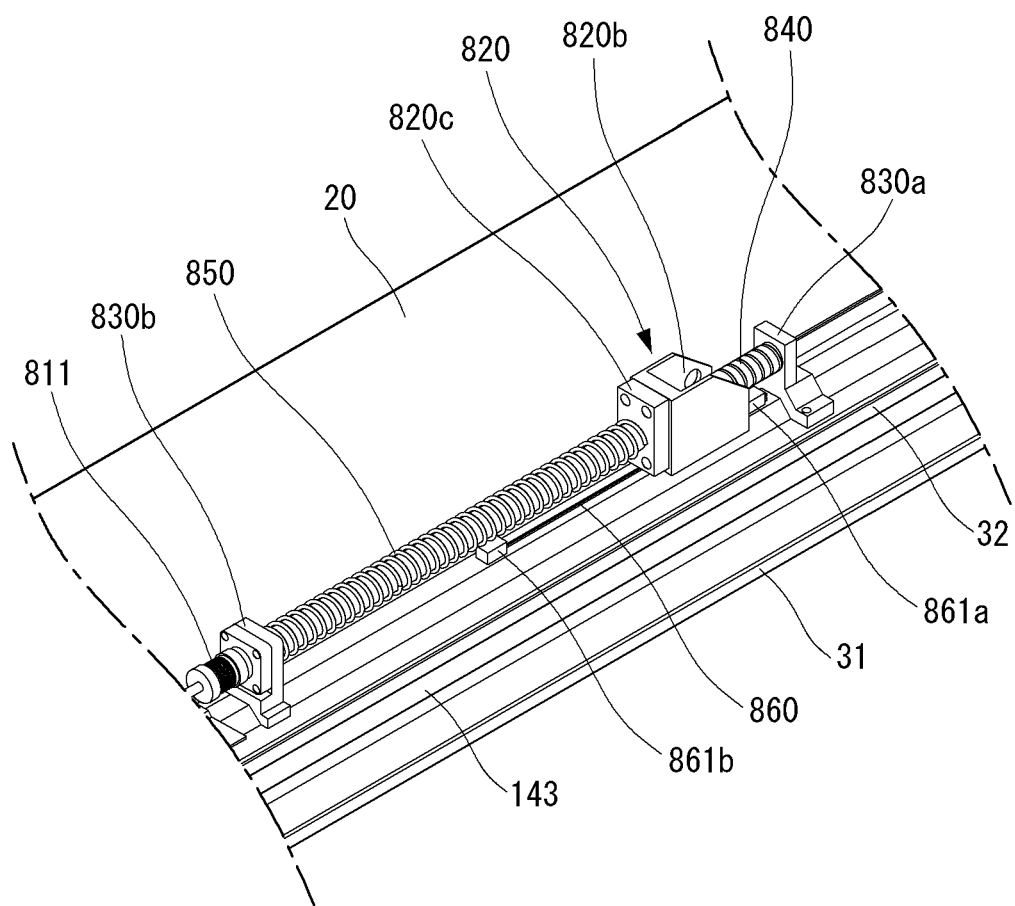

Referring to FIG. 25, when the slide 820 is caught by the second stopper 861a, the spring 850 may be maximally tensioned. When the slide 820 is caught by the second stopper 861b, the length of the spring 850 may be a maximum. When the slide 820 is caught by the second stopper 861a, a distance between the slide 820 and the inner bearing 830b may be a maximum.

Figure 26:
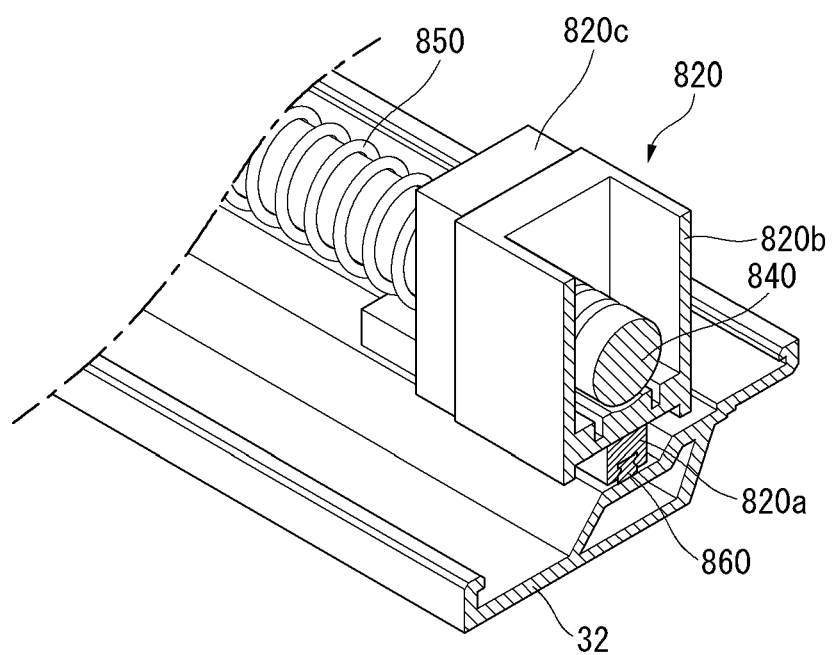

Referring to FIG. 26, a first part 820a may be engaged with the guide rail 860. The first part 820a may move along the guide rail 860. Movement of the first part 820a in the length direction of the guide rail 860 may be restricted. A second part 820b may be located in the upper side of the first part 820a. The first part 820a and the second part 820b may be fastened through a screw. The second part 820b may be spaced apart from the guide rail 860. The lead screw 840 may penetrate the second part 820b. For example, the second part 820b may include a male thread engaged with a female thread of the lead screw 840. Accordingly, even when the lead screw 840 rotates, the slide 820 does not rotate and may stably move forward and backward along the guide rail 860.

A third part 820c may be coupled to one side of the second part 820b. The third part 820c may contact the spring 850. The third part 820c may receive elastic force from the spring 850.

Figure 27:
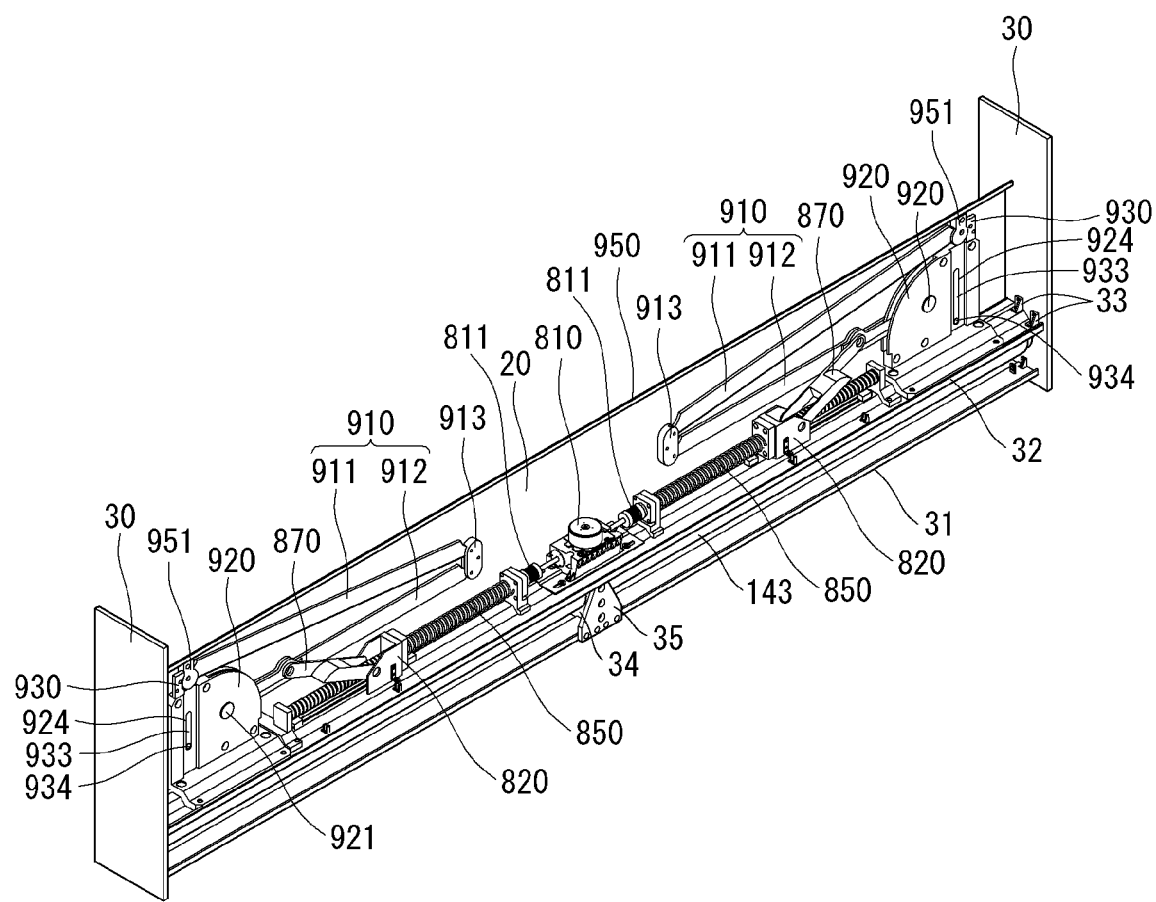
Figure 28:
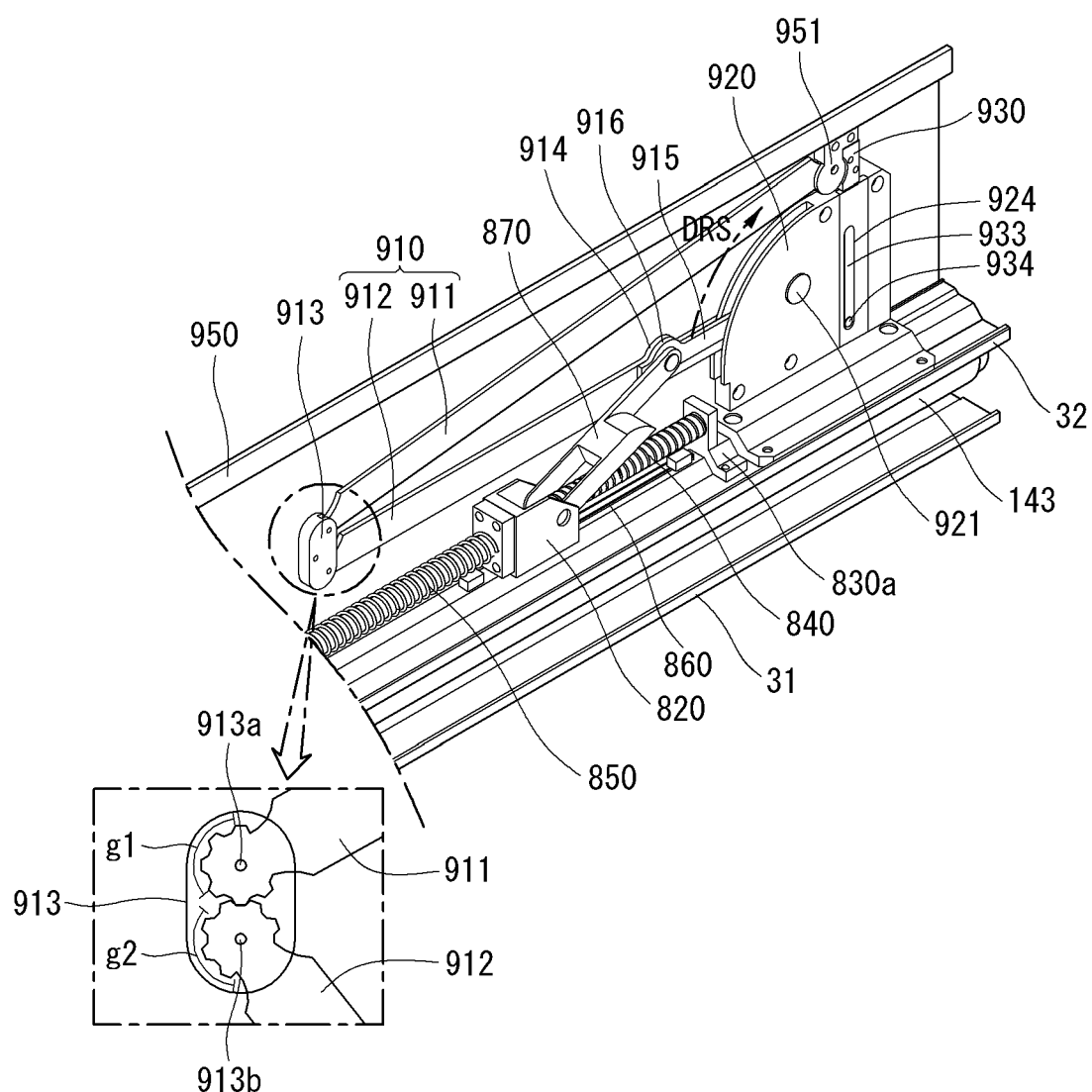

Referring to FIGS. 27 and 28, a link mount 920 may be installed in the second base 32. One side of a second arm 912 may be pivotally connected to the link mount 920. The other side of the second arm 912 may be pivotally connected to a joint 913. The other side of the second arm 912 may be pivotally connected to a second shaft 913b. One side of a rod 870 may be pivotally connected to the slide 820. The other side of the rod 870 may be pivotally connected to the second arm 912 or a third arm 915. One side of the third arm 915 may be pivotally connected to the link mount 920. The other side of the third arm 915 may be pivotably connected to the other side of the rod 870. The link mount 920 may include a shaft 921. The second arm 912 or the third arm 911 may be pivotally connected to the shaft 921.

A link bracket 951 may be referred to as a link cap 951. The link bracket 951 may be coupled to a top case 950. The top case 950 may be referred to as a case top 950, an upper bar 950, a top 950, or a bar 950. The top case 950 may be located in an upper end of the display unit 20. The display unit 20 may be fixed to the top case 950.

One side of a first arm 911 may be pivotally connected to the joint 913. One side of the first arm 911 may be pivotably connected to a first shaft 913a. The other side of the first arm 911 may be pivotably connected to the link bracket 951 or the top case 950.

A gear g1 may be formed in one side of the first arm 911. A gear g2 may be formed in the other side of the second arm 912. The gear g1 of the first arm 911 and the gear g2 of the second arm 912 may be engaged with each other.

When the slide 820 moves closer to the outer bearing 830a, the second arm 912 or the third arm 915 may stand up. this case, a direction in which the second arm 912 or the third arm 915 stands up may be referred to as a standing direction DRS.

The second arm 912 may include a protrusion 914 protruding in the standing direction DRS. The protrusion 914 may be referred to as a connecting portion 914. The third arm 915 may include a protrusion 916 protruding in the standing direction DRS. The protrusion 916 may be referred to as a connecting portion 916. The protrusion 914 of the second arm 912 and the protrusion 916 of the third arm 915 may face or contact each other. The other side of the rod 870 may be fastened to the protrusion 914 of the second arm 912 or the protrusion 916 of the third arm 915.

The link 910 may include a first arm 911, a second arm 912, a third arm 915, and/or a joint 913.

Figure 29:
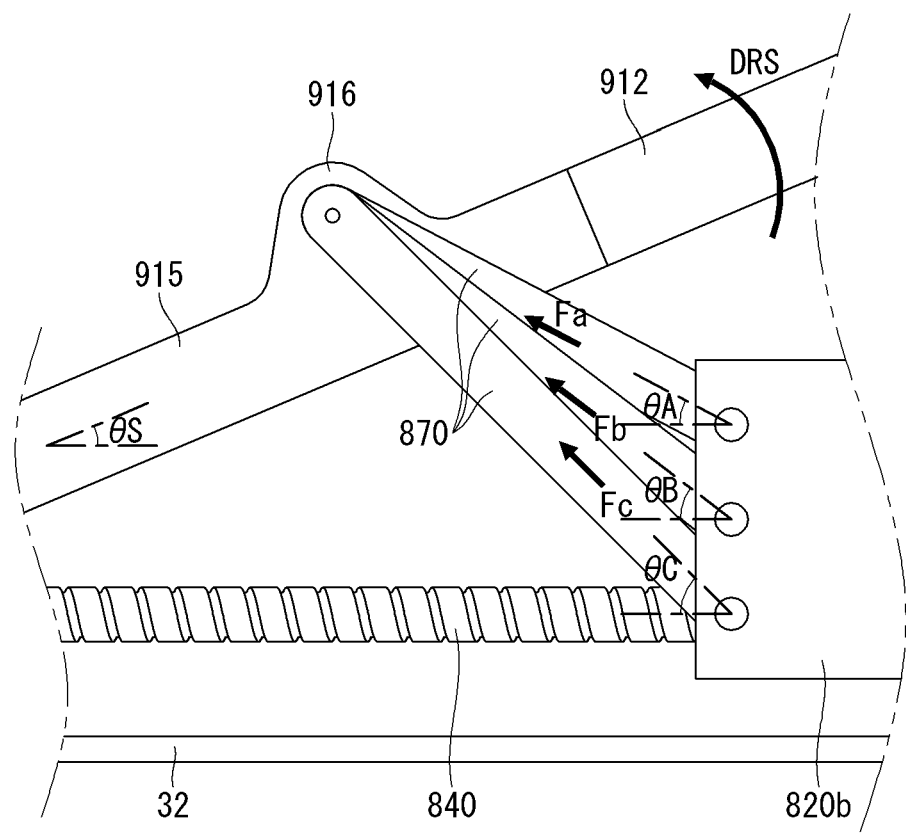
Figure 30:
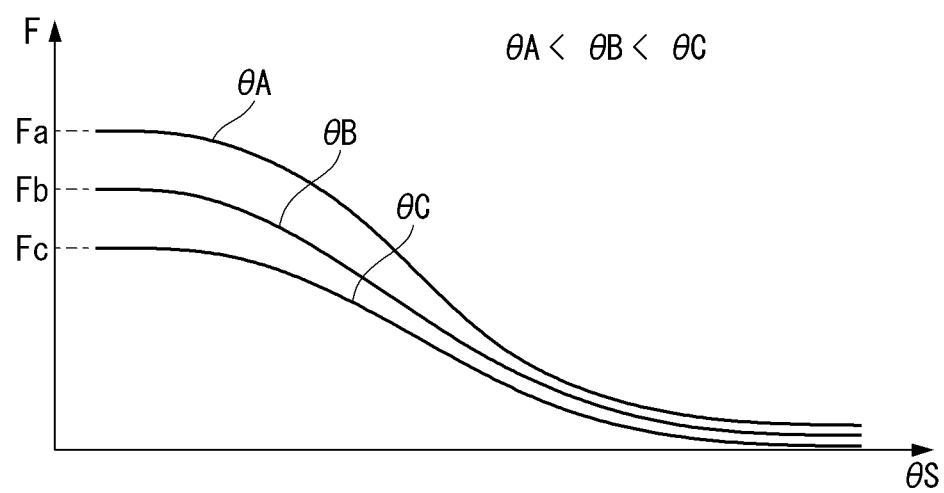

Referring to FIGS. 29 and 30, an angle between the second arm 912 or the third arm 915 and the second base 32 may be referred to as theta S. When the rod 870 is connected to the upper side of the second part 820b, an angle between the rod 870 and the second base 32 may be referred to as theta A, and the minimum force for the rod 870 to stand up the second arm 912 or the third arm 915 may be referred to as Fa. When the rod 870 is connected to the middle of the second part 820b, an angle between the rod 870 and the second base 32 may be referred to as theta B, and the minimum force for the rod 870 to stand up the second arm 912 or the third arm 915 may be referred to as Fb. When the rod 870 is connected to the lower side of the second part 820b, an angle between the rod 870 and the second base 32 may be referred to as theta C, and the minimum force for the rod 870 to stand up the second arm 912 or the third arm 915 may be referred to as Fc.

For the same theta S, a relationship of theta A <thetaB<theta C can be established for the same theta S. In addition, a relationship of Fc <Fb <Fa may be established for the same theta S. If an angle between the second arm 912 or the third arm 915 and the second base 32 is the same, as the angle between the rod 870 and the second base 32 increases, the force required to stand up the second arm 912 or the third arm 915 may be reduced. The rod 870 may be connected to the lower side of the second part 820b to reduce a load applied to the motor assembly 810.

Figure 31:
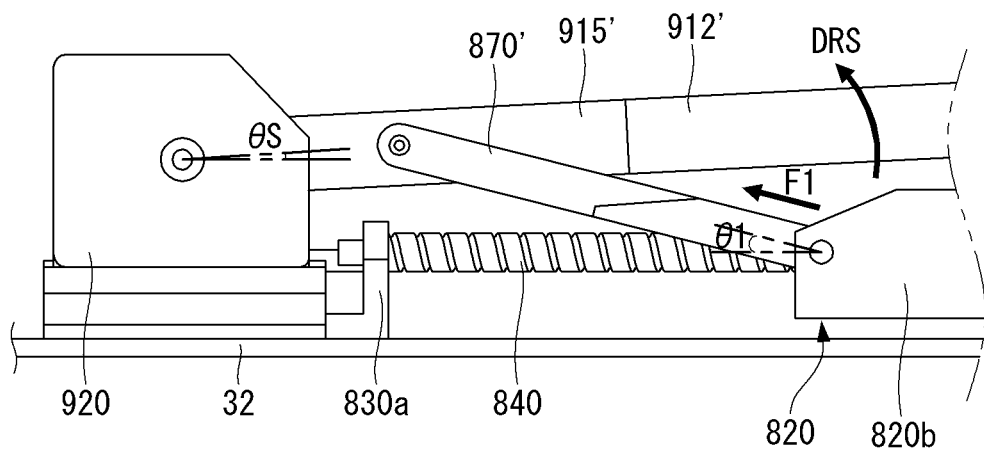

Referring to FIG. 31, a rod 870' may not be connected to the protrusion of a second arm 912' or the protrusion of a third arm 915'. When an angle between the second arm 912' or the third arm 915' and the second base 32 is theta S, an angle between the rod 870' and the second base 32 may be referred to as theta 1, and the minimum force for the rod 870' to stand up the second arm 912' or the third arm 915' may be referred to as F1.

Figure 32:
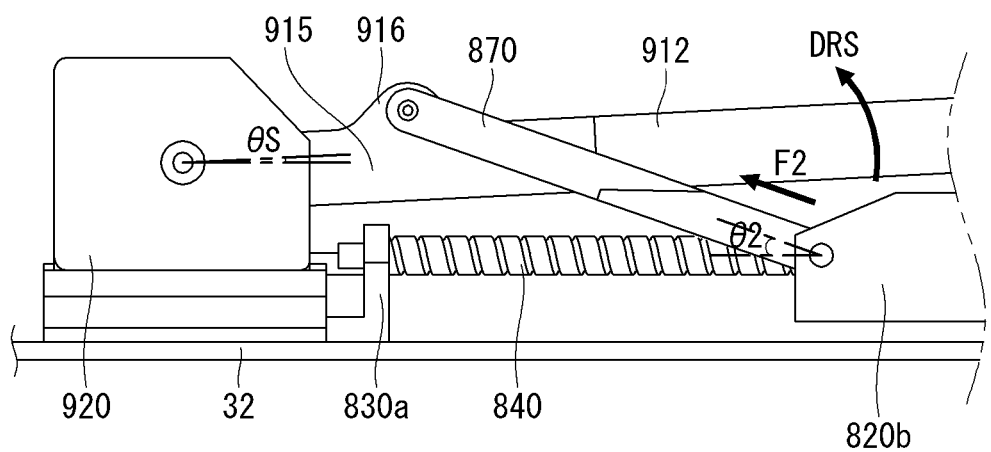

Referring to FIG. 32, the rod 870 may be connected to the protrusion 914 of the second arm 912 or the protrusion 916 of the third arm 915. When the angle between the second arm 912 or the third arm 915 and the second base 32 is theta S, an angle between the rod 870 and the second base 32 may be referred to as theta 2, and the minimum force for the rod 870 to stand up the second arm 912 or the third arm 915 may be referred to as F2.

Figure 33:
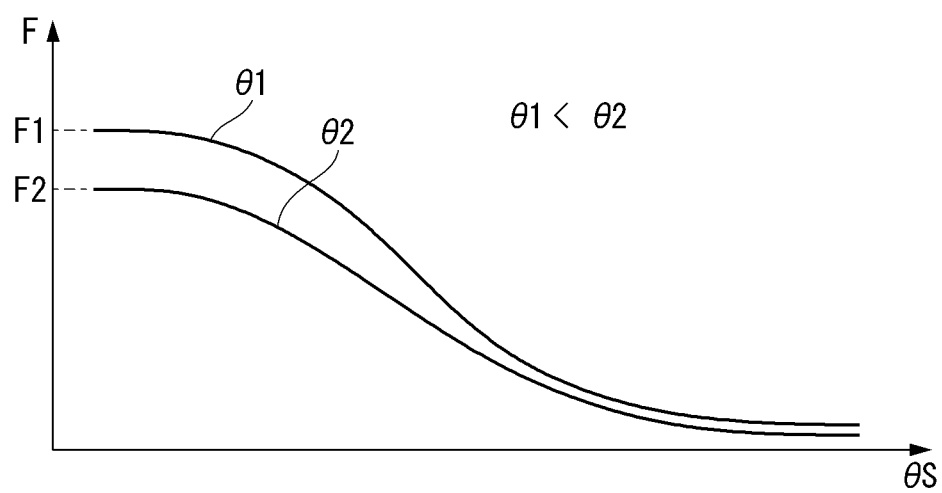

Referring to FIG. 33, when theta S is the same, theta 2 may be larger than theta 1. When theta S is the same, F1 may be larger than F2. If the angle between the second arms 912, 912' and the second base 32 is the same, as the angle between the rod 870, 870' and the second base 32 increases, the force required to stand up the second arm 912, 912' may be reduced. Since the rod 870 is connected to the protrusion 914, 916, the second arm 912 may stand up with a small force compared to a case in which the rod 870' is not connected to the protrusion. The rod 870 is connected to the protrusion 914, 916, thereby reducing a load applied to the motor assembly 810.

Figure 34:
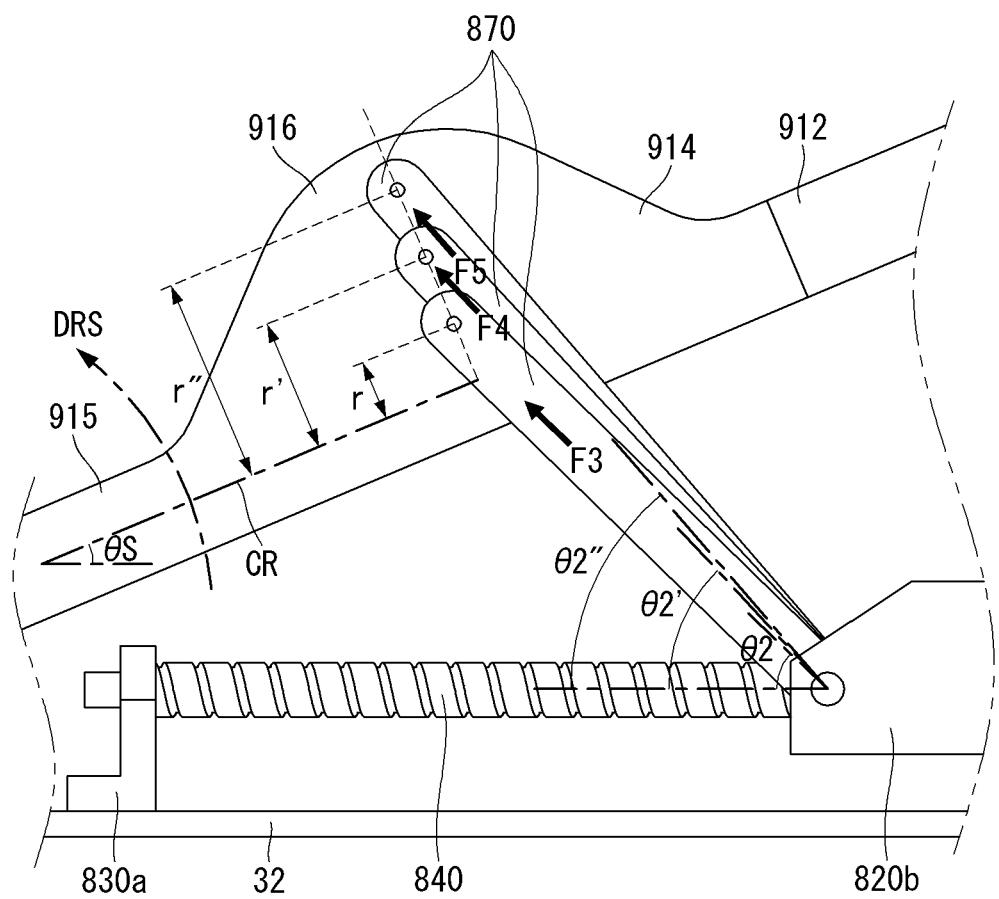

Referring to FIG. 34, the second arm 912 or the third arm 915 may have a central axis CR. When the rod 870 is fastened with the second arm 912 away from the central axis CR by a distance r, the angle between the rod 870 and the second base 32 may be referred to as theta 2, and a minimum force for the rod 870 to stand up the second arm 912 or the third arm 915 may be referred to as F3. When the rod 870 is fastened with the second arm 912 away from the central axis CR by a distance r', the angle between the rod 870 and the second base 32 may be referred to as theta 2', and a minimum force for the rod 870 to stand up the second arm 912 or the third arm 915 may be referred to as F4. When the rod 870 is fastened with the second arm 912 away from the central axis CR by a distance r", the angle between the rod 870 and the second base 32 may be referred to as theta 2", and a minimum force for the rod 870 to stand up the second arm 912 or the third arm 915 may be referred to as F5.

Figure 35:
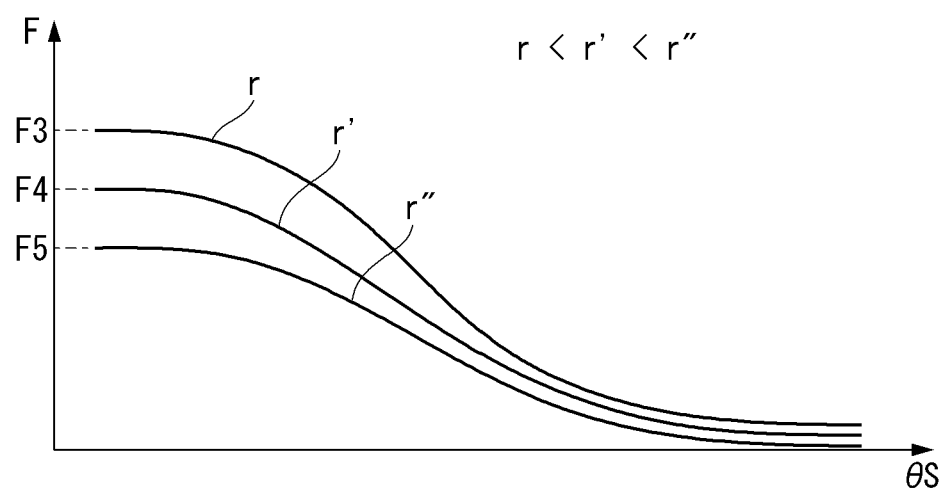

Referring to FIG. 35, when theta S is the same, theta 2" may be larger than theta 2', and theta 2' may be larger than theta 2. When theta S is the same, F3 may be larger than F4, and F4 may be larger than F5. As the rod 870 is fastened away from the central axis CR, the force required to stand up the second arm 912 may become smaller. Since the rod 870 is fastened away from the central axis CR, a load applied to the motor assembly 810 may be reduced.

Figure 36:
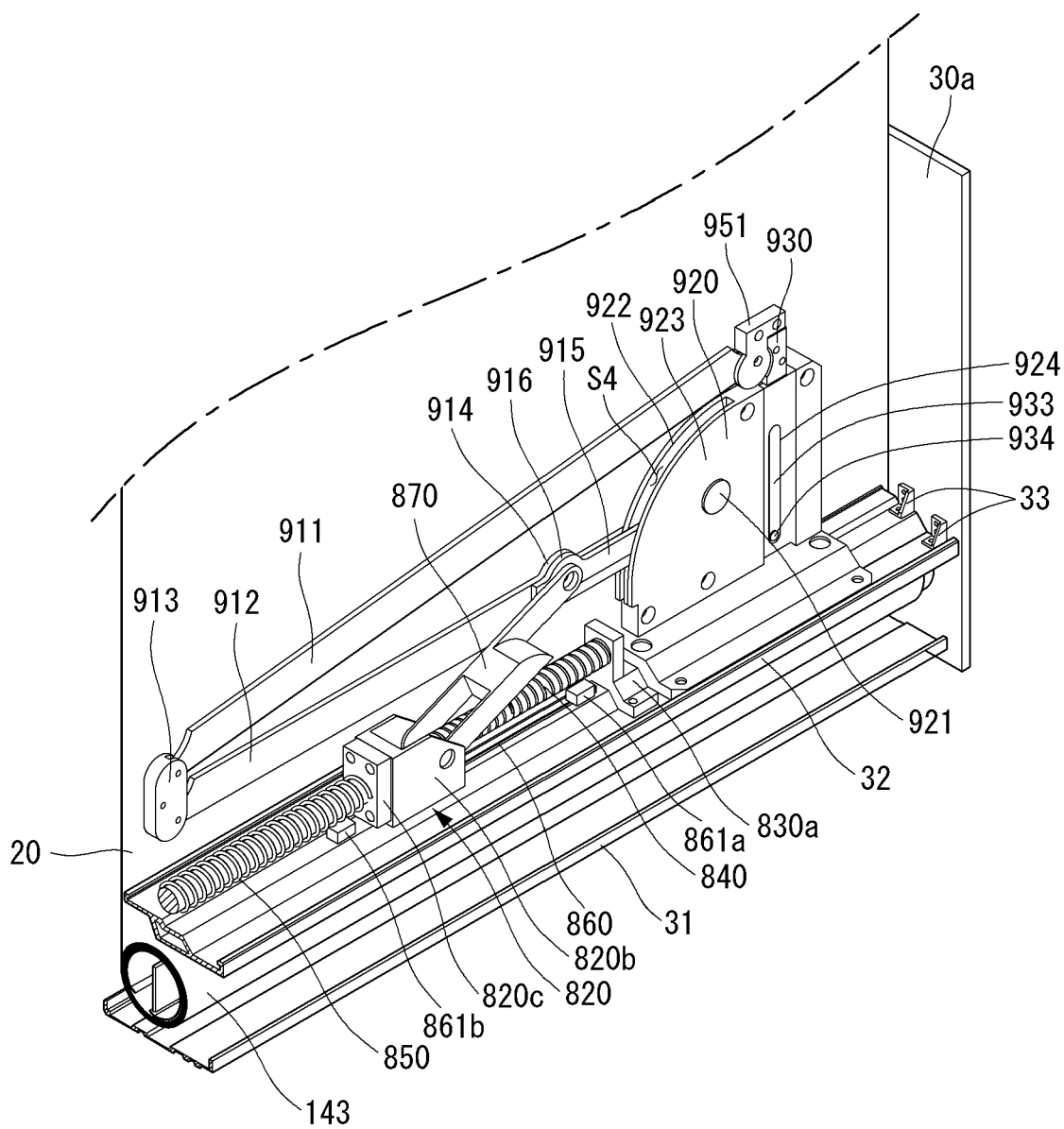

Referring to FIG. 36, the first arm 911 and the second arm 912 may be located close to or in contact with the rear surface of the display unit 20. As the first arm 911 and the second arm 912 are located close to or in contact with the rear surface of the display unit 20, the display unit 20 can be stably wound around or unwound from the roller. The link mount 920 may include a first part 922 and a second part 923. The first part 922 and the second part 923 may face each other. A space S4 may be formed between the first part 922 and the second part 923. The first part 922 may face the display unit 20. The first part 922 may be located closer to the display unit 20 than the second part 923. The second arm 912 may be pivotally connected to the front surface of the first part 922. A portion of the third arm 915 may be received in the space S4, and may be pivotally connected to the first part 922 or the second part 923.

Figure 37:
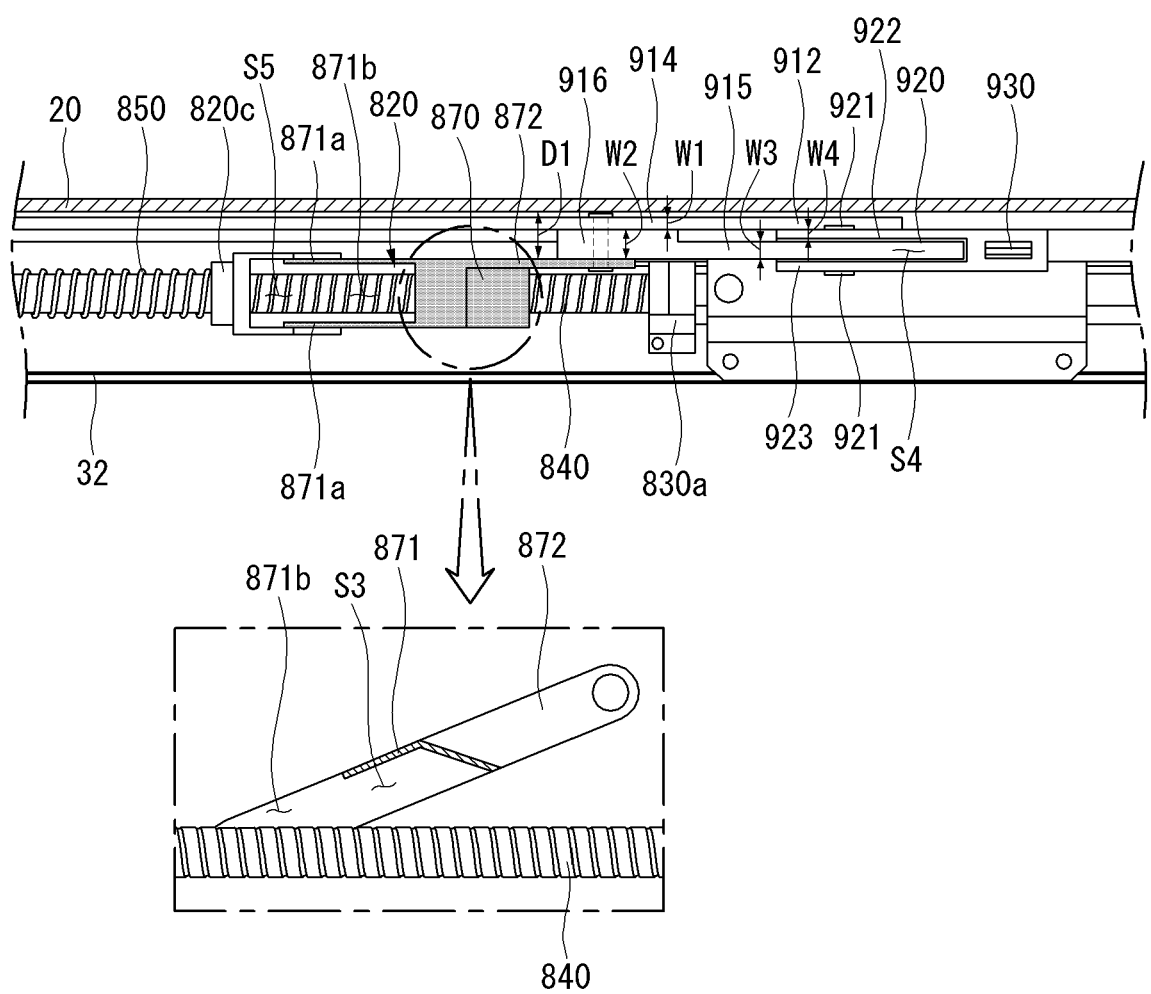

Referring to FIG. 37, the rod 870 may include a first part 871 and a second part 872. The first part 871 may include a connection portion 871a in one side. The second part 872 of the slide 820 may form a space S5 therein. The connection portion 871a may be inserted into the space S5. The connection portion 871a may be pivotally connected to the second part 820b (refer to FIG. 36) of the slide 820. The other side of the first part 871 may be connected to one side of the second part 872. The other side of the second part 872 may be pivotably connected to the second arm 912 or the third arm 915. The first part 871 may form a space S3 therein. The first part 871 may include a hole 871b. The lead screw 840 may be received in the hole 871b or the space S3.

A distance between the second part 872 and the display unit 20 may be D1. The second arm 912 may have a thickness W1. A portion of the third arm 915 received in the space S4 may have a thickness W3. The thickness W3 may be equal to the distance between the first part 922 and the second part 923. A portion of the third arm 915 that is not received in the space S4 may have a thickness W2. The first part 922 may have a thickness W4. The thickness W2 may be larger than the thickness W3. The thickness W2 may be equal to the sum of the thickness W3 and the thickness W4. D1 may be the sum of the thickness W1 and the thickness W2.

The second arm 912 may be located in contact with or close to the rear surface of the display unit 20, and the third arm 915 may be located between the second arm 912 and the second part 872. The second part 872 may stably transmit power for standing up the second arm 912, due to the third arm 915. The second part 872 may be connected to the first part 871 by moving forward with respect to the rotation axis of the lead screw 840, in order to stably stand up the second arm 912 or the third arm 915. Due to this, a gap between the second arm 912 and the second part 872 may be minimized.

Figure 38:
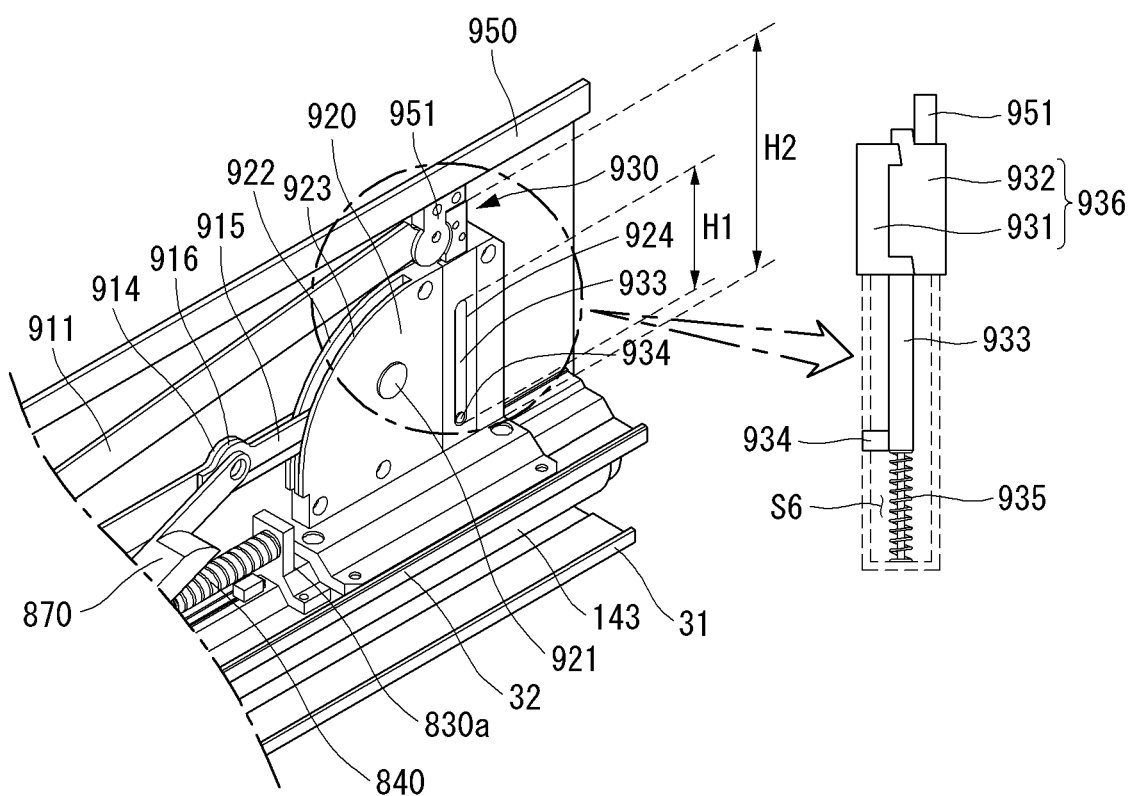

Referring to FIG. 38, a pusher 930 may be mounted in the link mount 920. The pusher 930 may be referred to as a lifter 930. The second part 932 may be fastened to the first part 931. The second part 932 may be in contact with or separated from the link bracket 951. The second part 932 may be made of a material having high elasticity. The first part 931 may be made of a material having lower elasticity than the second part 932. The first part 931 may be made of a material having a higher rigidity than the second part 932. The first part 931 and the second part 932 may be collectively referred to as a head 936. The head 936 may be located in the upper side of the link mount 920.

The third part 933 may be connected to the first part 931. Alternatively, the third part 933 may extend downward from the first part 931. The third part 933 may be referred to as a tail 933. The fourth part 934 may protrude from the third part 933. The link mount 920 may form a space S6, and the third part 933 may be received in the space S6. The space S6 may be opened upward. The space S6 in which the third part 933 is received may be adjacent to the space S4 (refer to FIG. 3) in which the third arm 915 is received. The second part 932 of the link mount 920 may include a hole 924. The hole 924 may be a long hole formed long in the vertical direction. The length of the hole 924 may be H1. The fourth part 934 may be inserted into the hole 924. A spring 935 may be received in the space S6. The spring 935 may be located in the lower side of the third part 933. The spring 935 may provide an elastic force to the third part 933 in a vertical direction.

The head 936 may be larger than the diameter of the space S6. When the head 936 is caught by the upper end of the space S6, the height of the head 936 from the second base 32 may be a minimum. The minimum height of the head 936 may be referred to as H2. When the height of the head 936 is a minimum, the fourth part 934 may be caught by the lower end of the space S6. When the height of the head 936 is a minimum, the spring 935 can be maximally compressed. When the height of the head 936 is a minimum, the elastic force provided by the spring 935 may be a maximum. When the height of the head 936 is a minimum, the height of the top case 950 may be a minimum.

The pusher 930 may provide an elastic force to the link bracket 951, while being in contact with the link bracket 951. Due to this, the load applied to the motor assembly 810 to stand up the link 910 may be reduced.

Figure 39:
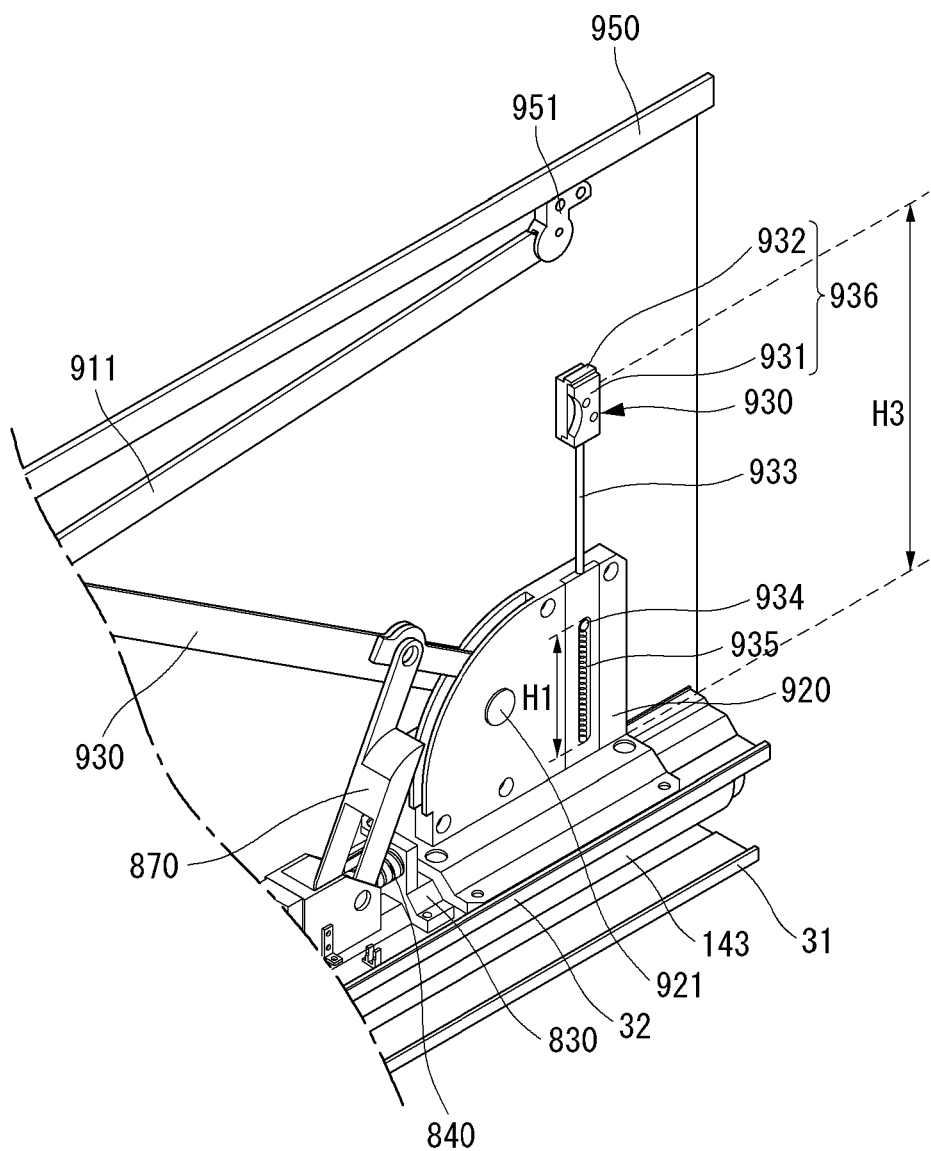

Referring to FIG. 39, when the link 910 sufficiently stands up, the pusher 930 may be separated from the link bracket 951. When the pusher 930 is separated from the link bracket 951, the height of the head 936 from the second base 32 may be a maximum. The maximum height of the head 936 may be referred to as H3. When the height of the head 936 is maximum, the fourth part 934 may be caught by the upper end of the hole 924 (refer to FIG. 38). When the height of the head 936 is maximum, the spring 935 can be tensioned to the maximum. When the height of the head 936 is the maximum, the elastic force provided by the spring 935 may be the minimum. The maximum height H3 of the head 936 may be substantially equal to the sum of the minimum height H2 of the head 936 and the length H1 of the hole.

Figure 40:
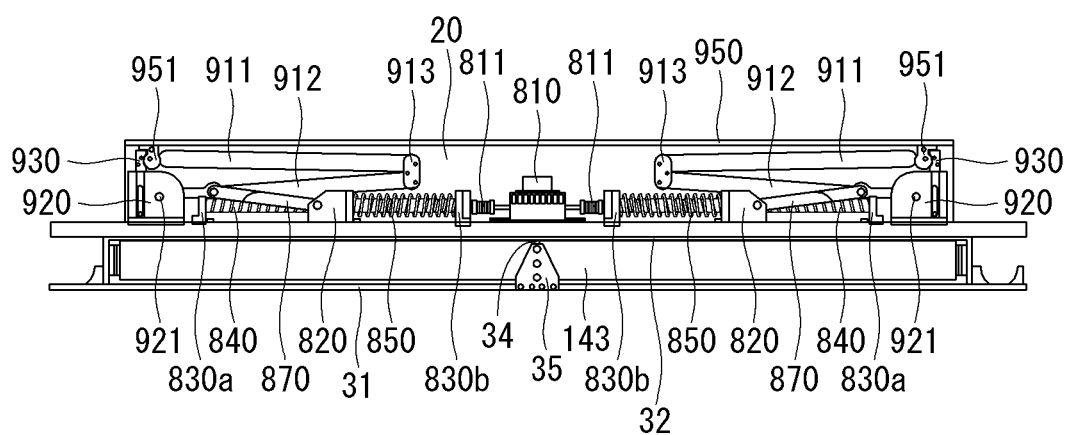

Referring to FIG. 40, the display unit 20 may be maximally wound around the roller 143. The display device 100 may be symmetrical with respect to the motor assembly 810. The height of the top case 950 may be a minimum. The slide 820 may be located in a position closest to the inner bearing 830b. The slide 820 may be caught by the first stopper 861b. The spring 850 may be in a maximally compressed state. The pusher 930 may contact the link bracket 951. The height of the pusher 930 may be a minimum.

Figure 41:
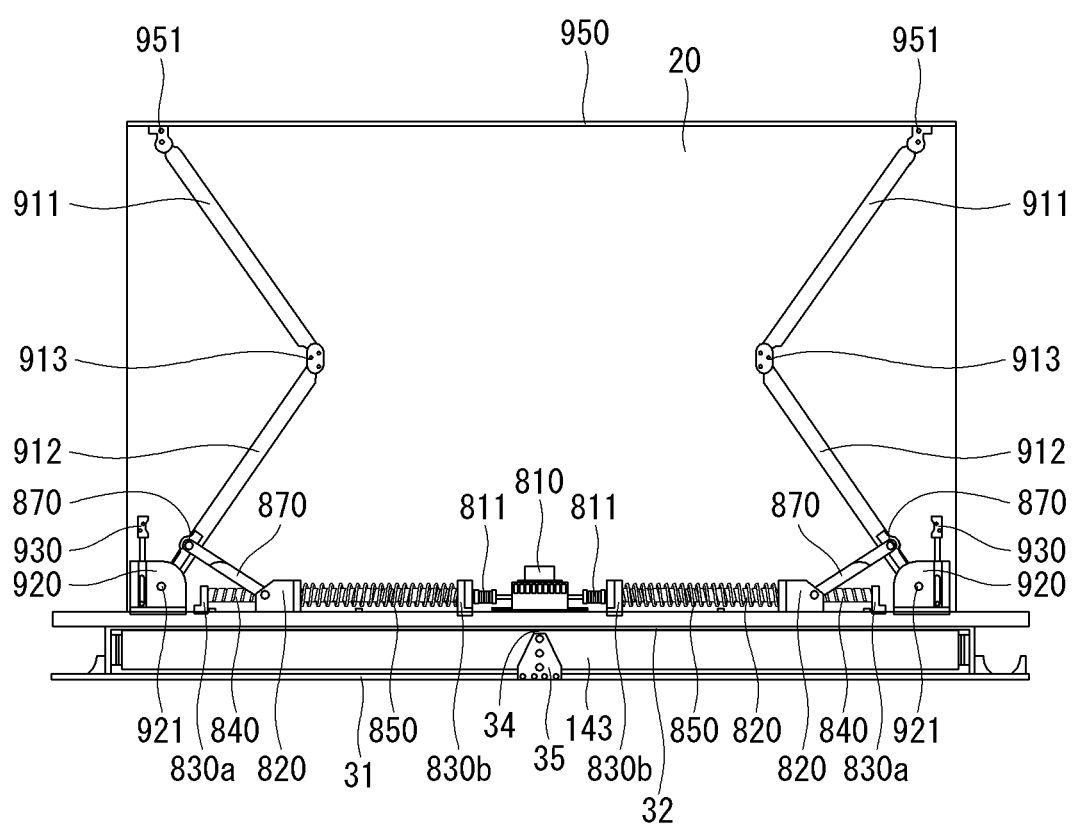

Referring to FIG. 41, about half of the display unit 20 may be wound around the roller 143. The display device 100 may be symmetrical with respect to the motor assembly 810. About half of the display unit 20 may be unwound from the roller 143. The slide 820 may be located between the first stopper 861b and the second stopper 861a. The pusher 930 may be separated from the link bracket 951. The height of the pusher 930 may be a maximum.

Figure 42:
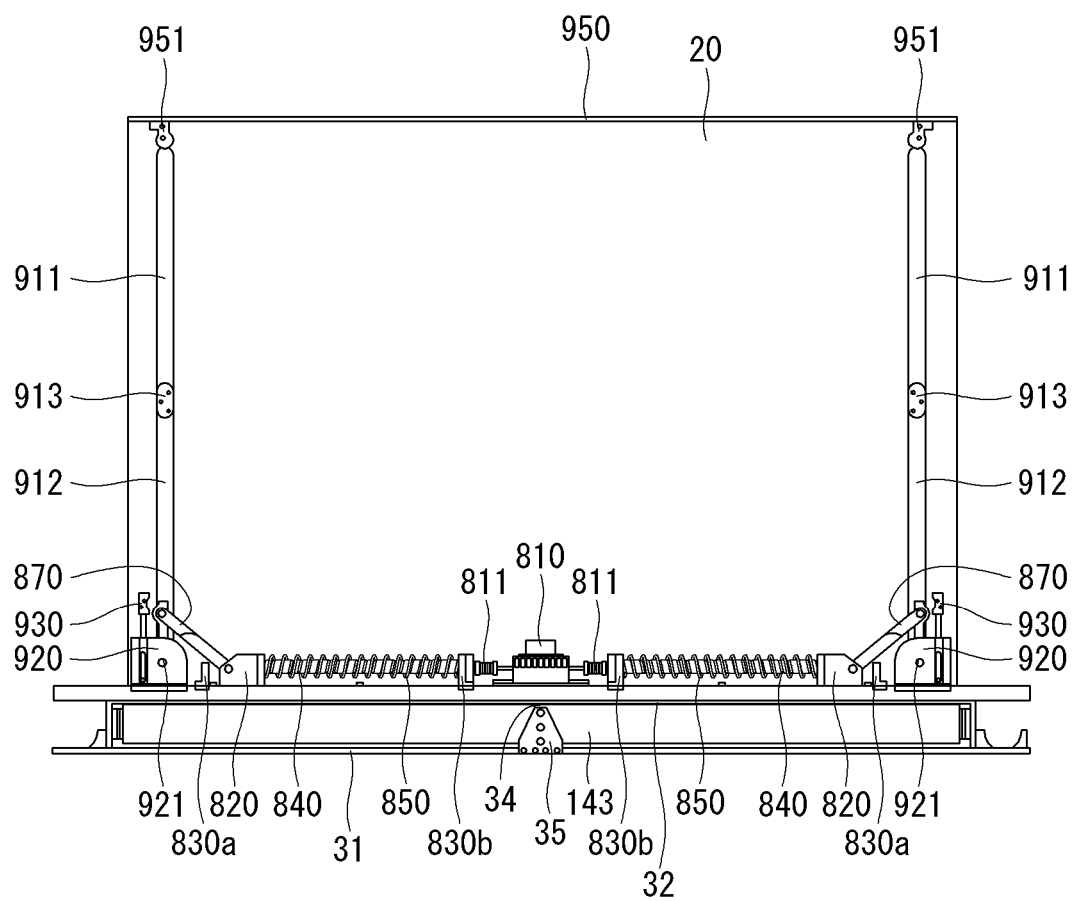
Figure 43:
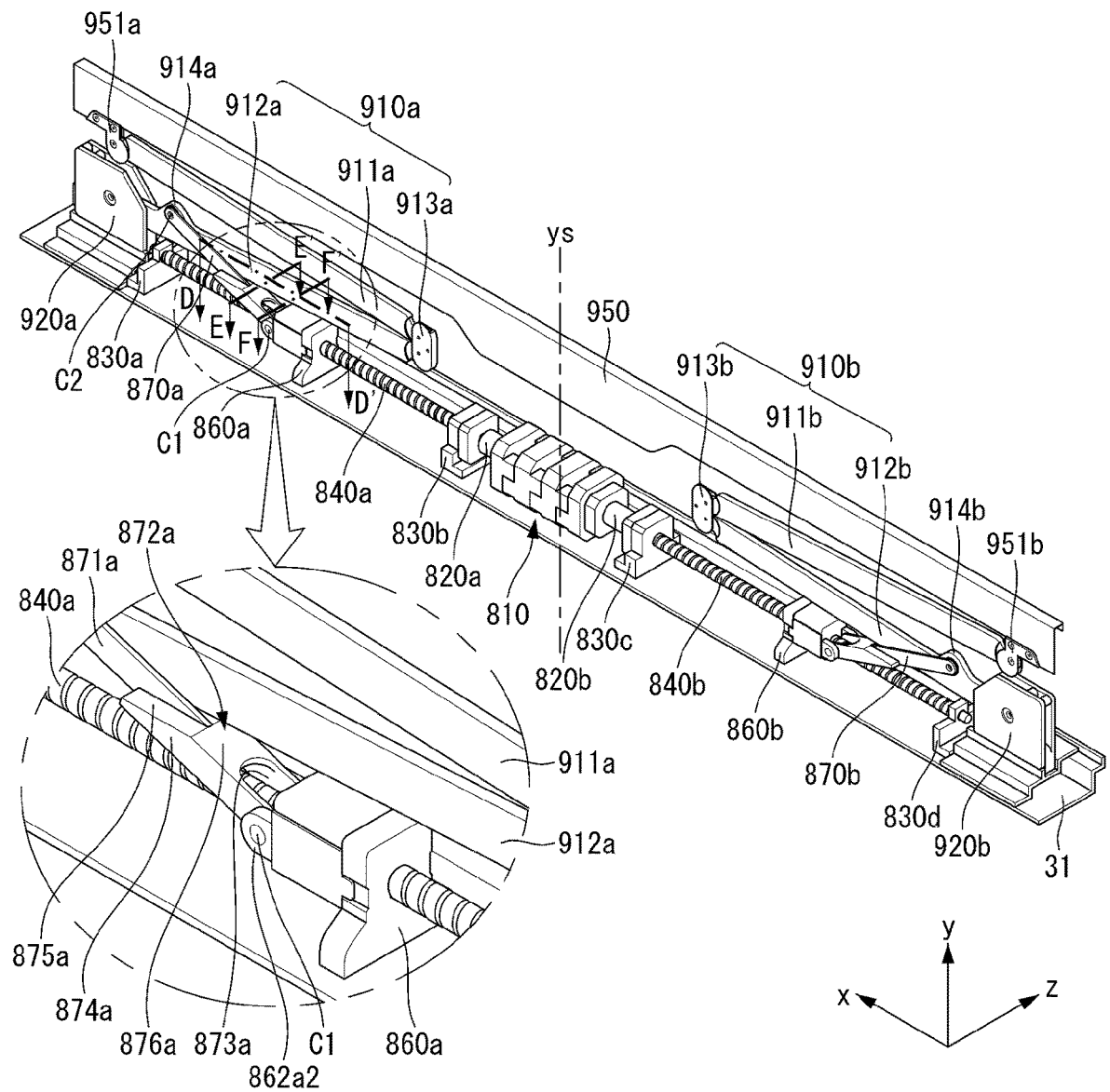
Figure 44:
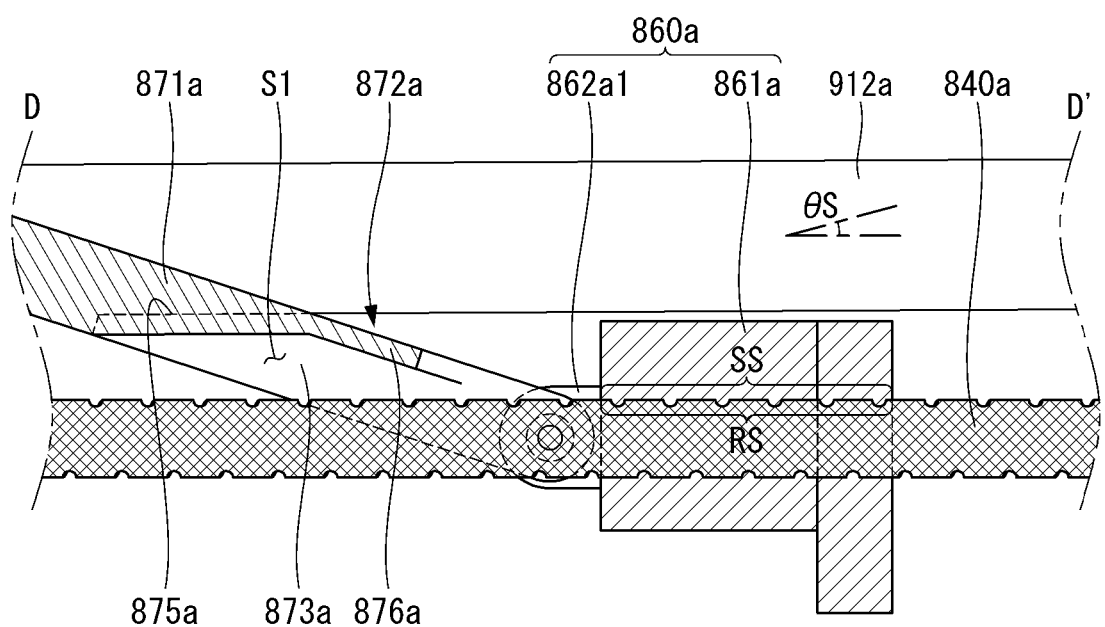
Figure 45:
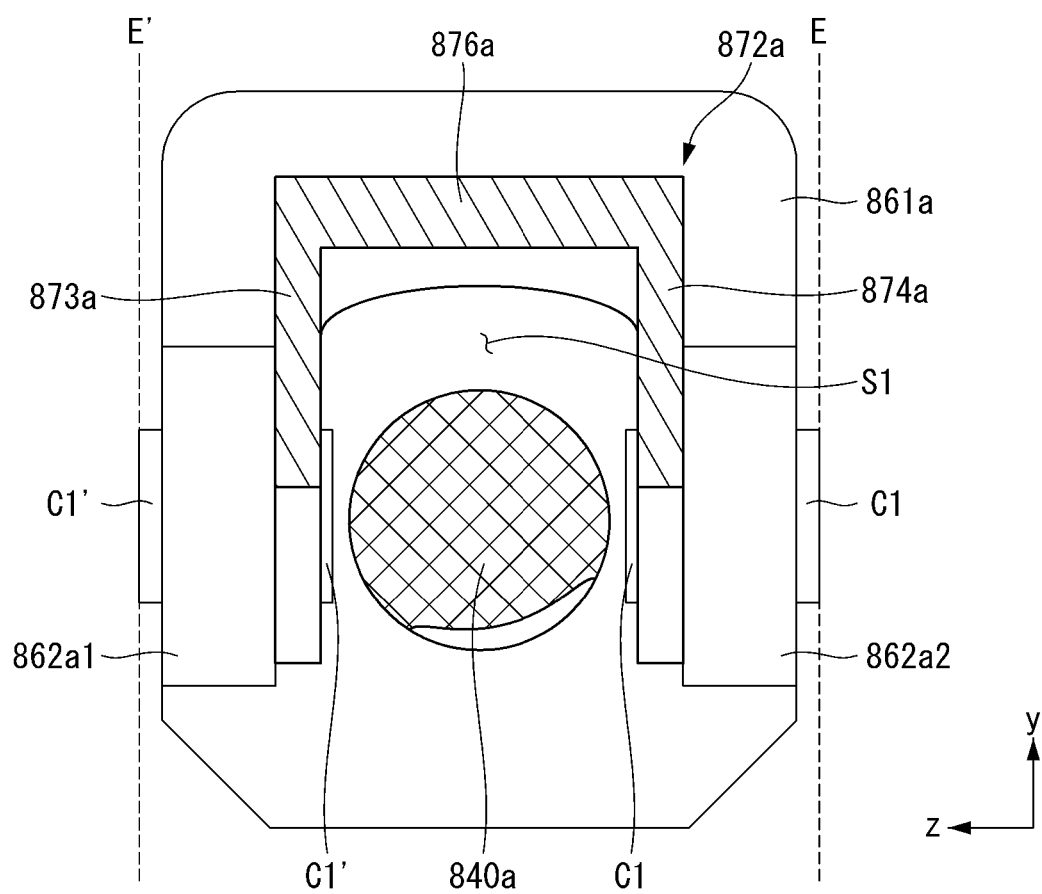
Figure 46:
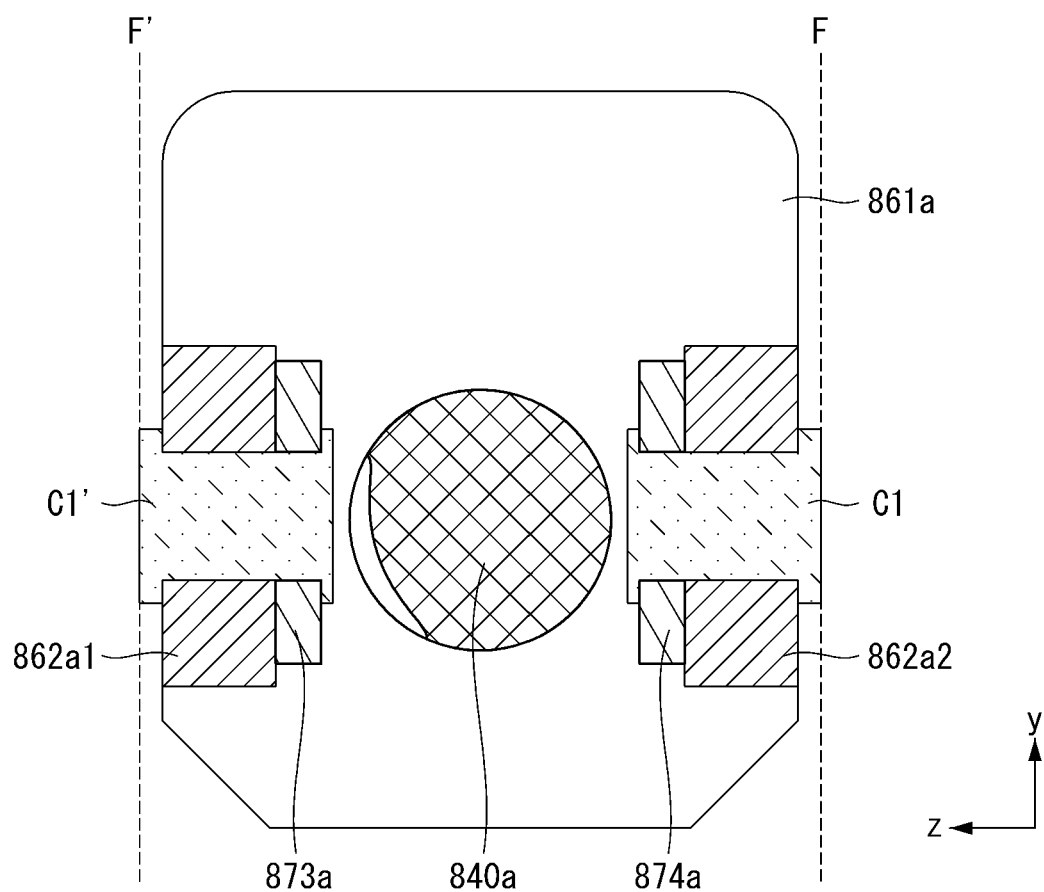

Referring to FIG. 42, the display unit 20 may be in a state of being maximally unwound from the roller 143. The display device 100 may be symmetrical with respect to the motor assembly 810. The height of the top case 950 may be a maximum. The slide 820 may be located in a position closest to the outer bearing 830a. The slide 820 may be caught by the second stopper 861a. The spring 850 may be in a maximum tension state. The pusher 930 may be separated from the link bracket 951. The height of the pusher 930 may be a maximum.

Referring to FIGS. 43 to 46, a link mount 920a, 920b may be installed in the base 31. The link mount 920a, 920b may include a right link mount 920a spaced apart to the right from a first right bearing 830a and a left link mount 920b spaced apart to the left from a second left bearing 830d.

A link 910a, 910b may be connected to link mount 920a, 920b. The link 910a, 910b may include a right link 910a connected to the right link mount 920a and a left link 910b connected to the left link mount 920b.

The right link 910a may be referred to as a first link. The left link 910b may be referred to as a second link. The right link mount 920a may be referred to as a first link mount 920a. The left link mount 920b may be referred to as a second link mount 920b.

The link 910a, 910b may include a first arm 911a, 911b, a second arm 912a, 912b, and an arm joint 913a, 913b. One side of the second arm 912a, 912b may be rotatably connected to the link mount 920a, 920b. The other side of the second arm 912a, 912b may be rotatably connected to the arm joint 913a, 913b. One side of the first arm 911a, 911b may be rotatably connected to the arm joint 913a, 913b. The other side of the first arm 911a, 911b may be rotatably connected to a link bracket 951a, 951b.

The link bracket 951a, 951b may include a right link bracket 951a connected to the first arm 911a of the right link 910a and a left link bracket 951b connected to the first arm 911b of the left link 910b. The link bracket 951a, 951b may be connected to the upper bar 950.

The upper bar 950 may connect the right link bracket 951a and the left link bracket 951b.

The rod 870a, 870b may connect a slider 860a, 860b and the link 910a, 910b. One side of the rod 870a, 870b may be rotatably connected to the slider 860a, 860b. The other side of the rod 870a, 870b may be rotatably connected to the second arm 912a, 912b. The rod 870a, 870b may include a right rod 870a connecting a right slider 860a and the second arm 912a of the right link 910a, and a left rod 870b connecting a left slider 860b and the second arm 912b of the left link 910b. The right rod 870a may be referred to as a first rod 870a. The left rod 870b may be referred to as a second rod 870b.

Specifically, a structure formed by a right lead screw 840a, the right slider 860a, the right rod 870a, and the right link 910a will be described. The right slider 860a may include a body 861a and a rod mount 862a. The body 861a may have a thread SS formed on an inner circumferential surface. The thread formed in the body 861a may be engaged with a thread RS of the right lead screw 840a. The right lead screw 840a may penetrate the body 861a.

The rod mount 862a may be formed in the right side of the body 861a. The rod mount 862a may be rotatably connected to one side of the right rod 870a. The rod mount 862a may include a first rod mount 862a1 and a second rod mount 862a2. The first rod mount 862a1 may be disposed in a forward direction of the right lead screw 840a. The second rod mount 862a2 may be disposed in a rearward direction of the right lead screw 840a. The first rod mount 862a1 and the second rod mount 862a2 may be spaced apart from each other. The second rod mount 862a2 may be spaced apart from the first rod mount 862a1 in the −z-axis direction. The right lead screw 840a may be located between the first rod mount 862a1 and the second rod mount 862a2.

The rod mount 862a may be rotatably connected to one side of the rod 870a through a connecting member C1. The connecting member C1 may penetrate the rod mount 862a and the right rod 870a.

The right rod 870a may be rotatably connected to the second arm 912a through a connecting member C2. The connecting member C2 may penetrate the second arm 912a and the right rod 870a.

The right rod 870a may include a transmission portion 871a connected to the second arm 912a of the right link 910a and a cover 872a connected to the rod mount 862a of the right slider 860a. The transmission portion 871a may transmit a force that is generated when the right slider 860a moves forward and backward along the right lead screw 840a to the right link 910a.

The cover 872a may include a first plate 873a disposed in a forward direction of the right lead screw 840a. The first plate 873a may be disposed perpendicular to the base 31. Alternatively, the first plate 873a may face the right lead screw 840a.

The cover 872a may include a second plate 874a disposed in the rearward direction of the right lead screw 840a. The second plate 874a may be disposed perpendicular to the base 31. Alternatively, the second plate 874a may face the right lead screw 840a. Alternatively, the second plate 874a may be spaced apart from the first plate 873a. The right lead screw 840a may be located between the first plate 873a and the second plate 874a.

The cover 872a may include a third plate 875a connecting the first plate 873a and the second plate 874a. The third plate 875a may be connected to the transmission portion. The third plate 875a may be located in the upper side of the right lead screw 840a.

The cover 872a may include a fourth plate 876a connecting the first plate 873a and the second plate 874a. The fourth plate 876a may be connected to the third plate 875a. The fourth plate 876a may be located in the upper side of the right lead screw 840a.

One side of the first plate 873a may be connected to the first rod mount 862a1. The first plate 873a and the first rod mount 862a1 may be connected through a connection member Cr. The other side of the first plate 873a may be connected to the third plate 875a.

One side of the second plate 874a may be connected to the second rod mount 862a2. The second plate 874a and the second rod mount 862a2 may be connected to each other through a connecting member C1. The other side of the second plate 874a may be connected to the third plate 875a.

When the right slider 860a moves closer to the motor assembly 810, the right lead screw 840a and the right rod 870a may come into contact with each other. When the right lead screw 840a and the right rod 870a come into contact, mutual interference may occur and movement of the right slider 860a may be restricted.

The cover 872a may provide a space S1 therein. The first plate 873a, the second plate 874a, the third plate 875a, and the fourth plate 876a may form a space S1. When the right slider 860a moves closer to the motor assembly 810, the right lead screw 840a may be received or escaped into the space S1 provided by the cover 872a. Due to the space S1 provided by the cover 872a, the right slider 860a may move closer to the motor assembly 810 than when the cover 872a does not exist. That is, the cover 872a provides a space S1 therein, thereby increasing the movable range of the right slider 860a. In addition, since the right lead screw 840a is received in the cover 872a, the size of the housing 30 (refer to FIG. 2) can be reduced.

In addition, the cover 872a may restrict the minimum value of the angle theta S between the second arm 912a and the base 31. When theta S is sufficiently small, the third plate 875a of the cover 872a may contact the second arm 912a, and support the second arm 912a. The third plate 875a supports the second arm 912a, thereby restricting the minimum value of theta S and preventing the second arm 912a from sagging. That is, the cover 872a may serve as a stopper to prevent the second arm 912a from sagging. In addition, the third plate 875a restricts the minimum value of theta S, thereby reducing the initial load for standing up the second arm 912a.

The lead screw 840a, 840b may be driven by one motor assembly 810. The lead screw 840a, 840b may be driven by one motor assembly 810, so that the second arm 912a, 912b can stand symmetrically. However, when the lead screw 840a, 840b is driven by one motor assembly 810, the load applied to the motor assembly 810 in order to stand up the second arm 912a, 912b may become excessively large. In this case, the third plate 875a restricts the minimum value of theta S, thereby reducing the load applied to the motor assembly 810 in order to stand up the second arm 912a, 912b.

The structure formed by the left lead screw 840b, the left slider 860b, the left rod 870b, and the left link 910b may be symmetrical with the structure formed by the above-described right lead screw 840a, right slider 860a, right rod 870a, and right link 910a. In this case, the symmetry axis may be a symmetry axis ys of the motor assembly 810.

Figure 47:
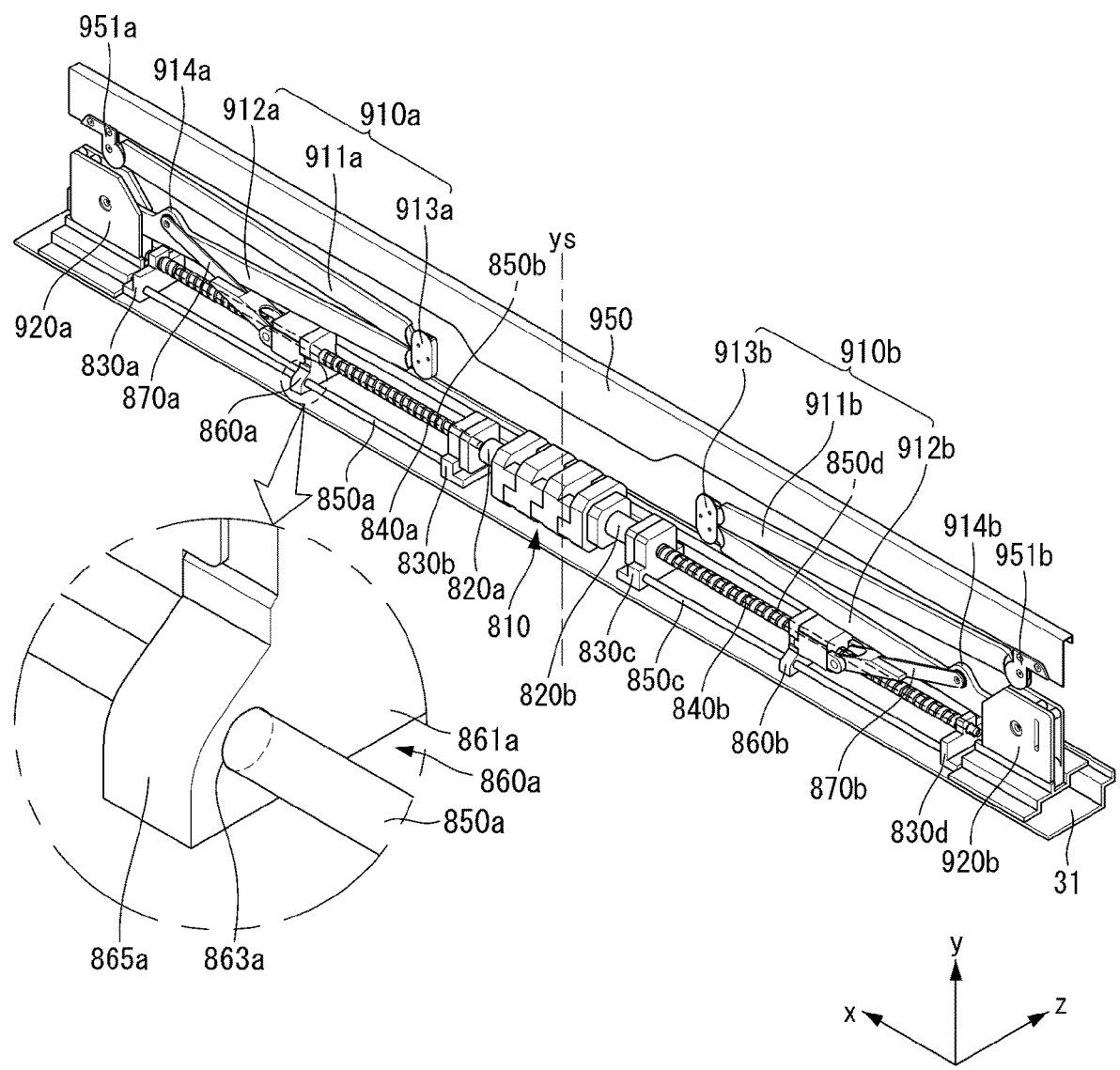

Referring to FIG. 47, a guide 850a, 850b, 850c, and 850d may be connected to the bearing 830a, 830b, 830c, and 830d. The guide 850a, 850b, 850c, and 850d may include a right guide 850a, 850b disposed in the right side of the motor assembly 810 and a left guide 850c, 850d disposed in the left side of the motor assembly 810.

One side of the right guide 850a, 850b may be connected to the first right bearing 830a and the other side may be connected to the second right bearing 830b. The right guide 850a, 850b may be located parallel to the right lead screw 840a. Alternatively, the right guide 850a, 850b may be spaced apart from the right lead screw 840a.

The right guide 850a, 850b may include a first right guide 850a and a second right guide 850b. The first right guide 850a and the second right guide 850b may be spaced apart from each other. The right lead screw 840a may be located between the first right guide 850a and the second right guide 850b.

The right slider 860a may include a protrusion. Alternatively, the display device may include a protrusion formed in the right slider 860a. The protrusion may be formed in the body of the slider. The protrusion may include a front protrusion (not shown) protruding from the body 861a of the right slider 860a in the +z-axis direction and a rear protrusion 865a protruding from the body of the slider in the −z-axis direction.

The first right guide 850a may penetrate the rear protrusion 865a. Alternatively, a first hole 863a formed in the rear protrusion may be included, and the first right guide 850a may penetrate the first hole 863a. The first hole 863a may be formed in the x-axis direction. The first hole 863a may be referred to as a hole 863a.

The second right guide (not shown) may penetrate the front protrusion (not shown). Alternatively, a second hole (not shown) formed in the front protrusion may be included, and the second right guide may penetrate the second hole. The second hole may be formed in the x-axis direction.

The right guide 850a, 850b may guide the right slider 860a to move more stably, when the right slider 860a moves forward and backward along the right lead screw 840a. Since the right guide 850a, 850b stably guides the right slider 860a, the right slider 860a may move forward and backward along the right lead screw 840a without rotating with respect to the right lead screw 840a.

The structure formed by the left guide 850c, 850d, the left bearing 830a, 830b, 830c, and 830d, the left slider 860b, and the left lead screw 840b may be symmetrical with the structure formed by the above-described right guide 850a, 850b, right bearing 830a, 830b, 830c, and 830d, right slider 860a, and right lead screw 840a. In this case, the symmetry axis may be a symmetry axis ys of the motor assembly 810.

Figure 48:
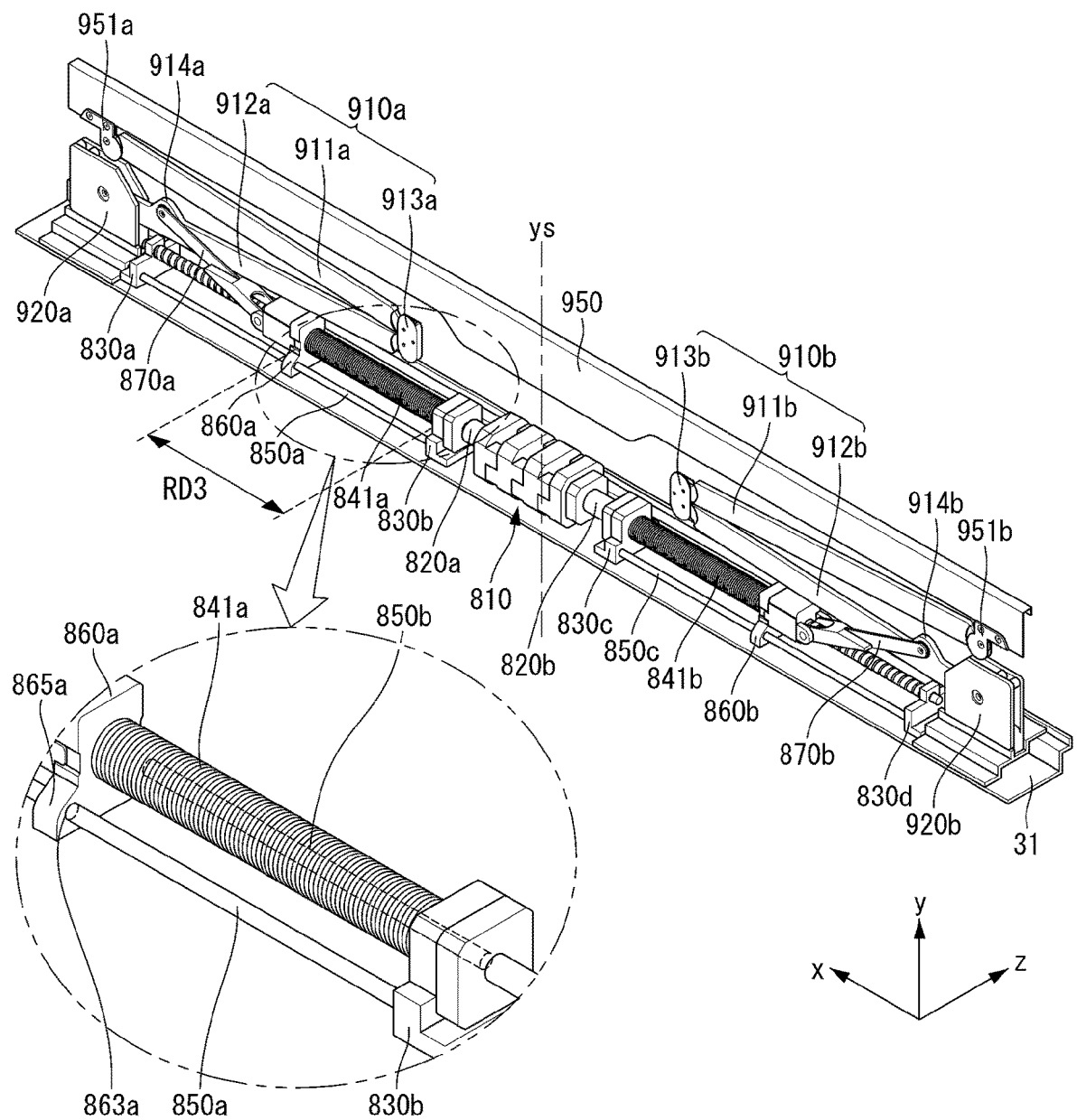

Referring to FIG. 48, a first spring 841a, 841b may be inserted into the lead screw 840a, 840b. Alternatively, the lead screw 840a, 840b may penetrate the first spring 841a, 841b. The first spring 841a, 841b may include a first right spring 841a disposed in the right side of the motor assembly 810 and a first left side spring 841b disposed in the left side of the motor assembly 810.

The first right spring 841a may be disposed between the right slider 860a and the second right bearing 830b. One end of the first right spring 841a may be in contact with or separated from the right slider 860a. The other end of the first right spring 841a may be in contact with or separated from the second right bearing 830b.

When the second arm 912a is completely lying with respect to the base 31, a distance between the right slider 860a and the second right bearing 830b may be a distance RD3. The first right spring 841a may have a length larger than the distance RD3 in a state of not being compressed or tensioned. Accordingly, when the second arm 912a is completely lying with respect to the base 31, the first right spring 841a may be compressed between the right slider 860a and the second right bearing 830b. In addition, the first right spring 841a may provide a restoring force to the right slider 860a in the +x-axis direction.

When the second arm 912a changes from a completely lying state to a standing state with respect to the base 31, the restoring force provided by the first right spring 841a may assist the second arm 912a to stand up. As the first right spring 841a assists the second arm 912a to stand up, the load on the motor assembly 810 may be reduced.

The lead screw 840a, 840b may be driven by one motor assembly 810. As the lead screw 840a, 840b is driven by one motor assembly 810, the second arm 912a, 912b can stand symmetrically. However, when the lead screw 840a, 840b is driven by one motor assembly 810, the load applied to the motor assembly 810 in order to stand up the second arm 912a, 912b may become excessively large. At this time, as the first right spring 841a assists the second arm 912a to stand up, the load on the motor assembly 810 may be reduced, and the load on the motor assembly 810 to stand up the second arm 912a may be reduced.

Alternatively, when the second arm 912a is changed from a standing state with respect to the base 31 to a completely lying state, the restoring force provided by the first right spring 841a may alleviate an impact generated when the second arm 912a lies with respect to the base 31. That is, the first right spring 841a may serve as a damper when the second arm 912a lies with respect to the base 31. As the first right spring 841a serves as a damper, a load on the motor assembly 810 may be reduced.

The structure formed by the first left spring 841b, the left bearing 830a, 830b, 830c, and 830d, the left slider 860b, the left lead screw 840b, and the second arm 912a may be symmetrical with the structure formed by the above-described first right spring 841a, right bearing 830a, 830b, 830c, and 830d, right slider 860a, right lead screw 840a, and second arm 912a. In this case, the symmetry axis may be a symmetry axis ys of the motor assembly 810.

Figure 49:
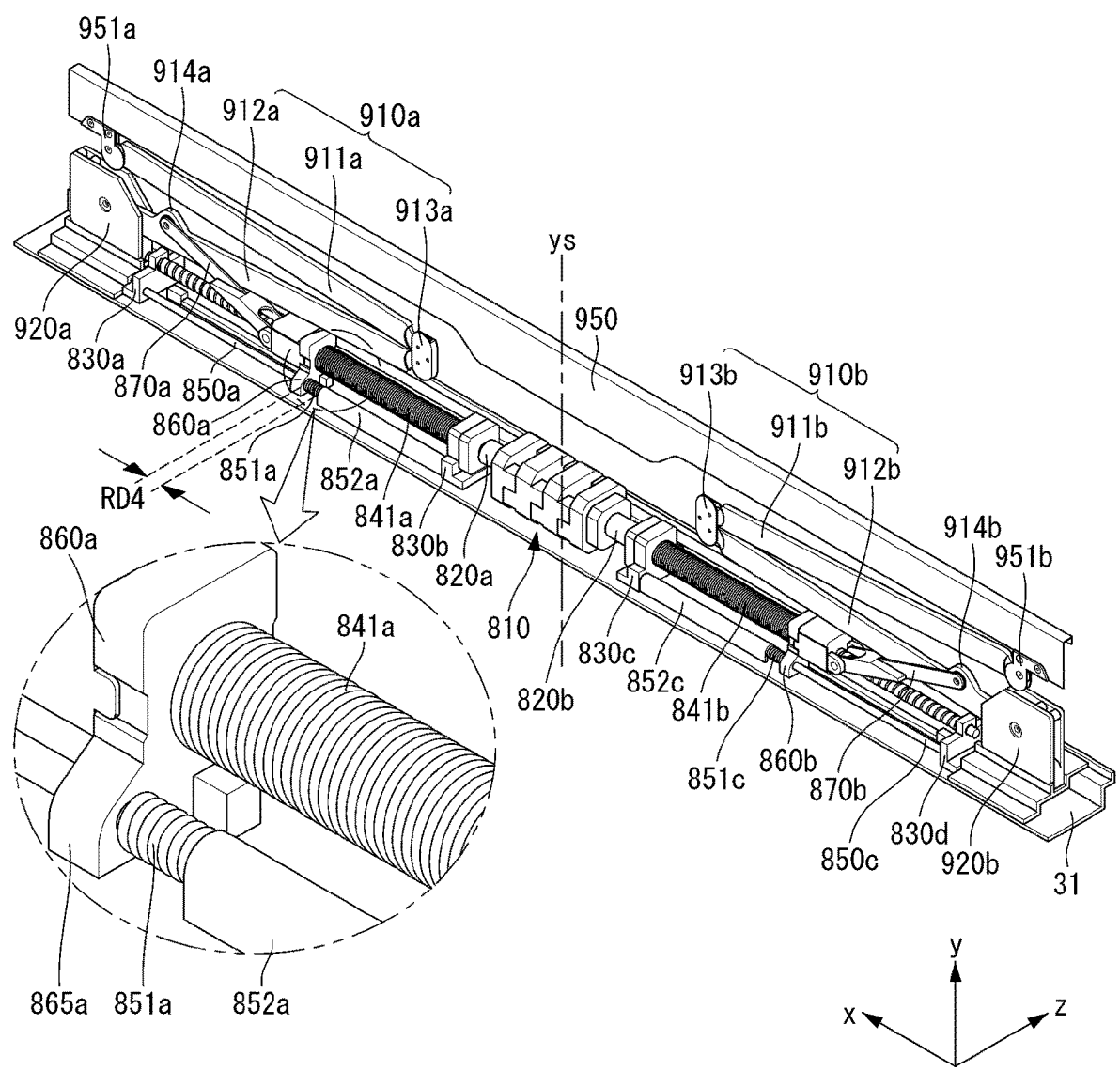

Referring to FIG. 49, a second spring 851a, 851b may be inserted into the guide 850a, 850b, 850c, and 850d. Alternatively, the guide 850a, 850b, 850c, and 850d may penetrate the second spring 851a, 851b. The second spring 851a, 851b may include a second right spring 851a disposed in the right side of the motor assembly 810 and a second left side spring 851b disposed in the left side of the motor assembly 810.

The second right spring 851a may be formed in plurality. The second right spring 851a may include a spring 940a, 940b inserted into the first right guide 850a and a spring 940a, 940b inserted into the second right guide 850b. Alternatively, the second right spring 851a may include a spring 940a, 940b through which the first right guide 850a passes and a spring 940a, 940b through which the second right guide 850b passes.

The guide 850a, 850b, 850c, and 850d may include a locking jaw 852a, 852b. The locking jaw 852a, 852b may include a right locking jaw 852a disposed in the right side of the motor assembly 810 and a left locking jaw 852b disposed in the left side of the motor assembly 810.

The right locking jaw 852a may be disposed between the right slider 860a and the second right bearing 830b. In addition, the second right spring 851a may be disposed between the right slider 860a and the second right bearing 830b. One end of the second right spring 851a may be in contact with or separated from the right slider 860a. The other end of the second right spring 851a may be in contact with or separated from the right locking jaw 852a.

When the second arm 912a is completely lying with respect to the base 31, the distance between the right slider 860a and the right locking jaw 852a may be a distance RD4. The second right spring 851a may have a length larger than distance RD4 in a state of being not compressed or tensioned. Accordingly, when the second arm 912a is completely lying with respect to the base 31, the second right spring 851a may be compressed between the right slider 860a and the right locking jaw 852a. In addition, the second right spring 851a may provide a restoring force to the right slider 860a in the +x-axis direction.

When the second arm 912a changes from a completely lying state to a standing state with respect to the base 31, the restoring force provided by the second right spring 851a may assist the second arm 912a to stand up. As the second right spring 851a assists the second arm 912a to stand up, the load on the motor assembly 810 may be reduced.

The lead screw 840a, 840b may be driven by one motor assembly 810. As the lead screw 840a, 840b is driven by one motor assembly 810, the second arm 912a, 912b can stand symmetrically. However, when the lead screw 840a, 840b is driven by one motor assembly 810, the load applied to the motor assembly 810 in order to stand up the second arm 912a, 912b can become excessively large. At this time, as the second right spring 851a assists the second arm 912a to stand up, the load on the motor assembly 810 may be reduced, and the load applied to the motor assembly 810 to stand up the second arm 912a may be reduced.

Alternatively, when the second arm 912a changes from a standing state with respect to the base 31 to a completely lying state, the restoring force provided by the second right spring 851a may alleviate an impact generated when the second arm 912a lies with respect to the base 31. That is, the second right spring 851a may serve as a damper when the second arm 912a lies with respect to the base 31. As the second right spring 851a serves as a damper, the load on the motor assembly 810 may be reduced.

The structure formed by the second left spring 851b, the left locking jaw 852b, the left slider 860b, the left guide 850c, 850d, and the second arm 912a may be symmetrical with the structure formed by the above-described second right spring 851a, right locking jaw 852a, right slider 860a, right guide 850a, 850b, and second arm 912a. In this case, the symmetry axis may be the symmetry axis ys of the motor assembly 810.

Figure 50:
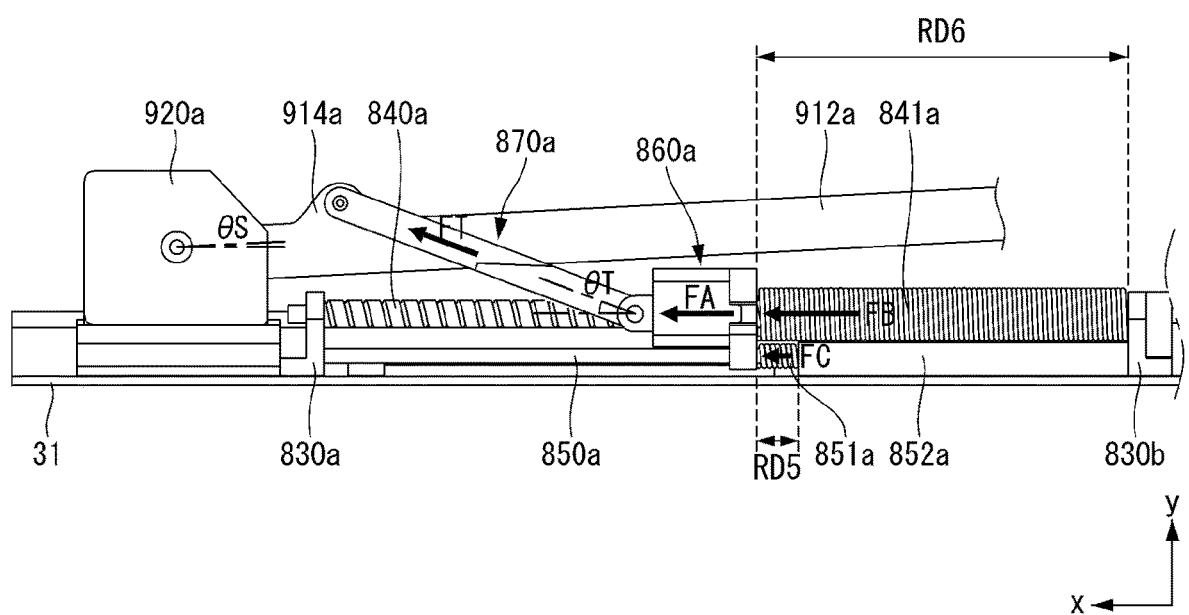
Figure 51:
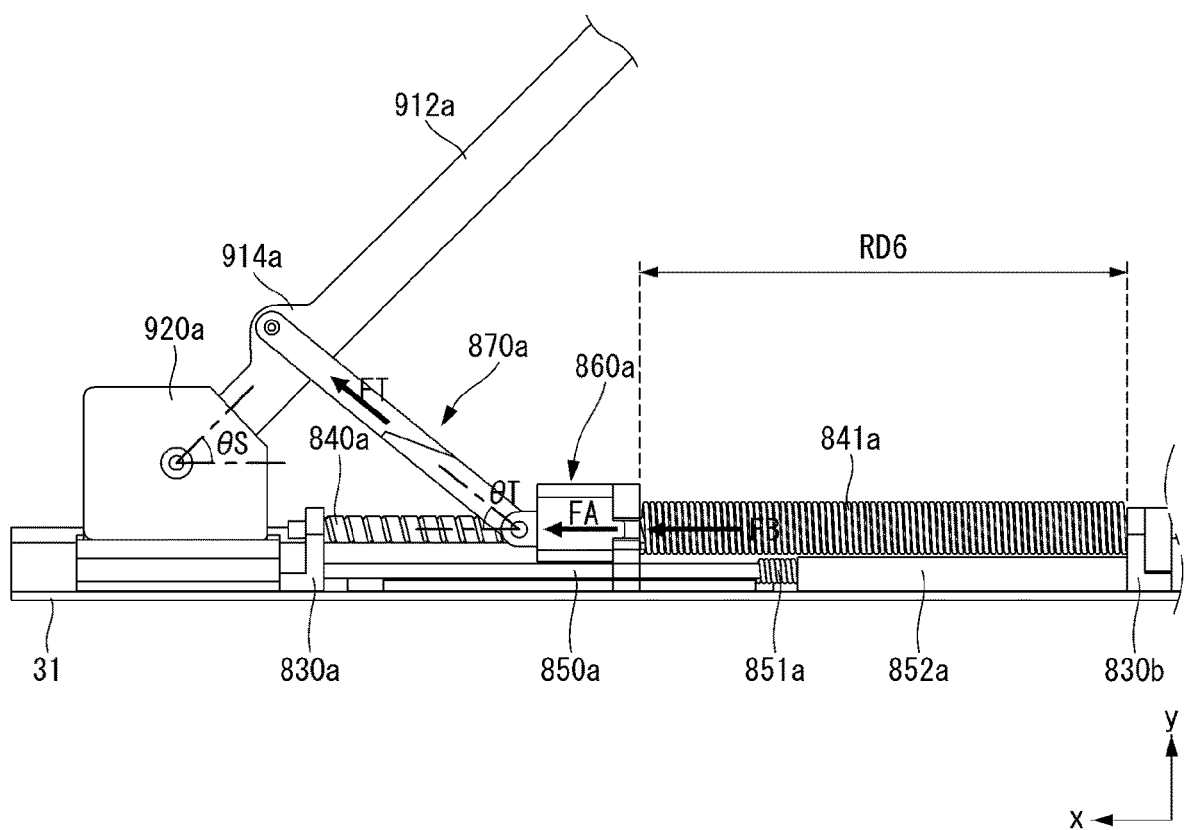
Figure 52:
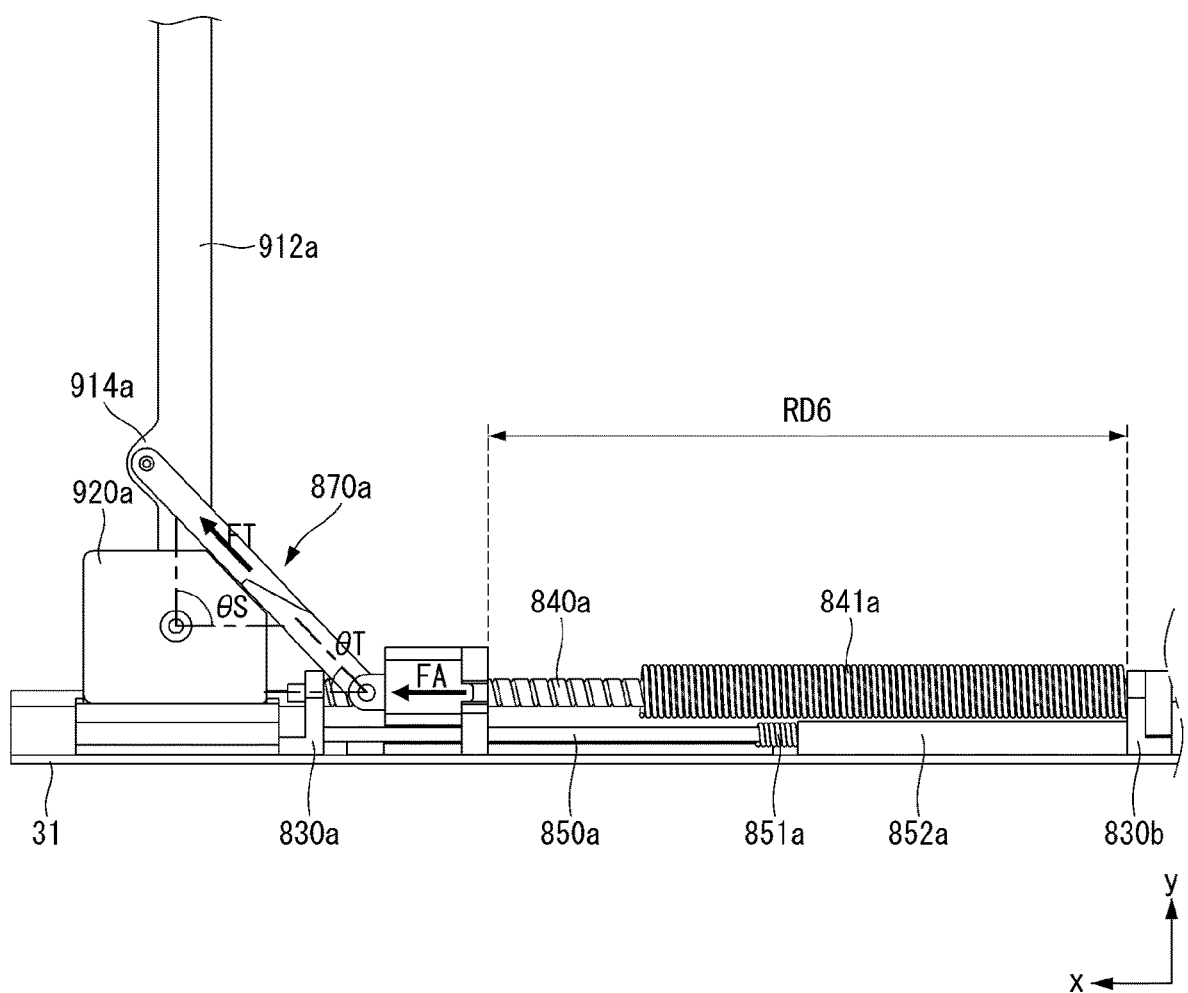

Referring to FIGS. 50 to 52, the second arm 912a may stand by receiving a restoring force from the first right spring 841a and the second right spring 851a.

An angle between the second arm 912a and the base 31 may be referred to as an angle theta S. An angle between the right rod 870a and the base 31 may be referred to as an angle theta T. A force by the motor assembly 810 to move the right slider 860a in the +x-axis direction may be referred to as FA. The force applied by the first right spring 841a to the right slider 860a may be referred to as FB. The force applied by the second right spring 851a to the right slider 860a may be referred to as FC. The force transmitted by the right rod 870a to the second arm 912a may be referred to as FT.

When the second arm 912a is completely lying with respect to the base 31, the angle theta S and the angle theta T may have a minimum value. When the second arm 912a is changed from a completely lying state to a standing state with respect to the second base 31, the angle theta S and the angle theta T may gradually increase.

When the second arm 912a is completely lying with respect to the base 31, the first right spring 841a may be compressed. The compressed first right spring 841a may provide a restoring force FB to the right slider 860a. The restoring force FB can act in the +x direction. When the second arm 912*a* is completely lying with respect to the base 31, the amount of compression displacement of the first right spring 841*a* may be a maximum, and the magnitude of the restoring force FB may have a maximum value. When the second arm 912*a* is changed from a completely lying state to a standing state with respect to the base 31, the amount of compression displacement of the first right spring 841*a* may gradually decrease, and the magnitude of the restoring force FB may gradually decrease.

When the second arm 912*a* is completely lying with respect to the base 31, the second right spring 851*a* may be compressed. The compressed second right spring 851*a* may provide a restoring force FC to the right slider 860*a*. The restoring force FC can act in the +x direction. When the second arm 912*a* is completely lying with respect to the base 31, the amount of compression displacement of the second right spring 851*a* may be a maximum, and the magnitude of the restoring force FC may have a maximum value. When the second arm 912*a* changes from a completely lying state to a standing state with respect to the base 31, the amount of compression displacement of the second right spring 851*a* may gradually decrease, and the magnitude of the restoring force FC may gradually decrease.

The force FT transmitted by the right rod 870*a* to the second arm 912*a* may be a resultant force of the force FA of the motor assembly 810 to move the right slider 860*a* in the +x axis, the restoring force FB of the first right spring 841*a*, and the restoring force FC of the second right spring 851*a*.

When the second arm 912*a* starts to stand in a state where the second arm 912*a* is completely lying with respect to the base 31, the load on the motor assembly 810 may be a maximum. At this time, the magnitude of the restoring force FB provided by the first right spring 841*a* may be a maximum. In addition, the magnitude of the restoring force FC provided by the second spring 851*a*, 851*b* may be a maximum.

When the second arm 912*a* changes from a completely lying state to a standing state with respect to the base 31, the restoring force provided by the first right spring 841*a* and the second right spring 851*a* may assist the second arm 912*a* to stand up. As the first right spring 841*a* and the second right spring 851*a* assist the second arm 912*a* to stand up, the load on the motor assembly 810 may be reduced.

The first right spring 841*a* and the second right spring 851*a* may simultaneously provide a restoring force (a resultant force of the restoring force FB and the restoring force FC) to the right slider 860*a*. The restoring force (a resultant force of the restoring force FB and the restoring force FC) may be provided to the right slider 860*a* until the distance RD5 between the right slider 860*a* and the right locking jaw 852*a* becomes equal to the length of the second right spring 851*a*.

When the distance RD5 between the right slider 860*a* and the right locking jaw 852*a* becomes equal to the length of the second right spring 851*a*, the amount of compression displacement of the second right spring 851*a* may be zero. When the amount of compression displacement of the second right spring 851*a* becomes 0, the restoring force FC provided by the second right spring 851*a* to the right slider 860*a* may become 0.

When the distance RD5 between the right slider 860*a* and the right locking jaw 852*a* is larger than the length of the second right spring 851*a*, only the first right spring 841*a* can provide the restoring force FB to the right slider 860*a*. The restoring force FB may be provided to the right slider 860*a*, until the distance RD6 between the right slider 860*a* and the second right bearing 830*b* becomes equal to the length of the first right spring 841*a*.

When the distance RD6 between the right slider 860*a* and the second right bearing 830*b* is equal to the length of the first right spring 841*a*, the amount of compression displacement of the first right spring 841*a* may be zero. When the amount of compression displacement of the first right spring 841*a* becomes zero, the restoring force FB provided by the first right spring 841*a* to the right slider 860*a* may be zero.

When the distance RD6 between the right slider 860*a* and the second right bearing 830*b* is larger than the length of the first right spring 841*a*, the motor assembly 810 may stand up the second arm 912*a* without receiving the restoring force from the first right spring 841*a* or the second right spring 851*a*.

The structure formed by the first left spring 841*b*, the second left spring 851*b*, the left locking jaw 852*b*, the left slider 860*b*, the left guide 850*c*, 850*d*, the left lead screw 840*b*, the left rod 870*b*, and the second arm 912*a* may be symmetrical with the structure formed by the above-described first right spring 841*a*, second right spring 851*a*, right locking jaw 852*a*, right slider 860*a*, right guide 850*a*, 850*b*, right lead screw 840*a*, right rod 870*a*, and second arm 912*a*. In this case, the symmetry axis may be the symmetry axis ys of the motor assembly 810.

Figure 53:
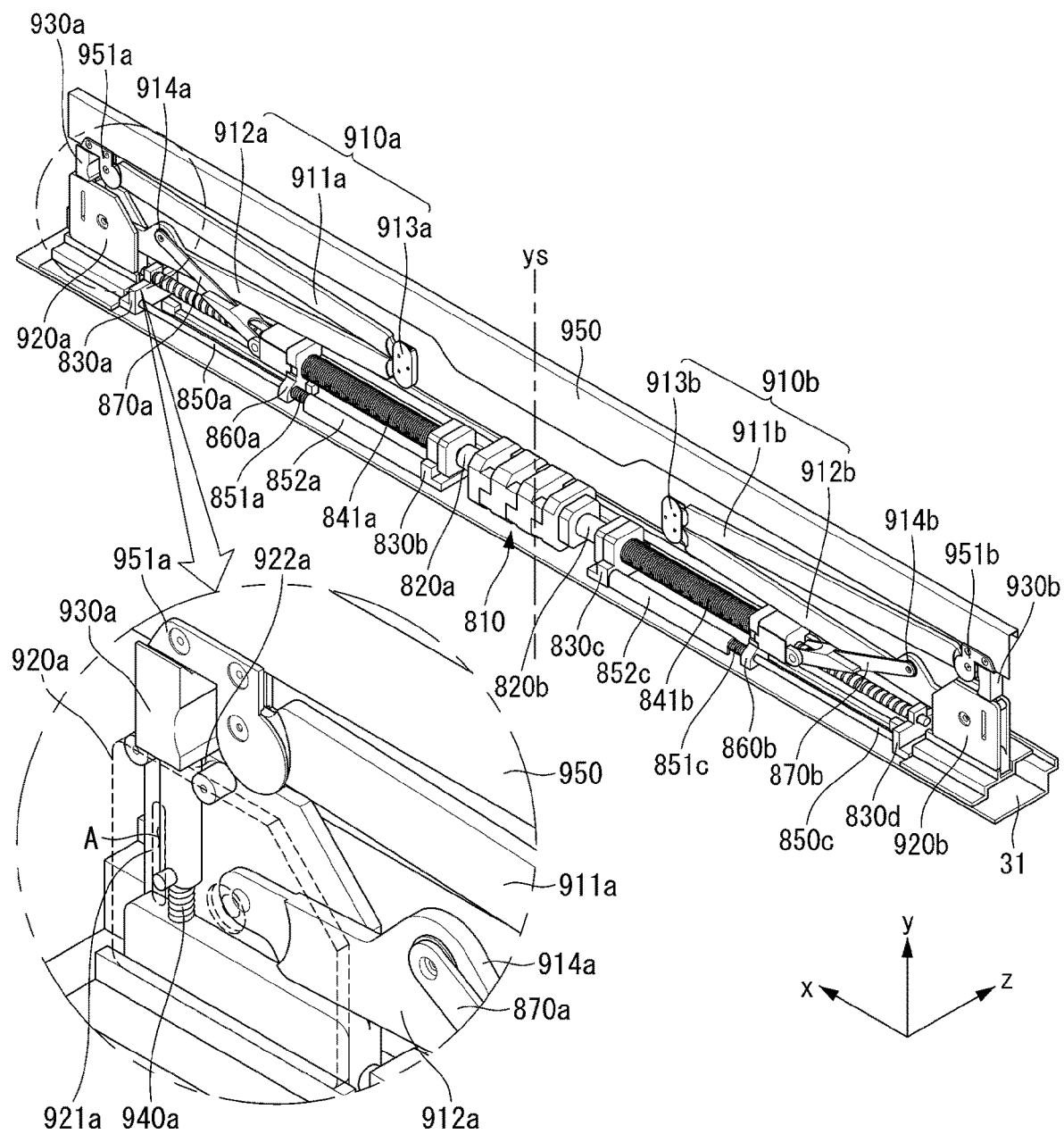

Referring to FIG. 53, a pusher 930*a*, 930*b* may be connected to the link mount 920*a*, 920*b*. The pusher 930*a*, 930*b* may include a right pusher 930*a* disposed in the right side of the motor assembly 810 and a left side pusher 930*b* disposed in the left side of the motor assembly 810.

The link mount 920*a*, 920*b* may form an accommodating space A. The accommodating space A may accommodate the spring 940*a*, 940*b* and the pusher 930*a*, 930*b*. The spring 940*a*, 940*b* may include a right spring 940*a* disposed in the right side of the motor assembly 810 and a left side spring 940*b* disposed in the left side of the motor assembly 810. The accommodating space A may be referred to as an internal space A.

The link mount 920*a*, 920*b* may include a first hole 922*a* connecting the accommodating space A and an external space (the first hole corresponding to 920*b* is not shown). The first hole 922*a* may be formed in the upper surface of the link mount 920*a*, 920*b*. The first hole 922*a* may be referred to as a hole 922*a*.

The pusher 930*a*, 930*b* may be located perpendicular to the base 31. Alternatively, the pusher 930*a*, 930*b* may be disposed parallel to the y-axis. The spring 940*a*, 940*b* may be located perpendicular to the base 31. Alternatively, the spring 940*a*, 940*b* may be disposed parallel to the y-axis.

The pusher 930*a*, 930*b* may include a first part 931*a*, 931*b* and a second part 932*a*, 932*b*. The second part 932*a*, 932*b* may be connected to the lower sides of the first part 931*a*, 931*b*. The lower end of the second part 932*a*, 932*b* may be connected to the spring 940*a*, 940*b*. All or part of the second part 932*a*, 932*b* may be received in the accommodating space A formed by the link mount 920*a*, 920*b*. The second part 932*a*, 932*b* may have a diameter equal to or smaller than a diameter of the first hole 922*a*. The second part 932*a*, 932*b* may penetrate the first hole 922*a*.

The first part 931*a*, 931*b* may be located outside the link mount 920*a*, 920*b*. Alternatively, the first part 931*a*, 931*b* may be located outside the accommodating space A of the link mount 920*a*, 920*b*. The first part 931*a*, 931*b* may have a larger diameter than that of the first hole 922*a*.

The first part 931*a*, 931*b* may be in contact with or spaced apart from the link bracket 951*a*, 951*b*. For example, when the second arm 912a, 912b is completely lying with respect to the base 31, the first part 931a, 931b may contact the link bracket 951a, 951b. Alternatively, when the second arm 912a, 912b completely stand up with respect to the base 31, the first part 931a, 931b may be spaced apart from the link bracket 951a, 951b.

When the first part 931a, 931b contacts the link bracket 951a, 951b, the pusher 930a, 930b may receive a force from the link bracket 951a, 951b. The force received by the pusher 930a, 930b may be in a downward direction. Alternatively, the force received by the pusher 930a, 930b may be in the −y-axis direction. Alternatively, the link bracket 951a, 951b may press the pusher 930a, 930b. The direction in which the link bracket 951a, 951b presses the pusher 930a, 930b may be a downward direction. Alternatively, the direction in which the link bracket 951a, 951b presses the pusher 930a, 930b may be the −y-axis direction.

When the first part 931a, 931b receives a force, the spring 940a, 940b may be compressed. The compressed spring 940a, 940b may provide a restoring force to the pusher 930a, 930b. The restoring force may be in a direction opposite to the direction of the force applied to the first part 931a, 931b. Alternatively, the restoring force may act in the +y-axis direction.

The link mount 920a, 920b may include a second hole 921a (the second hole corresponding to 920b is not shown). The second hole 921a may connect the accommodating space A and an external space. All or part of the spring 940a, 940b may be exposed to the outside through the second hole 921a. All or part of the pusher 930a, 930b may be exposed to the outside through the second hole 921a. When the display device is maintained or repaired, a service provider may check the operating state of the pusher 930a, 930b through the second hole 921a. The second hole 921a may provide the convenience of maintenance or repair to the service provider.

Figure 54:
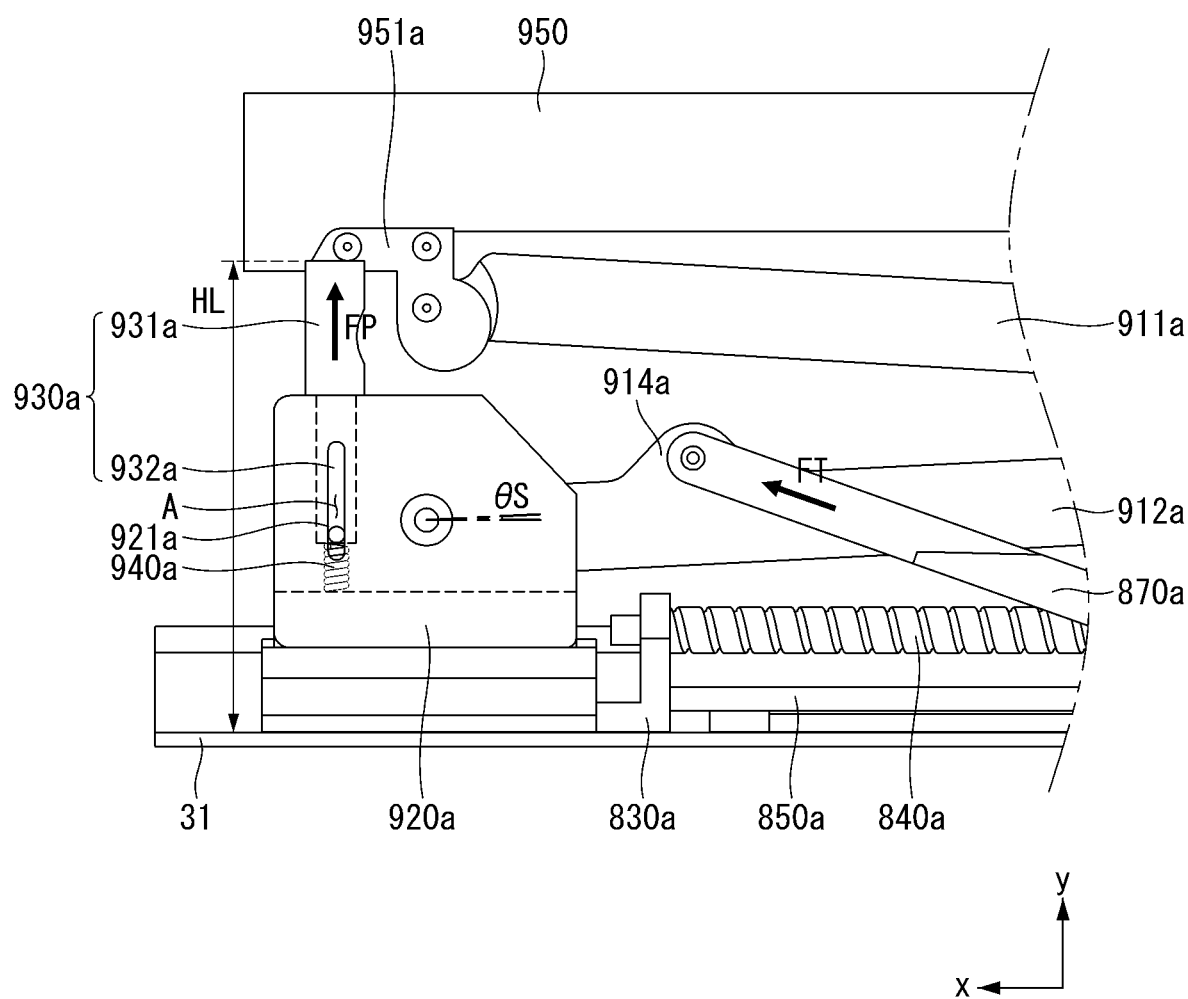
Figure 55:
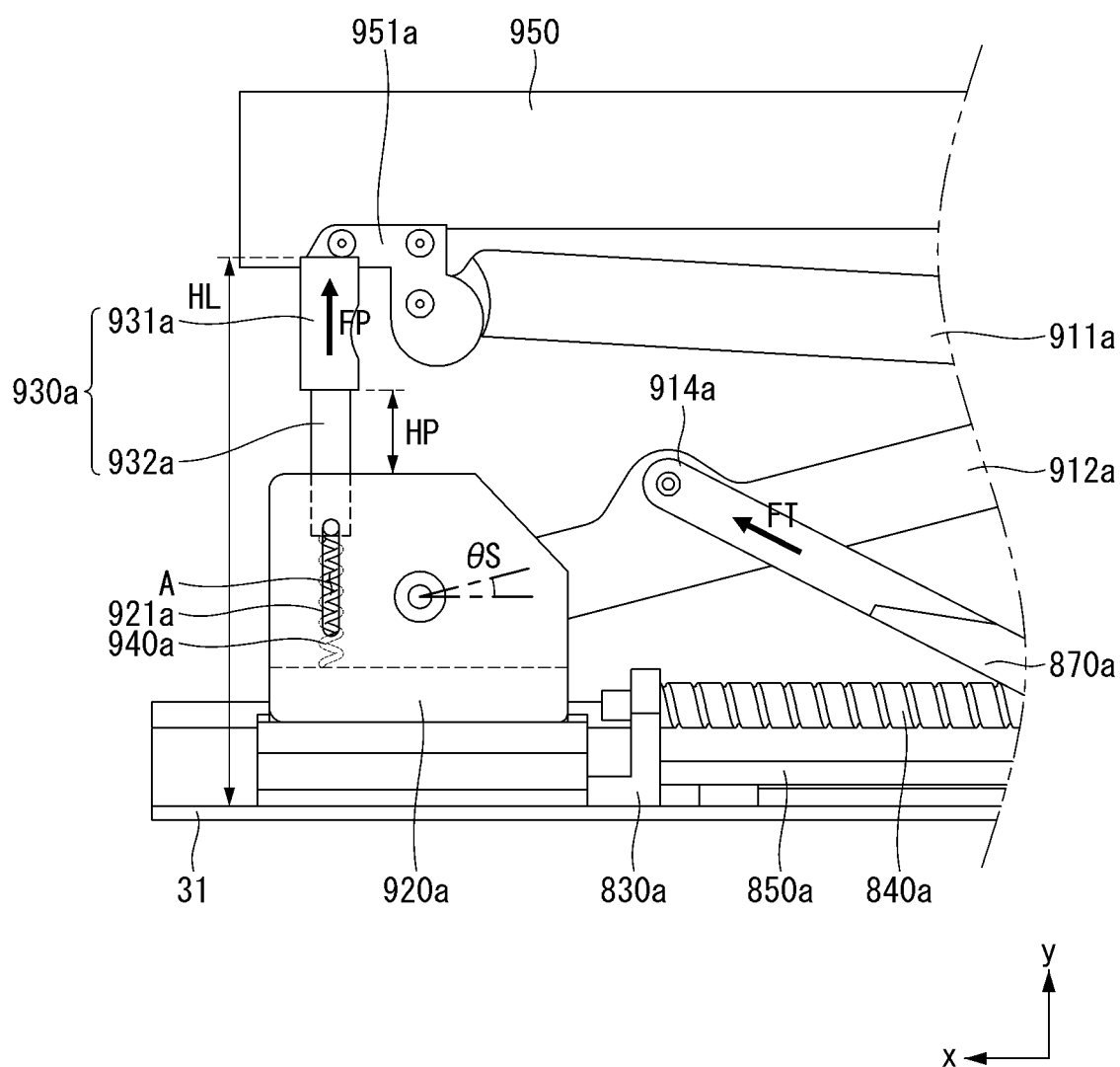
Figure 56:
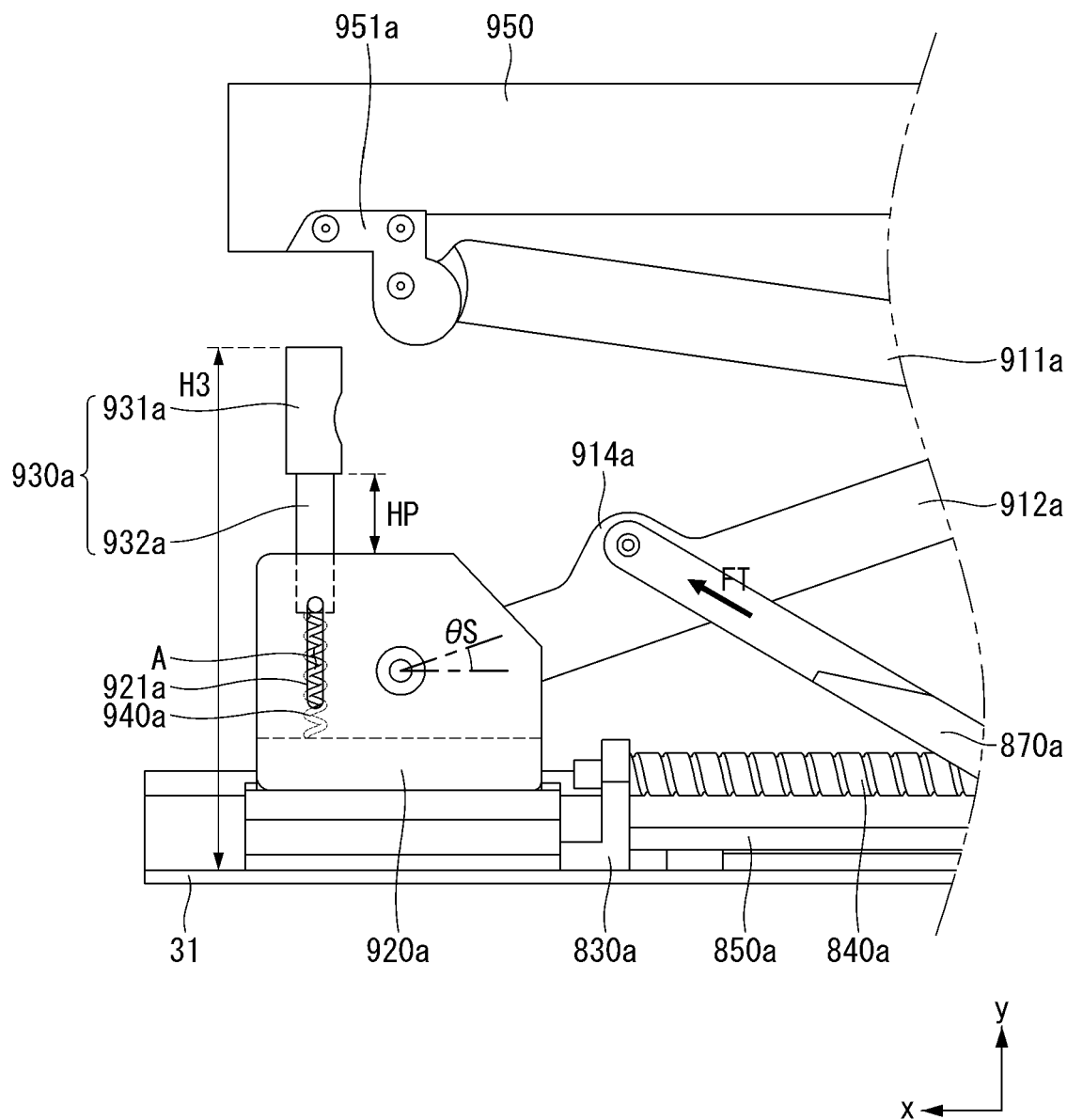

Referring to FIGS. 54 to 56, the right link 910a may stand up by receiving a restoring force from the right pusher 930a. It will be described with reference to the right link 910a.

An angle between the second arm 912a and the base 31 may be referred to as an angle theta S. The force transmitted by the right rod 870a to the second arm 912a may be referred to as FT. The force transmitted by the right pusher 930a to the right link bracket 951a may be referred to as FP.

Referring to FIG. 54, when the second arm 912a is completely lying with respect to the base 31, the angle theta S may have a minimum value. The right spring 940a connected to the right pusher 930a may be compressed to the maximum, and the magnitude of the restoring force FP may have a maximum value. The compressed right spring 940a may provide a restoring force FP to the right pusher 930a. The right pusher 930a may transmit the restoring force FP to the right link bracket 951a. The restoring force FP may act in the +y-axis direction.

When the second arm 912a is completely lying with respect to the base 31, the distance HL from the base 31 to the upper end of the right pusher 930a may have a minimum value. The first part 931a of the right pusher 930a may protrude to the outside of the right link mount 920a, and the second part 932a of the right pusher 930a may be entirely received in the accommodating space 923a of the right link mount 920a.

Referring to FIG. 55, when the second arm 912a changes from a completely lying state to a standing state with respect to the base 31, the angle theta S may gradually increase. The amount of compression displacement of the right spring 940a may gradually decrease, and the magnitude of the restoring force FP may gradually decrease.

As the angle theta S gradually increases, at least a portion of the second part 932a of the right pusher 930a may protrude to the outside of the right link mount 920a. A length by which the second part 932a of the right pusher 930a protrudes to the outside of the right link mount 920a may be referred to as a length HP. The distance HL from the base 31 to the upper end of the right pusher 930a may be increased by HP in comparison with a case where the second arm 912a is completely lying with respect to the base 31.

Referring to FIG. 56, when the standing of the second arm 912a with respect to the base 31 progresses, the right pusher 930a and the right link bracket 951a may be separated from each other. The amount of compression displacement of the right spring 940a may become zero. When the amount of compression displacement of the right spring 940a becomes zero, the restoring force FP provided by the right pusher 930a to the right link bracket 951a may be zero.

In addition, a length HP by which the second part 932a of the right pusher 930a protrudes to the outside of the right link mount 920a may have a maximum value. In addition, the distance HL from the base 31 to the upper end of the right pusher 930a may have a maximum value.

That is, the right pusher 930a applies a restoring force to the right link bracket 951a, while the right pusher 930a and the right link bracket 951a are in contact with each other, thereby assisting the second arm 912a to stand up, and reducing the load on the motor assembly 810.

The lead screw 840a, 840b may be driven by one motor assembly 810. As the lead screw 840a, 840b is driven by one motor assembly 810, the second arm 912a, 912b can stand symmetrically. However, when the lead screw 840a, 840b is driven by one motor assembly 810, the load applied to the motor assembly 810 in order to stand up the second arm 912a, 912b may be excessively large. At this time, the right pusher 930a applies a restoring force to the right link bracket 951a, thereby assisting the second arm 912a to stand up, and reducing the load on the motor assembly 810.

Alternatively, when the second arm 912a changes from a standing state to a completely lying state with respect to the base 31, the restoring force that the right pusher 930a provides to the right link bracket 951a can alleviate an impact that is generated when the link 910a lies with respect to the base 31. That is, the restoring force that the right pusher 930a provides to the right link bracket 951a may serve as a damper, when the link 910a lies with respect to the base 31. As the right pusher 930a serves as a damper, a load on the motor assembly 810 may be reduced.

The structure formed by the left pusher 930b, the left spring 940b, the left link bracket 951b, the left link mount 920b, and the left rod 870b may be symmetrical with the structure formed by the above-described right pusher 930a, right spring 940a, right link bracket 951a, right link 910a mount, and right rod 870a. In this case, the symmetry axis may be the symmetry axis of the motor assembly 810.

Figure 57:
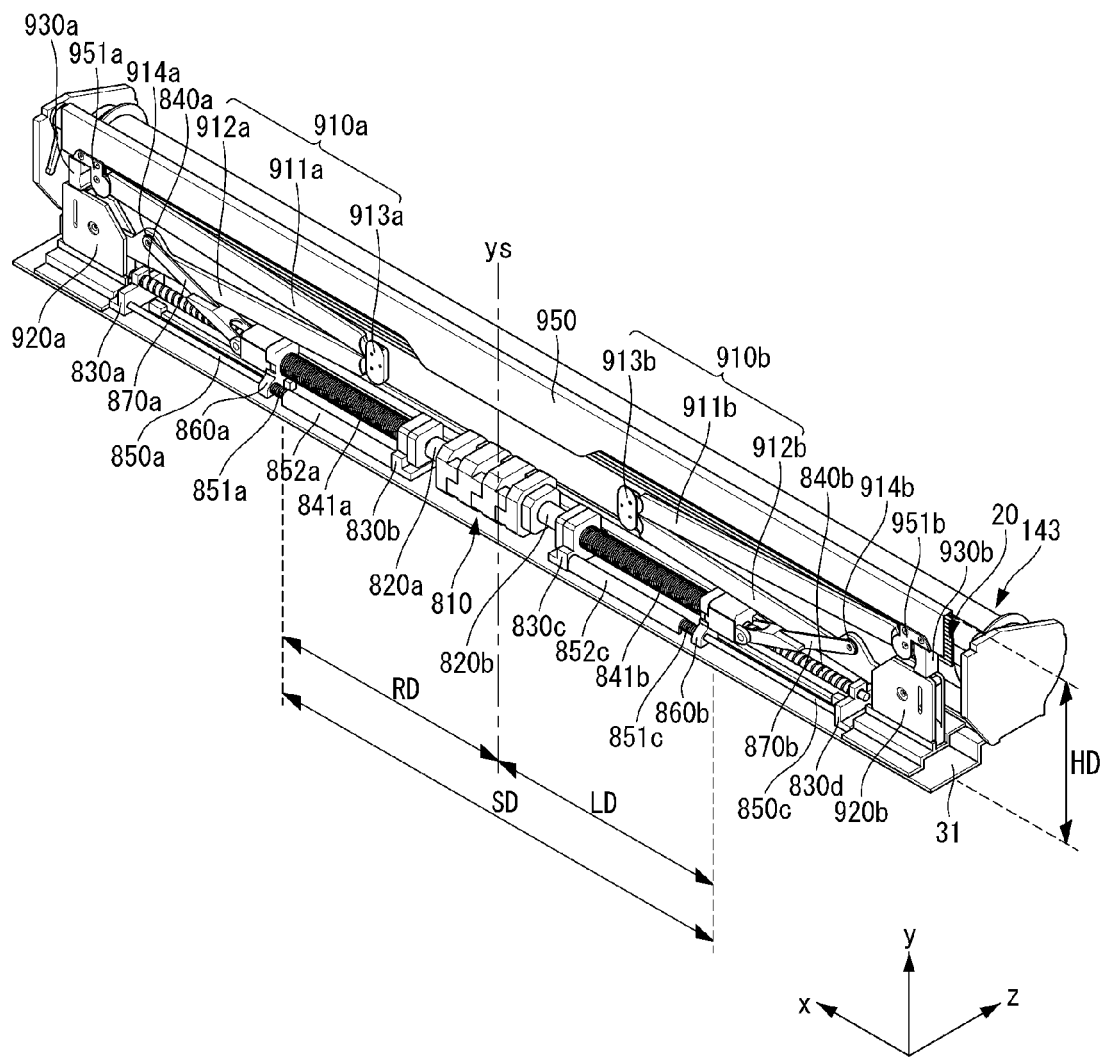
Figure 58:
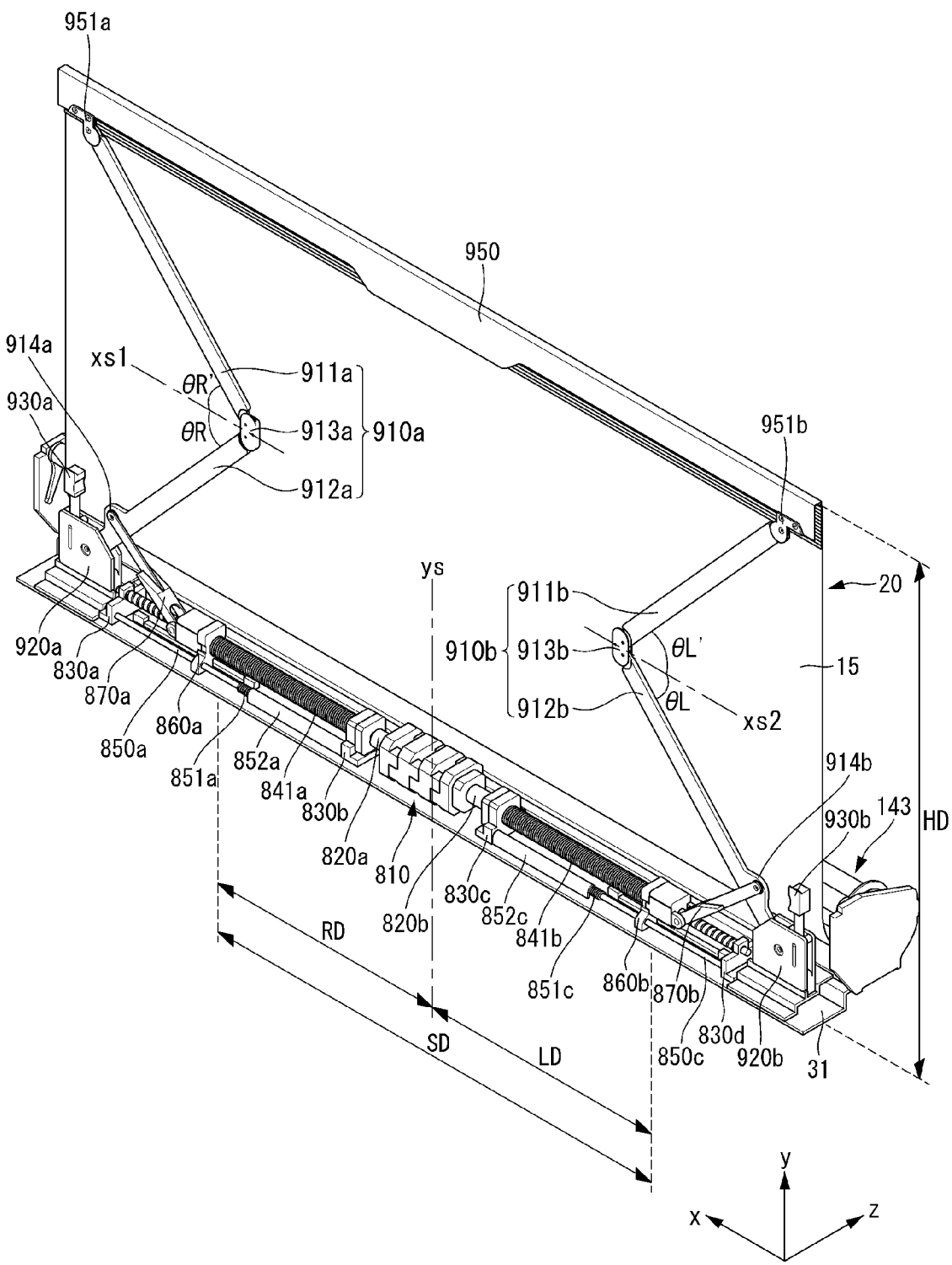
Figure 59:
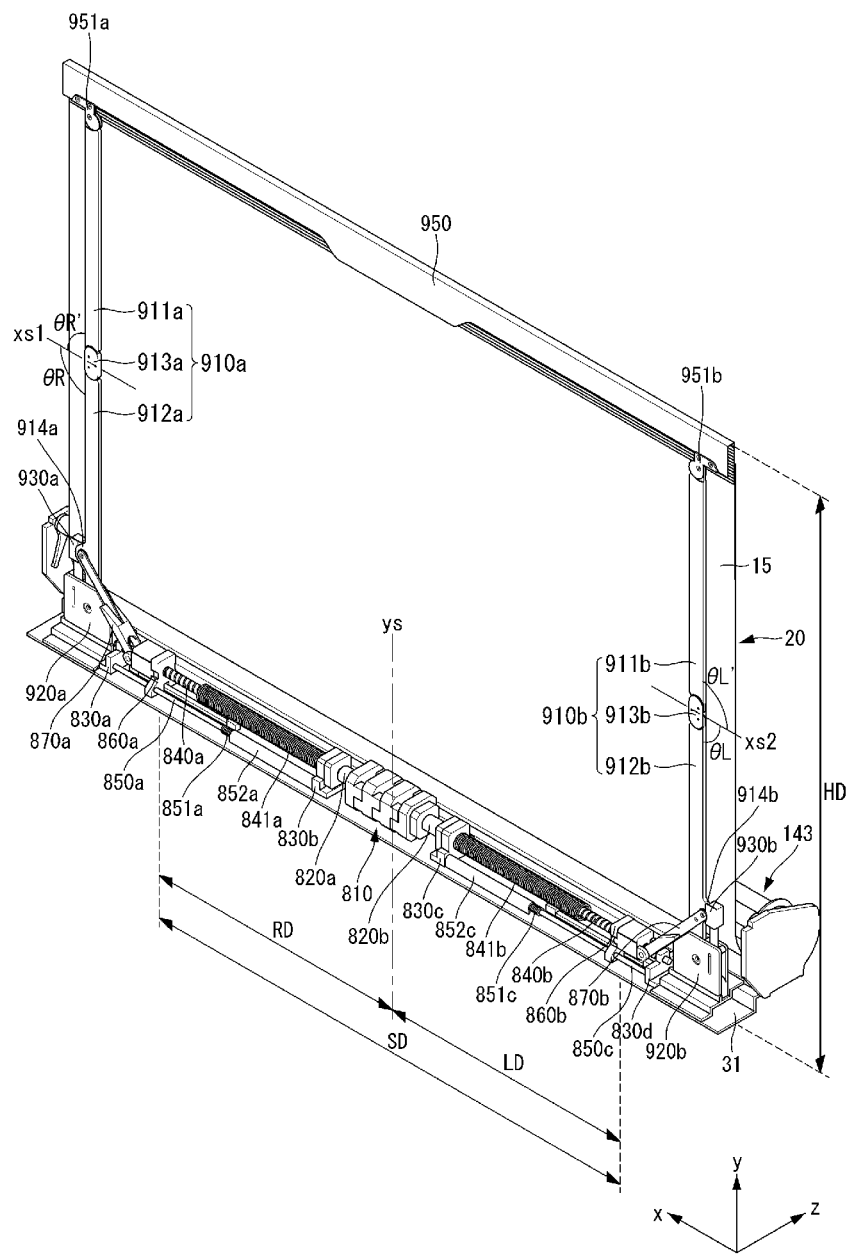

Referring to FIGS. 57 to 59, the panel roller 143 may be installed in the base 31. The panel roller 143 may be installed in front of the lead screw 840a, 840b. Alternatively, the panel roller 143 may be disposed parallel to the length direction of the lead screw 840a, 840b. Alternatively, the panel roller 143 may be spaced apart from the lead screw 840a, 840b.

The display unit 20 may include the display panel 10 and the module cover 15. A lower side of the display unit 20 may be connected to the panel roller 143, and an upper side of the display unit 20 may be connected to the upper bar 75. The display unit 20 may be wound around or unwound from the panel roller 143.

A distance from the symmetry axis ys of the motor assembly 810 to the right slider 860a may be referred to as a distance RD. A distance from the symmetry axis ys of the motor assembly 810 to the left slider 860b may be referred to as a distance LD. The distance between the right slider 860a and the left slider 860b may be referred to as a distance SD. The distance SD may be the sum of the distance RD and the distance LD. A distance from the base 31 to the upper end of the display unit 20 may be referred to as a distance HD.

Referring to FIG. 57, when the second arm 912a, 912b are completely lying with respect to the base 31, the distance SD between the right slider 860a and the left slider 860b may have a minimum value. The distance RD from the symmetry axis ys of the motor assembly 810 to the right slider 860a and the distance LD from the symmetry axis ys of the motor assembly 810 to the left slider 860b may be equal to each other.

When the second arm 912a, 912b are completely lying with respect to the base 31, the distance HD from the base 31 to the upper end of the display unit 20 may have a minimum value.

When the second arm 912a, 912b is completely lying with respect to the base 31, the first spring 841a, 841b may contact the slider 860a, 860b. In addition, the second spring 851a, 851b may contact the slider 860a, 860b. In addition, the pusher 930a, 930b may contact the link bracket 951a, 951b.

When the second arm 912a, 912b is completely lying with respect to the base 31, the compression amount of the first spring 841a, 841b may have a maximum value, and the magnitude of the restoring force provided by the first spring 841a, 841b to the slider 860a, 860b may have a maximum value.

When the second arm 912a, 912b is completely lying with respect to the base 31, the compression amount of the second spring 851a, 851b may have a maximum value, and the magnitude of the restoring force provided by the second spring 851a, 851b to the slider 860a, 860b may have a maximum value.

When the second arm 912a, 912b is completely lying with respect to the base 31, the compression amount of the spring 940a, 940b may have a maximum value, and the magnitude of the restoring force provided by the spring 940a, 940b to the pusher 930a, 930b may have a maximum value.

When the second arm 912a, 912b start to stand up with respect to the base 31, the second arm 912a, 912b may stand up by receiving a restoring force from the first spring 841a, 841b, the second spring 851a, 851b, and the spring 940a, 940b. Accordingly, the load applied to the motor assembly 810 may be reduced.

Referring to FIG. 58, as the standing of the second arm 912a, 912b with respect to the base 31 progresses, the distance SD between the right slider 860a and the left slider 860b may gradually increase. Even if the distance SD increases, the distance LD and the distance RD may be equal to each other. That is, the right slider 860a and the left slider 860b may be located symmetrically with respect to the symmetry axis ys of the motor assembly 810. In addition, a degree to which the second arm 912a, 912b of the right link 910a stands up with respect to the base 31 and a degree to which the second arm 912a, 912b of the left link 910b stands up with respect to the base 31 may be equal to each other.

As the standing of the second arm 912a, 912b with respect to the base 31 progresses, the distance HD from the base 31 to the upper end of the display unit 20 may gradually increase. The display unit 20 may be unwound from the panel roller 143. Alternatively, the display unit 20 may be deployed from the panel roller 143.

When the second arm 912a, 912b sufficiently stands up with respect to the base 31, the first spring 841a, 841b may be separated from the slider 860a, 860b. In addition, when the second arm 912a, 912b sufficiently stands up with respect to the base 31, the second spring 851a, 851b may be separated from the slider 860a, 860b. In addition, when the second arm 912a, 912b sufficiently stands up with respect to the base 31, the pusher 930a, 930b may be separated from the link bracket 951a, 951b.

The separation of the first spring 841a, 841b from the slider 860a, 860b, the separation of the second spring 851a, 851b from the slider 860a, 860b, and the separation of the pusher 930a, 930b from the link bracket 951a, 951b may progress independently of each other. That is, the order of the separation of the first spring 841a, 841b from the slider 860a, 860b, the separation of the second spring 851a, 851b from the slider 860a, 860b, and the separation of the pusher 930a, 930b from the link bracket 951a, 951b may be mutually variable.

An angle between the axis xs1 parallel to the base 31 and the second arm 912a may be referred to as theta R. In addition, an angle formed by the axis xs1 parallel to the base 31 and the first arm 911a may be referred to as theta R'. The axis xs1 and the x-axis may be parallel to each other. When the second arm 912a is completely lying with respect to the base 31, or while the second arm 912a stands up with respect to the base 31, or when the second arm 912a completes standing with respect to the base 31, theta R and theta R' may be maintained to be identical with each other.

An angle between the axis xs2 parallel to the base 31 and the second arm 912b may be referred to as theta L. In addition, an angle formed by the axis xs2 parallel to the base 31 and the first arm 911b may be referred to as theta L'. The axis xs2 and the x-axis may be parallel to each other.

When the second arm 912b is completely lying with respect to the base 31, or while the second arm 912b stands up with respect to the base 31, or when the second arm 912b completes standing with respect to the base 31, theta L and theta L' may be maintained to be identical with each other. The axis xs1 and the axis xs2 may be axes identical to each other.

Referring to FIG. 59, when the second arm 912a, 912b completely stands up with respect to the base 31, the distance SD between the right slider 860a and the left slider 860b may have a maximum value. Even when the distance SD is a maximum, the distance LD and the distance RD may be equal to each other.

When the second arm 912a, 912b completely stands up with respect to the base 31, the distance HD from the base 31 to the upper end of the display unit 20 may have a maximum value.

Figure 60:
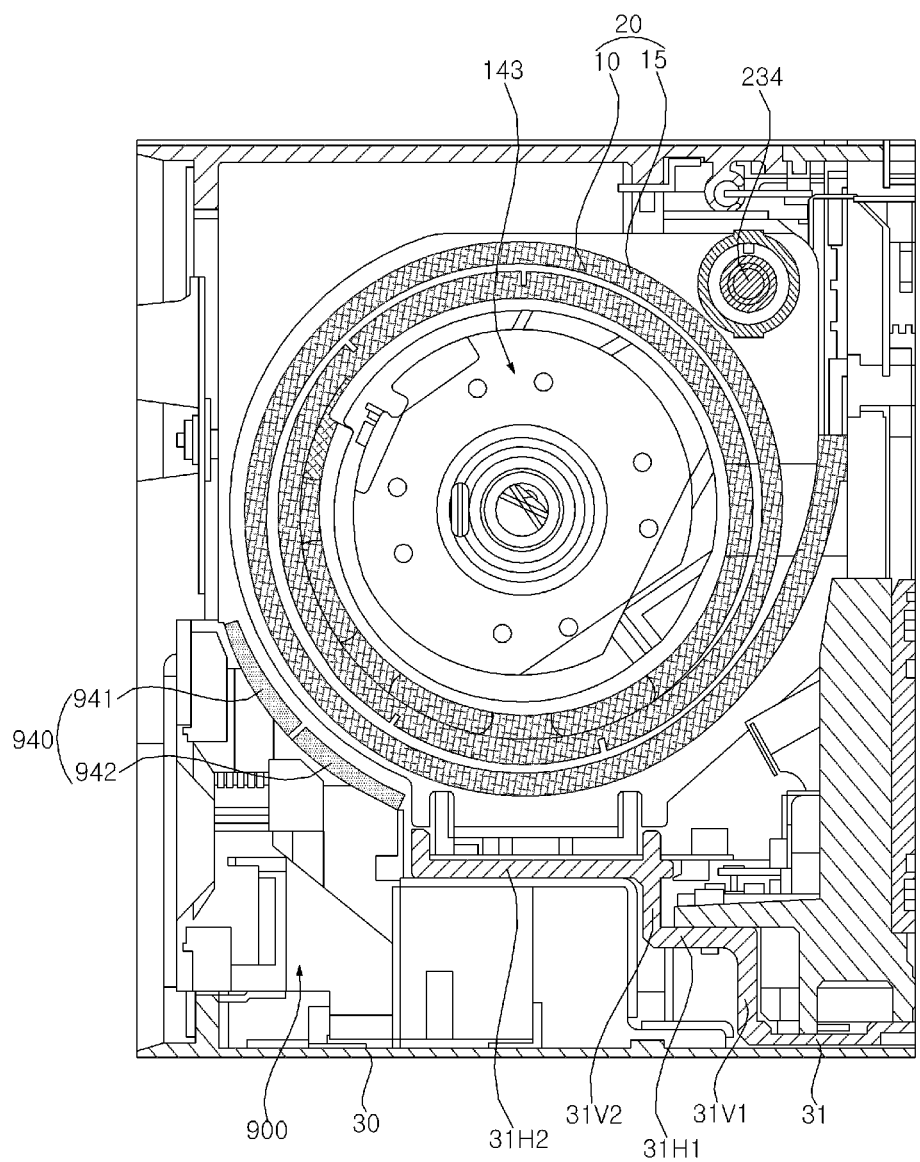

Referring to FIG. 60, the panel roller 143 may be rotatably installed inside the housing 30. The module cover 15 and the display panel 10 may be wound around the panel roller 143 inside the housing 30. The module cover 15 and the display panel 10 wound around the panel roller 143 may be unwound or sag from the panel roller 143 due to vibration or external impact. When the module cover 15 is unwound or sagged, the drooping portion may collide with a structures installed in the lower side of the panel roller 143.

The base 31 may include a first vertical portion 31V1, a first horizontal portion 31H1, a second vertical portion 31V2, and a second horizontal portion 31H2. The first vertical portion 31V1, the first horizontal portion 31H1, the second vertical portion 31V2, and the second horizontal portion 31H2 may form a step shape as a whole while forming a step difference. The second horizontal portion 31H2 may be located in the vertical lower side of the panel roller 143.

A speaker assembly 900 may be installed in a front lower side of the panel roller 143. The speaker assembly 900 may be located in the forward direction of the second horizontal portion 31H2. Sound provided by a sound unit 901, 902 (refer to FIG. 61) of the speaker assembly 900 may be directed in the forward direction of the housing 30.

Figure 61:
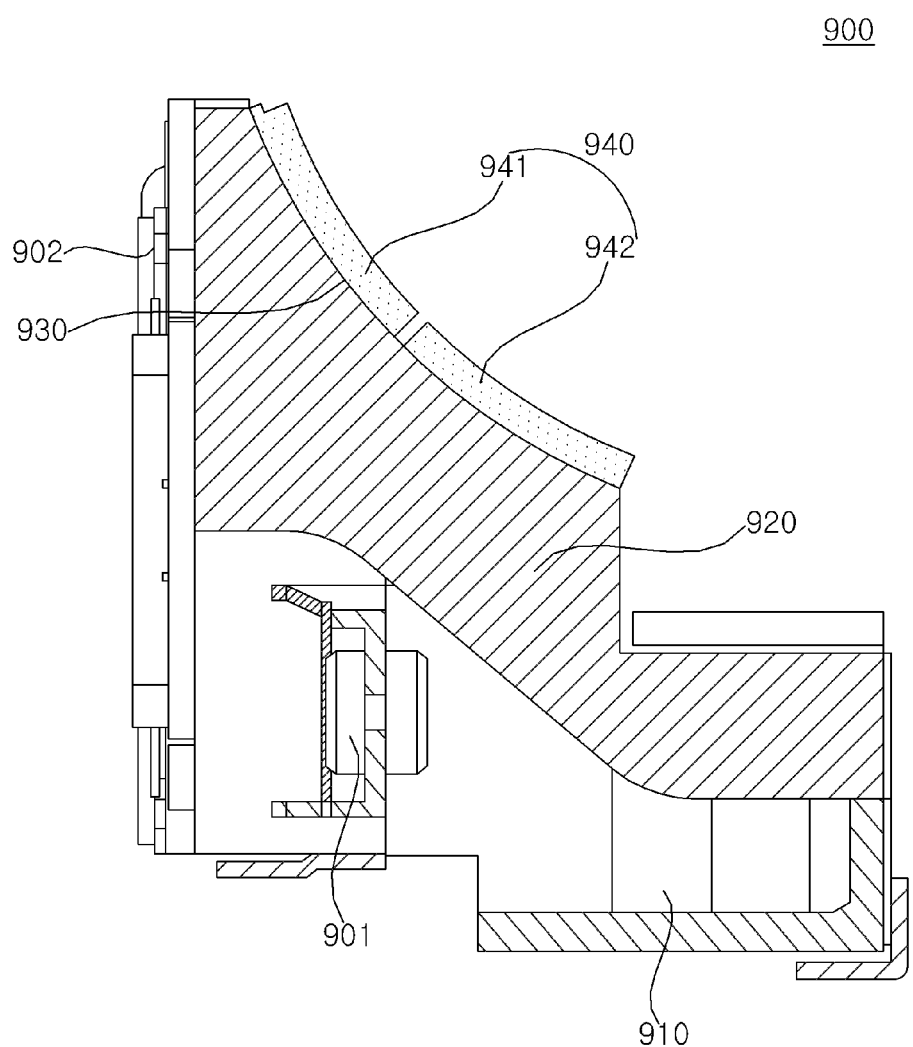

Referring to FIGS. 60 and 61, the speaker assembly 900 may include a first case 910 and a second case 920. The first case 910 may form a lower portion of the speaker assembly 900, and the second case 920 may form an upper portion of the speaker assembly 900. The first case 910 may be partitioned with the second case 920 while being formed as one body. The first speaker unit 901 may be mounted on the front surface of the first case 910, and the second speaker unit 902 may be mounted on the front surface of the second case 920. For example, the first speaker unit 901 may be a woofer, and the second speaker unit 902 may be a tweeter.

The second case 920 may have a curved surface 930. The curved surface 930 of the second case 920 may have a curvature corresponding to the curvature of the panel roller 143 (refer to FIG. 60). The curved surface 930 of the second case 920 may be spaced apart from the panel roller 143 by a certain interval. The curved surface 930 may be located in the rear upper side of the second case 920.

A buffer member 940 may be fixed to the curved surface 930 of the second case 920. The buffer member 940 may include a plurality of sub buffer members 940. A first sub buffer member 941 may be located adjacent to a second sub buffer member 942. For example, the buffer member 940 may be a sponge or a reinforcing sponge. As another example, the buffer member 940 may be rubber. The first sub buffer member 941 may be attached to the upper portion of the curved surface 930, and the second sub buffer member 942 may be attached to the lower portion of the curved surface 930. Accordingly, durability in a state in which the buffer members 940 are adhered to the curved surface may be improved due to the curvature of the curved surface 930.

Accordingly, even if the module cover 15 wound around the panel roller 143 is unwound or loosened from the panel roller 143 due to vibration or external impact, the impact applied by the case 920, 930 of the speaker 900 to the module cover 15 can be prevented.

Figure 62:
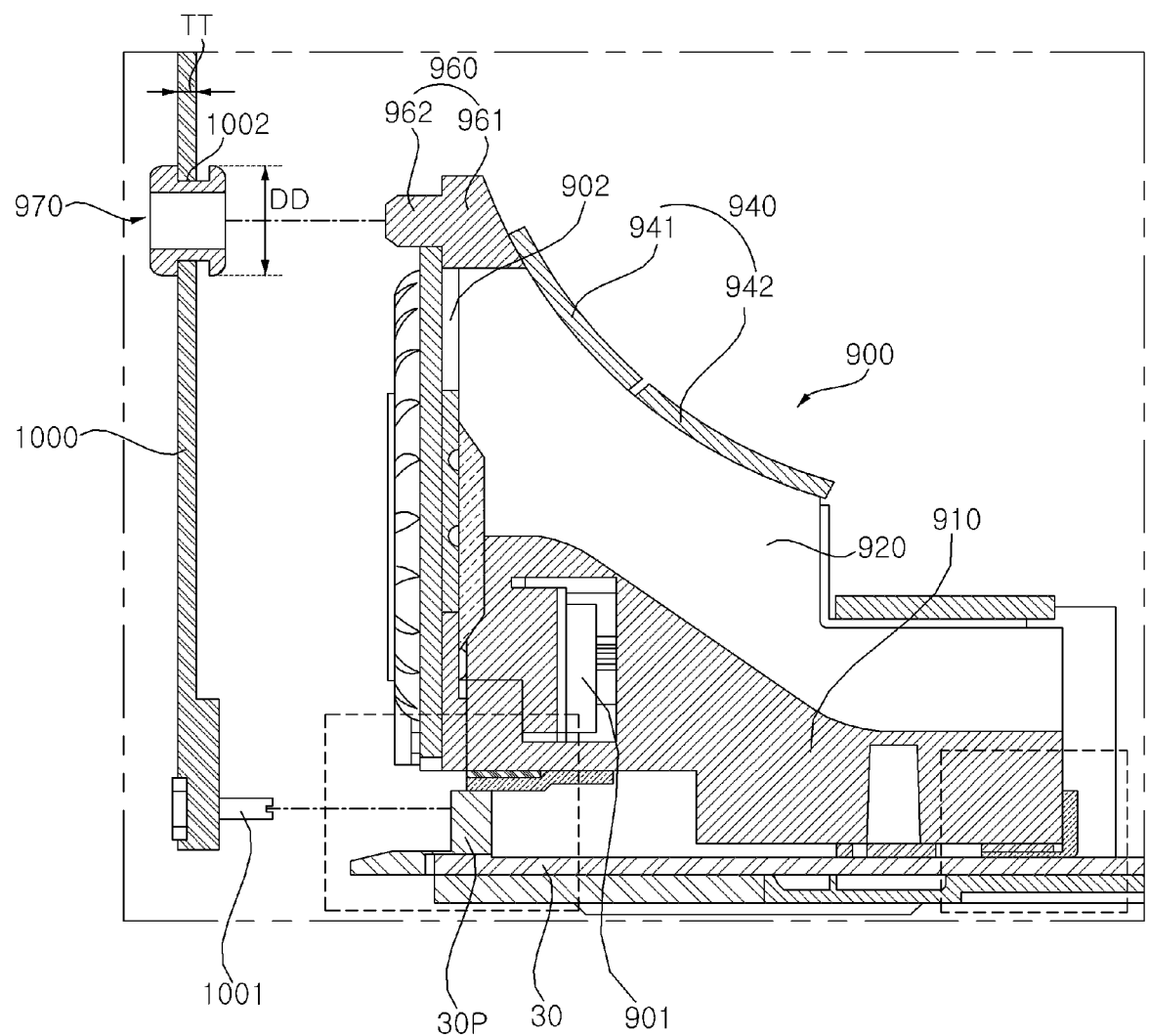

Referring to FIG. 62, the speaker assembly 900 may be placed in the housing 30. A front cover 1000 may be located in the forward direction of the speaker assembly 900. The speaker assembly 900 may be coupled to the front cover 1000. The front cover 1000 may be fixed to the housing 30. The front cover 1000 may be coupled to a boss 30P formed by protruding from the bottom surface of the housing 30 by a fastening member 1001.

The front cover 1000 may include a coupling hole 1002. The coupling hole 1002 may be formed in the front cover 1000 adjacent to the upper end of the second case 920 of the speaker assembly 900. The coupling hole 1002 may penetrate the front cover 1000. The front cover 1000 may have a thickness TT. The coupling hole 1002 may have a diameter DD.

The second case 920 may include a coupling portion 960. The coupling portion 960 may be formed in the upper side of the second case 920. The coupling portion 960 may include a body 961 and an insertion rod 962. The body 961 may form an upper end of the second case 920. The body 961 may be formed with the second case 920 as one body. The insertion rod 962 may be formed in the body 961. The insertion rod 962 may extend from the body 961 in the forward direction of the speaker assembly 900 or toward the front case 1000. A bushing 970 may be inserted into a coupling hole 1002. The insertion rod 962 may be inserted into the bushing 970. For example, the bushing 970 may be rubber. As another example, the bushing 970 may be made of synthetic resin.

Figure 63:
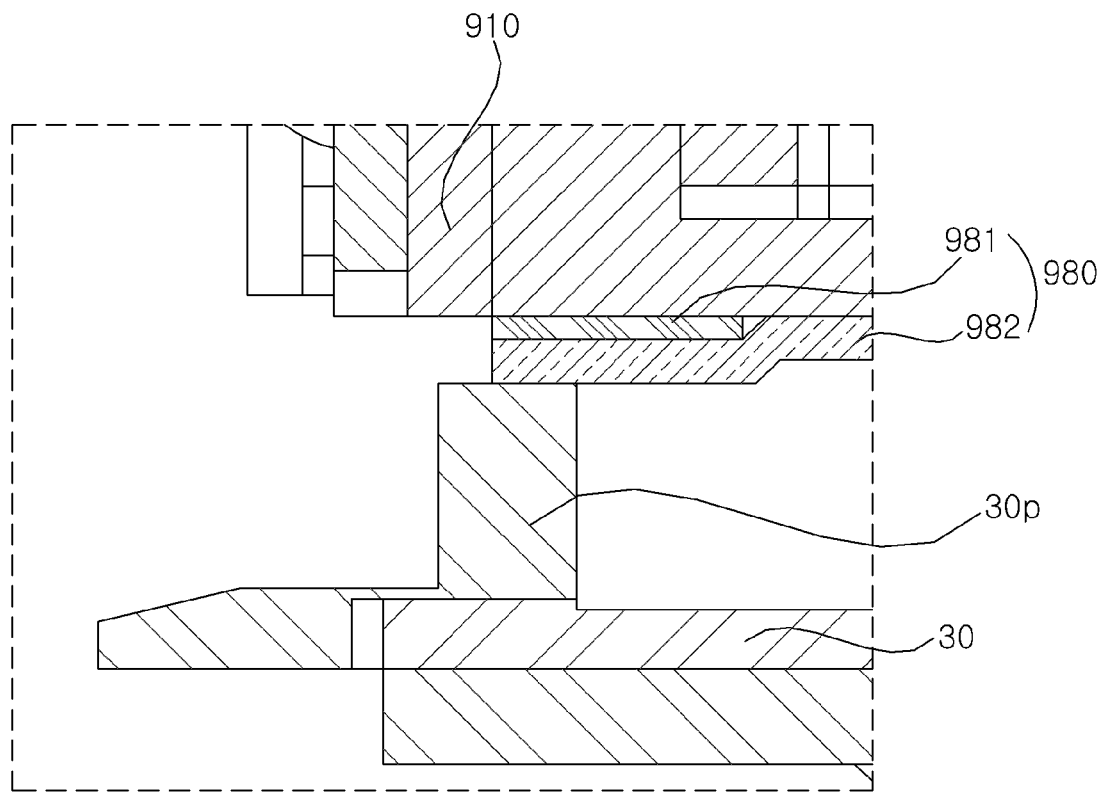
Figure 64:
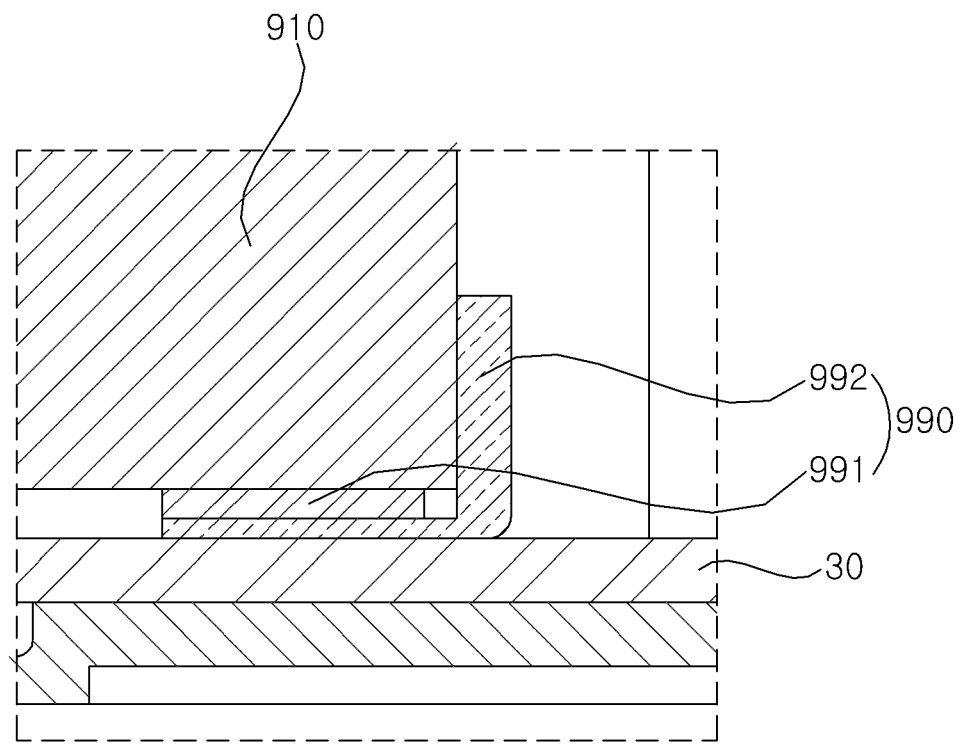

Referring to FIGS. 63 and 64, a support member 980, 990 may be located between the speaker assembly 900 (refer to FIG. 62) and the housing 30. The support member 980, 990 may be supported on the bottom surface of the housing 30. The support member 980, 990 may provide an elastic force or a buffering force to the speaker assembly 900. The support member 980, 990 may include a front support member 980 and a rear support member 990. The support member 980, 990 may absorb vibrations generated in the speaker assembly 900.

The front support member 980 may be located between the boss 30P of the housing 30 and the first case 910. The front support member 980 may be fixed to the lower surface of the first case 910 and contact the boss 30P of the housing 30. The front support member 980 may have two layers. A first layer 981 may be fixed to the lower surface of the first case 910 of the speaker assembly 900. A second layer 982 may be fixed to the first layer 981 and contact the boss 30P of the housing 30. The first layer 981 may be denser than the second layer 982. The first layer 981 may have a higher hardness than the second layer 982. For example, the first layer 981 may be rubber. As another example, the second layer 982 may be a soft sponge.

The rear support member 990 may be located between the bottom surface of the housing 30 and the first case 910. The rear support member 990 may be fixed to the lower surface of the first case 910 and contact the bottom surface of the housing 30. The rear support member 990 may have two layers. The first layer 991 may be fixed to the lower surface of the first case 910 of the speaker assembly 900. The second layer 992 may be fixed to the first layer 991 and contact the bottom surface of the housing 30. For example, the first layer 991 may be rubber. As another example, the second layer 992 may be a soft sponge.

Accordingly, it is possible to improve or prevent noise and/or vibration generated in the speaker assembly 900 from being transferred to the housing 30.

Figure 65:
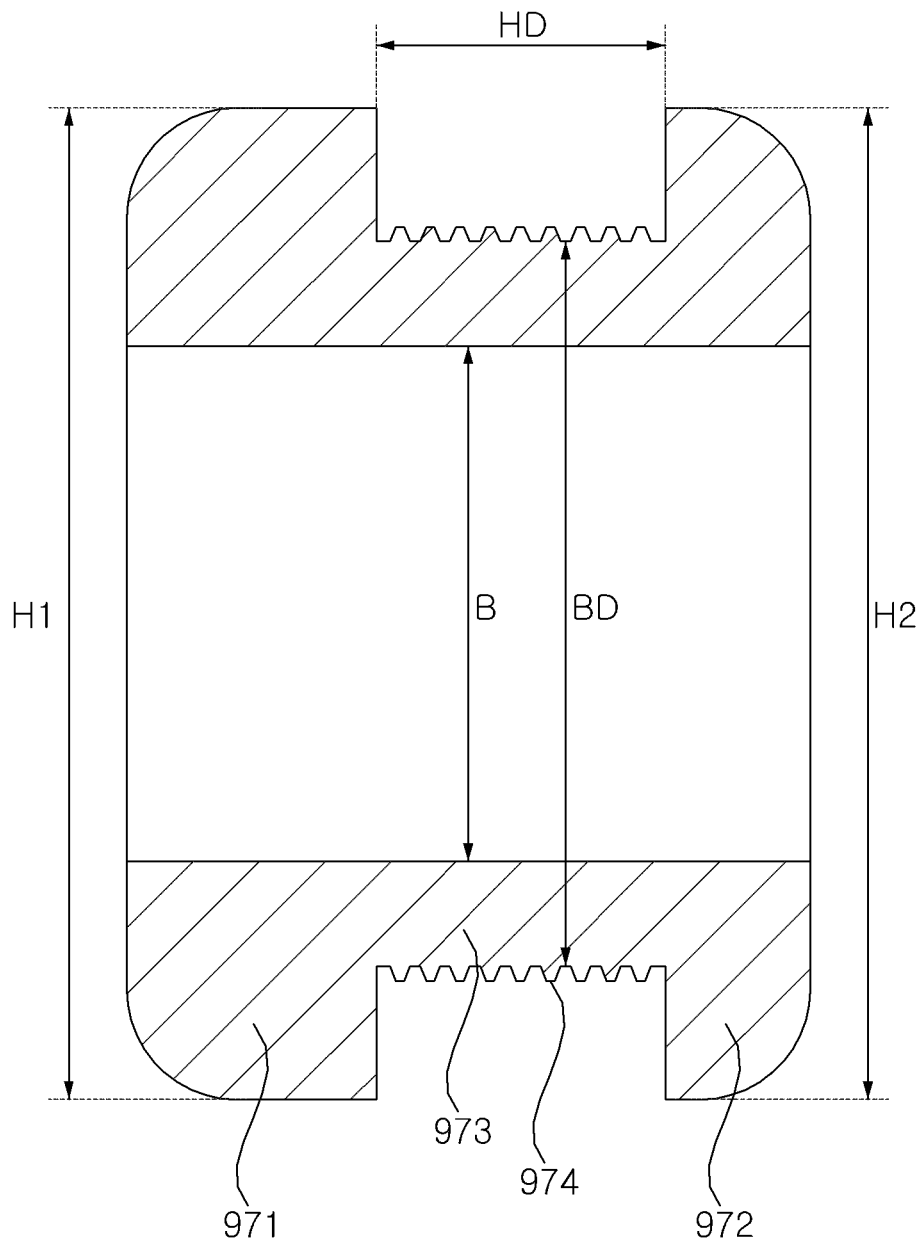

Referring to FIG. 65, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 974. The wave surface 974 may be formed on the outer circumferential surface of the body 973. For example, the ridges and valleys of the wave surface 974 may be alternately repeated. As another example, the wave surface 974 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 66:
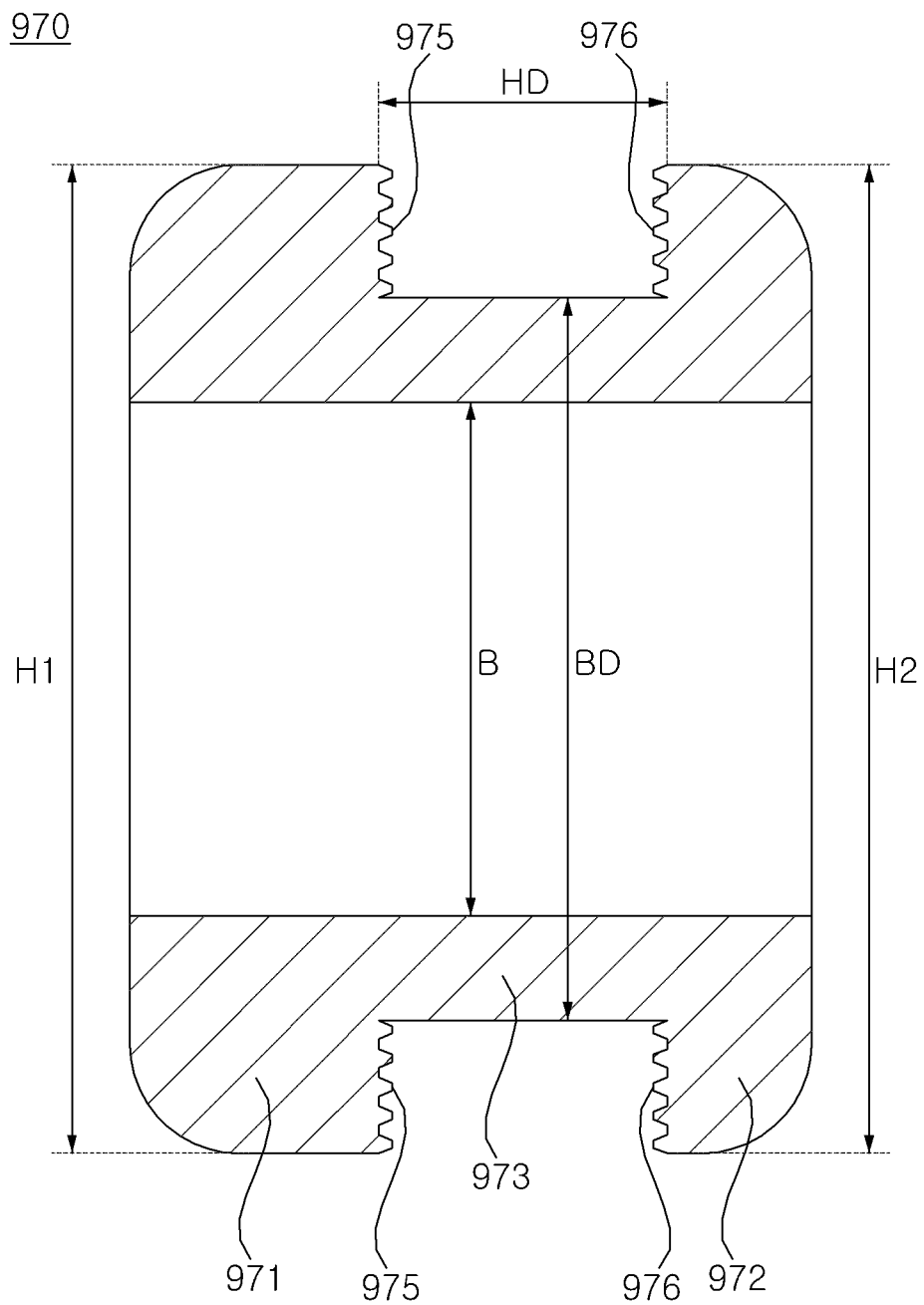

Referring to FIG. 66, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The first head 971 may have a wave surface 975. The wave surface 975 may be formed on the outer surface of the first head 971 facing the second head 972. For example, the ridges and valleys of the wave surface 975 may be alternately repeated. As another example, the wave surface 975 may be formed by embossing.

The second head 972 may have a wave surface 976. The wave surface 976 may be formed on an outer surface of the second head 972 facing the first head 971. For example, the ridges and valleys of the wave surface 976 may be alternately repeated. As another example, the wave surface 976 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 67:
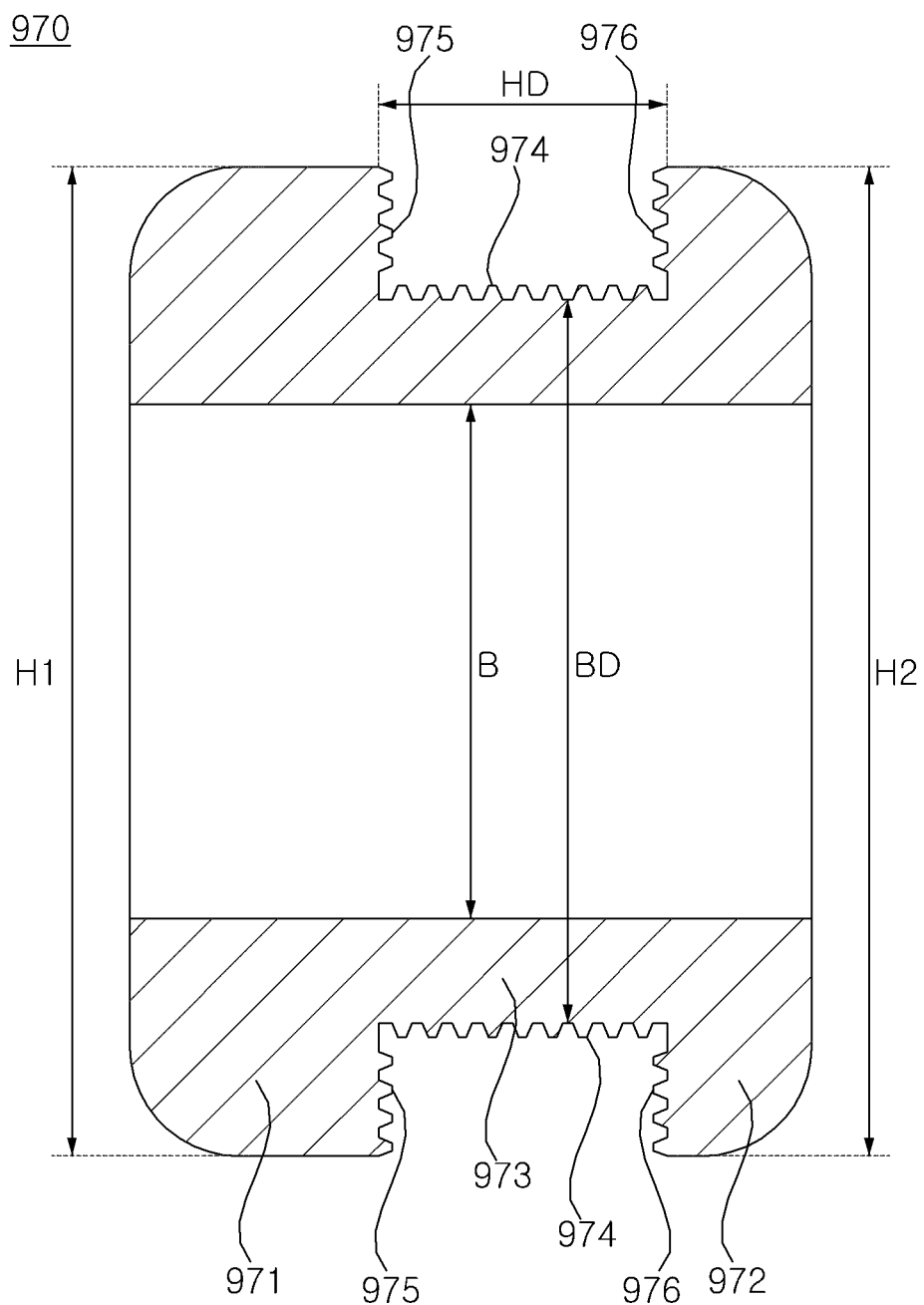

Referring to FIG. 67, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 974. The wave surface 974 may be formed on the outer circumferential surface of the body 973. For example, the ridges and valleys of the wave surface 974 may be alternately repeated. As another example, the wave surface 974 may be formed by embossing.

The first head 971 may have a wave surface 975. The wave surface 975 may be formed on the outer surface of the first head 971 facing the second head 972. For example, the ridges and valleys of the wave surface 975 may be alternately repeated. As another example, the wave surface 975 may be formed by embossing.

The second head 972 may have a wave surface 976. The wave surface 976 may be formed on the outer surface of the second head 972 facing the first head 971. For example, the ridges and valleys of the wave surface 976 may be alternately repeated. As another example, the wave surface 976 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 68:
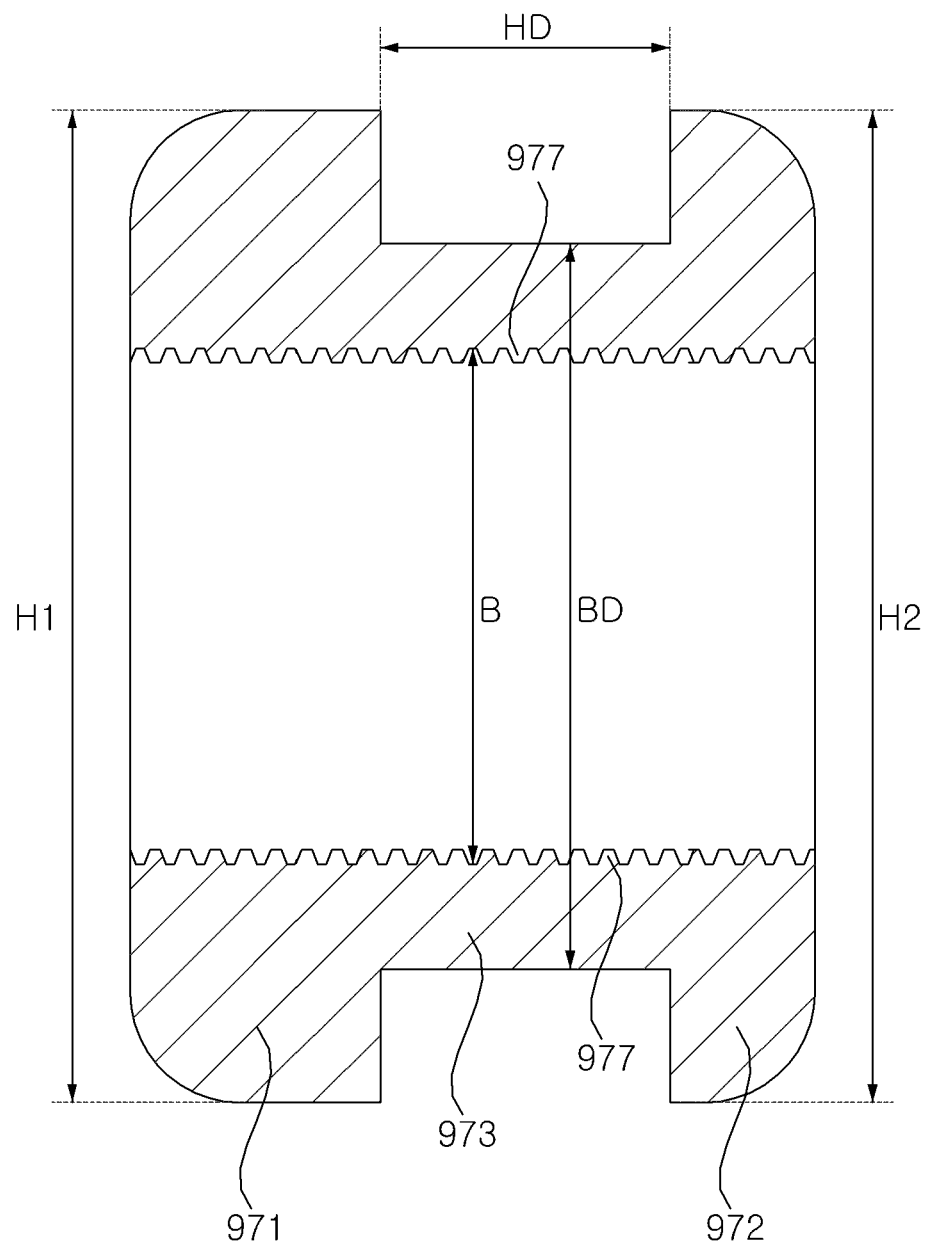

Referring to FIG. 68, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 977. The wave surface 977 may be formed on the inner circumferential surface of the body 973. For example, the ridges and valleys of the wave surface 977 may be alternately repeated. As another example, the wave surface 977 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 69:
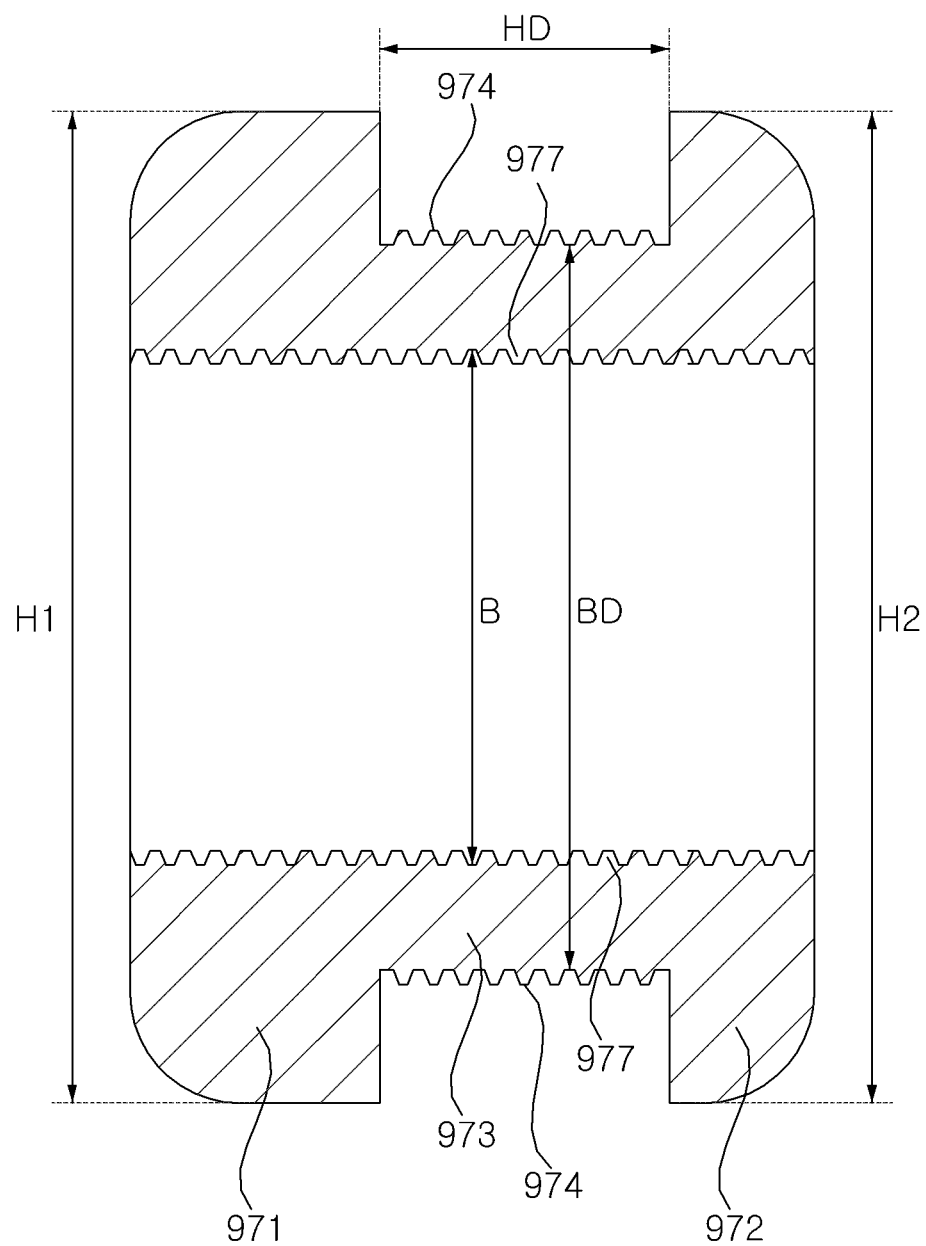

Referring to FIG. 69, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 974. The wave surface 974 may be formed on the outer circumferential surface of the body 973. For example, the ridges and valleys of the wave surface 974 may be alternately repeated. As another example, the wave surface 974 may be formed by embossing.

The body 973 may have a wave surface 977. The wave surface 977 may be formed on the inner circumferential surface of the body 973. For example, the ridges and valleys of the wave surface 977 may be alternately repeated. As another example, the wave surface 977 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 70:
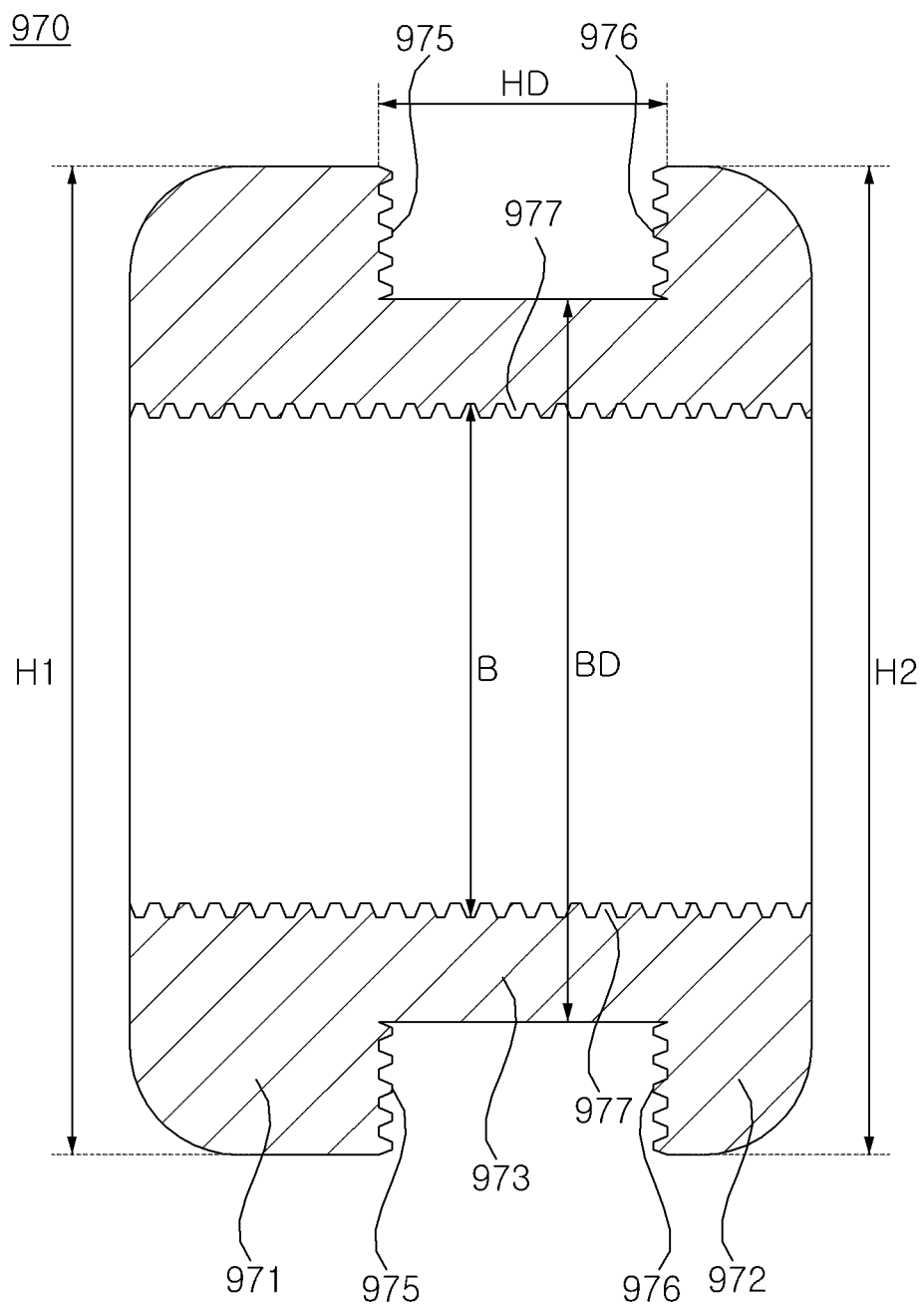

Referring to FIG. 70, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 977. The wave surface 977 may be formed on the inner circumferential surface of the body 973. For example, the ridges and valleys of the wave surface 977 may be alternately repeated. As another example, the wave surface 977 may be formed by embossing.

The first head 971 may have a wave surface 975. The wave surface 975 may be formed on the outer surface of the first head 971 facing the second head 972. For example, the ridges and valleys of the wave surface 975 may be alternately repeated. As another example, the wave surface 975 may be formed by embossing.

The second head 972 may have a wave surface 976. The wave surface 976 may be formed on the outer surface of the second head 972 facing the first head 971. For example, the ridges and valleys of the wave surface 976 may be alternately repeated. As another example, the wave surface 976 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

Figure 71:
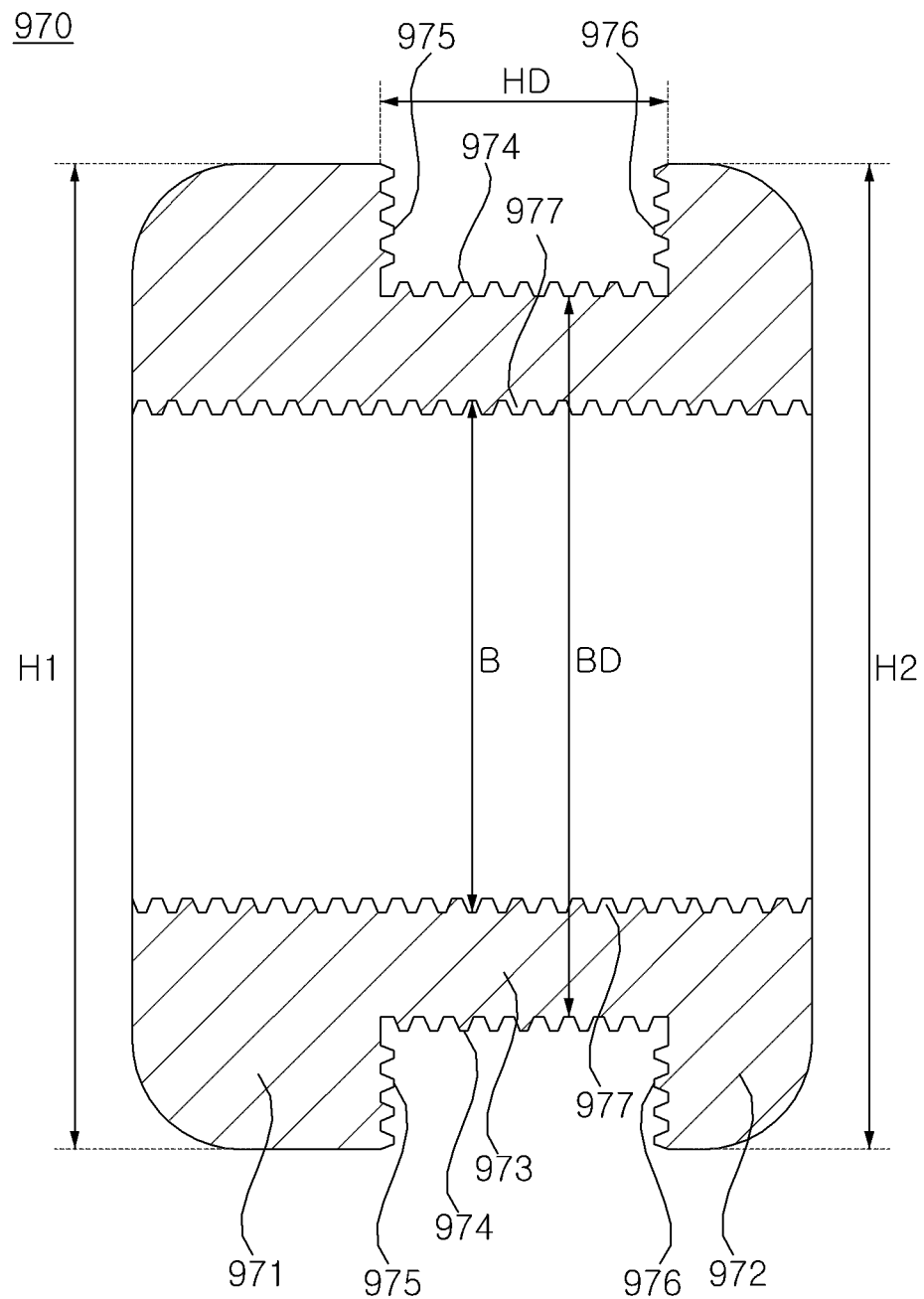

Referring to FIG. 71, the bushing 970 may include a body 973, a first head 971, and a second head 972. The body 973 may have a cylindrical shape as a whole. The first head 971 may be formed in one end of the body 973, and the outer diameter H1 of the first head 971 may be larger than the outer diameter BD of the body 973. The second head 972 may be formed in the other end of the body 973, and the outer diameter H2 of the second head 972 may be larger than the outer diameter BD of the body 973.

The outer diameter H1 of the first head 971 may be substantially the same as the outer diameter H2 of the second head 972. The outer diameter BD of the body 973 may be substantially the same as the diameter DD of the coupling hole 1002 (refer to FIG. 62). The distance HD between the first head 971 and the second head 972 may be larger than the thickness TT of the front cover 1000 (refer to FIG. 62).

The body 973 may have a wave surface 974. The wave surface 974 may be formed on the outer circumferential surface of the body 973. For example, the ridges and valleys of the wave surface 974 may be alternately repeated. As another example, the wave surface 974 may be formed by embossing.

The body 973 may have a wave surface 977. The wave surface 977 may be formed on the inner circumferential surface of the body 973. For example, the ridges and valleys of the wave surface 977 may be alternately repeated. As another example, the wave surface 977 may be formed by embossing.

The first head 971 may have a wave surface 975. The wave surface 975 may be formed on the outer surface of the first head 971 facing the second head 972. For example, the ridges and valleys of the wave surface 975 may be alternately repeated. As another example, the wave surface 975 may be formed by embossing.

The second head 972 may have a wave surface 976. The wave surface 976 may be formed on the outer surface of the second head 972 facing the first head 971. For example, the ridges and valleys of the wave surface 976 may be alternately repeated. As another example, the wave surface 976 may be formed by embossing.

The inner diameter B of the body 973 may be substantially the same as the outer diameter of the insertion rod 962 (refer to FIG. 62). Accordingly, it is possible to improve or prevent noise and/or vibration generated in the speaker assembly 900 (refer to FIG. 62) from being transmitted to the front cover 1000.

According to an aspect of the present disclosure, provided is a display device including: a flexible display panel; a roller which extends long, and around which the display panel is wound, or from which the display panel is unwound; a housing which provides an accommodating space therein, wherein the roller is rotatably mounted in the accommodating space; and a speaker assembly which is located between the roller and the housing, and placed on a bottom of the housing, wherein the housing includes a front cover which is located inside a front surface of the housing, is fixed to the bottom of the housing, and has a coupling hole, wherein the speaker assembly includes a coupling portion which is formed in an upper side of the speaker assembly, and inserted into the coupling hole.

In addition, according to another aspect of the present disclosure, the display device further includes a bushing which is inserted into the coupling hole of the front cover, and into which the coupling portion of the speaker assembly is inserted.

In addition, according to another aspect of the present disclosure, the bushing includes a buffer material.

In addition, according to another aspect of the present disclosure, the display device further includes a support member which is disposed on the bottom of the housing, and supports the speaker assembly.

In addition, according to another aspect of the present disclosure, the support member includes: a first layer in contact with a lower surface of the speaker assembly; and a second layer in contact with the first layer and the bottom of the housing.

In addition, according to another aspect of the present disclosure, the first layer may have a higher hardness than the second layer.

In addition, according to another aspect of the present disclosure, the bushing includes: a hollow body; a first head which is hollow, and formed in one end of the body; and a second head which is hollow, is formed in the other end of the body, and faces the first head, wherein an outer diameter of the first head and the second head is larger than an outer diameter of the body, and an inner diameter of the first head and the second head is substantially the same as an inner diameter of the body.

In addition, according to another aspect of the present disclosure, the bushing further includes a first wave surface formed on an outer circumferential surface of the body.

In addition, according to another aspect of the present disclosure, the bushing further includes a second wave surface formed on an outer surface of the first head facing the second head.

In addition, according to another aspect of the present disclosure, the bushing further includes a third wave surface formed on an outer surface of the second head facing the first head.

In addition, according to another aspect of the present disclosure, the bushing further includes a fourth wave surface formed on an inner circumferential surface of the body.

In addition, according to another aspect of the present disclosure, a distance between the first head and the second head is larger than a thickness of the front cover.

In addition, according to another aspect of the present disclosure, the coupling portion of the speaker assembly includes: a body formed on an upper end of the speaker assembly; and an insertion rod which protrudes from the body, and is press-fitted into the coupling hole of the front cover.

In addition, according to another aspect of the present disclosure, the display device further includes: a module cover which extends long in a length direction of the housing, and has a plurality of segments sequentially arranged in an up-down direction of the display panel at a rearward direction of the display panel to be wound around or unwound from the roller together with the display panel; and a foldable link which is located in the rearward direction of the display panel, has one end pivotably connected to the housing, and has the other end pivotably connected to an upper side of the module cover to stand up while unwinding the display panel and the module cover from the roller.

Certain embodiments or other embodiments of the invention described above are not mutually exclusive or distinct from each other. Any or all elements of the embodiments of the invention described above may be combined or combined with each other in configuration or function. For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible. Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising:
   a flexible display panel;
   a roller which extends in a long direction, and around which the flexible display panel is wound, or from which the flexible display panel is unwound;
   a housing which provides an accommodating space therein, wherein the roller is rotatably mounted in the accommodating space,
   wherein the housing comprises a front cover which is fixed to the housing in the forward direction, and has a coupling hole;
   a speaker assembly which is located between the roller and the housing, and located on a bottom of the housing, and which comprises a coupling portion which is formed in an upper side of the speaker assembly;
   a bushing which is inserted into the coupling hole of the front cover, and into which the coupling portion of the speaker assembly is inserted; and
   a support member which is disposed on the bottom of the housing, and which supports the speaker assembly,
   wherein the support member comprises:
   a first layer in contact with a lower surface of the speaker assembly, and
   a second layer in contact with the first layer and the bottom of the housing.

2. The display device of claim 1, wherein the bushing comprises a buffer material.

3. The display device of claim 1, wherein the first layer may have a higher hardness than the second layer.

4. The display device of claim 2, wherein the bushing comprises:
   a hollow body;
   a first head which is hollow, and formed in one end of the body; and
   a second head which is hollow, is formed in the other end of the body, and faces the first head,
   wherein an outer diameter of the first head and the second head is larger than an outer diameter of the body, and
   an inner diameter of the first head and the second head is substantially the same as an inner diameter of the body.

5. The display device of claim 4, wherein the bushing further comprises a first wave surface formed on an outer circumferential surface of the body.

6. The display device of claim 4, wherein the bushing further comprises a second wave surface formed on an outer surface of the first head facing the second head.

7. The display device of claim 4, wherein the bushing further comprises a third wave surface formed on an outer surface of the second head facing the first head.

8. The display device of claim 4, wherein the bushing further comprises a fourth wave surface formed on an inner circumferential surface of the body.

9. The display device of claim 4, wherein a distance between the first head and the second head is larger than a thickness of the front cover.

10. The display device of claim 4, wherein the coupling portion of the speaker assembly comprises:
    a body formed on an upper end of the speaker assembly; and
    an insertion rod which protrudes from the body, and is press-fitted into the coupling hole of the front cover.

11. The display device of claim 1, further comprising:
a module cover which extends long in a length direction of the housing, and has a plurality of segments sequentially arranged in an up-down direction of the flexible display panel at a rearward direction of the flexible display panel to be wound around or unwound from the roller together with the flexible display panel; and
a foldable link which is located in the rearward direction of the flexible display panel, has one end pivotably connected to the housing, and has the other end pivotably connected to an upper side of the module cover to stand up while unwinding the flexible display panel and the module cover from the roller.

* * * * *